(12) United States Patent
Takata et al.

(10) Patent No.: US 12,050,333 B2
(45) Date of Patent: Jul. 30, 2024

(54) LIGHT-RECEIVING DEVICE

(71) Applicant: NEC Corporation, Tokyo (JP)

(72) Inventors: Koya Takata, Tokyo (JP); Fujio Okumura, Kanagawa (JP)

(73) Assignee: NEC CORPORATION, Tokyo (JP)

( * ) Notice: Subject to any disclaimer, the term of this patent is extended or adjusted under 35 U.S.C. 154(b) by 267 days.

(21) Appl. No.: 17/622,969

(22) PCT Filed: Jun. 22, 2020

(86) PCT No.: PCT/JP2020/024290
§ 371 (c)(1),
(2) Date: Dec. 27, 2021

(87) PCT Pub. No.: WO2021/002227
PCT Pub. Date: Jan. 7, 2021

(65) Prior Publication Data
US 2022/0244444 A1    Aug. 4, 2022

(30) Foreign Application Priority Data
Jul. 1, 2019    (JP) ................................. 2019-123023

(51) Int. Cl.
*F21V 8/00* (2006.01)
*G02B 7/02* (2021.01)
(Continued)

(52) U.S. Cl.
CPC ............ *G02B 6/003* (2013.01); *G02B 6/0011* (2013.01); *G02B 6/0026* (2013.01);
(Continued)

(58) Field of Classification Search
CPC .... G02B 6/003; G02B 6/0011; G02B 6/0026; G02B 6/0031; G02B 6/005; G02B 6/0078;
(Continued)

(56) References Cited

U.S. PATENT DOCUMENTS 7,664,350 B2 *   2/2010  Ghosh ..................... F24S 23/00
                                                         126/684
9,274,266 B2 *   3/2016  Ford ................ B29D 11/00009
(Continued)

FOREIGN PATENT DOCUMENTS

CN          102544172 A       7/2012
JP          H08-204653 A      8/1996
(Continued)

OTHER PUBLICATIONS

International Search Report for PCT Application No. PCT/JP2020/024290, mailed on Aug. 25, 2020.
(Continued)

*Primary Examiner* — Ryan A Lepisto
(74) *Attorney, Agent, or Firm* — Sughrue Mion, PLLC

(57) ABSTRACT

A light-receiving device includes: a light guide plate of a transparent member having a first surface and a second surface as principal surfaces opposed to each other and an emission surface formed on at least one end of the transparent member; a lens sheet having lenses and is disposed opposite to the first surface; a support member that supports the lens sheet such that a distance between the principal surface of the lens sheet and the second surface is equal to the focal distance of the lenses; a directional light-guide layer that is disposed on the second surface of the light guide plate and guides, toward the emission surface, the travel direction of an optical signal entering the light guide plate; and a receiver that receives the optical signal emitted from the emission surface of the light guide plate and converts the received optical signal into an electric signal.

14 Claims, 46 Drawing Sheets

(51) Int. Cl.
  *H01L 31/0232* (2014.01)
  *H04B 10/112* (2013.01)
  *H04B 10/114* (2013.01)
  *H04B 10/67* (2013.01)
  *G02B 3/00* (2006.01)
  *G02B 5/30* (2006.01)
  *G02B 5/32* (2006.01)
  *G02B 6/42* (2006.01)
  *H04B 10/11* (2013.01)

(52) U.S. Cl.
  CPC .......... *G02B 6/0031* (2013.01); *G02B 6/005* (2013.01); *G02B 6/0078* (2013.01); *G02B 6/0088* (2013.01); *G02B 7/02* (2013.01); *H01L 31/0232* (2013.01); *H04B 10/1129* (2013.01); *H04B 10/114* (2013.01); *H04B 10/674* (2013.01); *H04B 10/675* (2013.01); *G02B 3/00* (2013.01); *G02B 5/30* (2013.01); *G02B 5/32* (2013.01); *G02B 6/0028* (2013.01); *G02B 6/4204* (2013.01); *G02B 6/4287* (2013.01); *H04B 10/11* (2013.01)

(58) Field of Classification Search
  CPC .......... G02B 6/0088; G02B 7/02; G02B 3/00; G02B 5/30; G02B 5/32; G02B 6/0028; G02B 6/4204; G02B 6/4287; H01L 31/0232; H04B 10/1129; H04B 10/114; H04B 10/674; H04B 10/675; H04B 10/11
  See application file for complete search history.

(56) References Cited

U.S. PATENT DOCUMENTS

| | | | |
|---|---|---|---|
| 9,753,284 B2* | 9/2017 | Machida | G02B 27/283 |
| 10,627,562 B2* | 4/2020 | Vasylyev | G02B 3/005 |
| 2009/0250094 A1* | 10/2009 | Robison | F24S 50/20 |
| | | | 136/246 |
| 2012/0056081 A1* | 3/2012 | Kozodoy | G02B 6/0023 |
| | | | 385/36 |
| 2013/0160820 A1 | 6/2013 | Lin et al. | |
| 2014/0205160 A1* | 7/2014 | Chang | H01L 27/14678 |
| | | | 250/208.1 |
| 2014/0261621 A1* | 9/2014 | Gruhlke | H01L 31/0547 |
| | | | 136/246 |
| 2020/0264389 A1 | 8/2020 | Ishibashi et al. | |

FOREIGN PATENT DOCUMENTS

| | | |
|---|---|---|
| JP | H11-252014 A | 9/1999 |
| JP | 2007-115909 A | 5/2007 |
| JP | 2009-284385 A | 12/2009 |
| JP | 2013-545260 A | 12/2013 |
| WO | 2019/049598 A1 | 3/2019 |

OTHER PUBLICATIONS

English translation of Written opinion for PCT Application No. PCT/JP2020/024290, mailed on Aug. 25, 2020.
CN Office Action for Chinese Patent Application No. 202080043257.9, mailed on Oct. 21, 2023 with Engiish Translation.

* cited by examiner

LIGHT-RECEIVING DEVICE

This application is a National Stage Entry of PCT/JP2020/024290 filed on Jun. 22, 2020, which claims priority from Japanese Patent Application 2019-123023 filed on Jul. 1, 2019, the contents of all of which are incorporated herein by reference, in their entirety.

TECHNICAL FIELD

The present invention relates to a light-receiving device that receives an optical signal. More specifically, the present invention relates to a light-receiving device that receives an optical signal to be used for optical space communication.

BACKGROUND ART

When optical space communication in which an optical signal propagating in a space is mutually transmitted and received is used, large-capacity and secure communication can be performed without being subjected to radio interference. In general, in the optical space communication, an optical transmission axis and an optical reception axis of an optical signal need to be matched.

PTL 1 discloses a spatial multiplexing communication device that performs optical space communication between a transmitter and a receiver. The device of PTL 1 includes a plurality of communication light-receiving elements that receive an optical signal and a light guide unit disposed by having a predetermined positional relationship with the plurality of communication light-receiving elements. The light guide unit of the device of PTL 1 receives an optical signal emitted from any one of a plurality of communication light sources of the transmitter, guides the received optical signal, and emits the guided optical signal toward at least one position-detection light-receiving element of the transmitter. According to the device of PTL 1, an optical transmission axis of a communication light source on a transmitter side and an optical reception axis of a communication light-receiving element on a receiver side can be matched without having a positioning light source on the receiver side.

CITATION LIST

Patent Literature

[PTL 1] Japanese Unexamined Patent Application Publication No. 2009-284385

SUMMARY OF INVENTION

Technical Problem

According to the device of PTL 1, when an optical transmitter and an optical receiver are close to each other and a positional relationship between the optical transmitter and the optical receiver is specified, an optical transmission axis and an optical reception axis can be matched. However, in the device of PTL 1, when a positional relationship between an optical transmitter and an optical receiver is not specified, an optical transmission axis and an optical reception axis cannot be matched, and therefore an optical signal being transmitted cannot be received. In other words, in the device of PTL 1, there is a problem that a positional relationship between an optical transmitter and an optical receiver is not specified, and therefore optical signals coming from various directions cannot be received.

An object of the present invention is to provide a light-receiving device that can solve the above-described problem and receive optical signals coming from various directions.

Solution to Problem

A light-receiving device according to one aspect of the present invention includes: a light guide plate that is a transparent member having a first surface and a second surface as principal surfaces opposed to each other, and that has an emission surface formed on at least one end thereof; a lens sheet that has a structure in which a plurality of lenses are arranged, and is disposed opposite to the first surface; a support member that supports the lens sheet in such a way that a distance between a principal surface of the lens sheet and the second surface is equal to a focal distance of the plurality of lenses; a directional light-guide layer that is disposed on the second surface of the light guide plate and guides, toward the emission surface, a travel direction of an optical signal entering an inside of the light guide plate; and an optical receiver that receives the optical signal emitted from the emission surface of the light guide plate and converts the received optical signal into an electric signal.

Advantageous Effects of Invention

According to the present invention, a light-receiving device that can receive optical signals coming from various directions is able to be provided.

EXAMPLE EMBODIMENT

Figure 1:
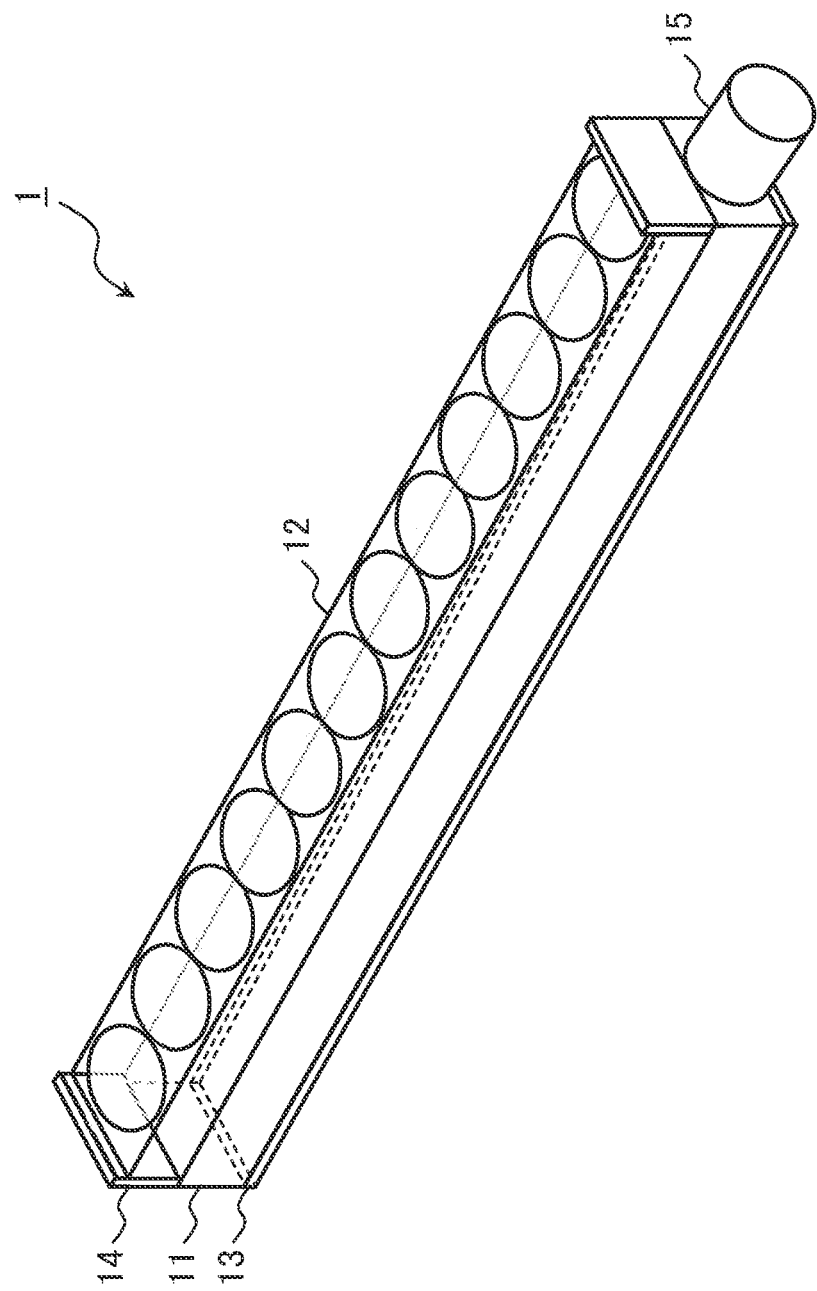
FIG. 1 is a perspective view of one example of a light-receiving device according to a first example embodiment of the present invention.

Hereinafter, example embodiments according to the present invention are described by using the accompanying drawings. However, while technically-preferable limitations for carrying out the present invention are made on the example embodiments described below, it should be noted that the scope of the invention is not limited to the following. In all figures used for describing the following example embodiments, unless there is a specific reason, similar components are assigned with the same reference sign. In the following example embodiments, repeated description may be omitted for a similar component/operation. In all figures used for describing the following example embodiments, a size and a shape of a component and a connection relationship, a positional relationship, and the like between components indicate one example and are not limited to a form as is. In a cross-sectional diagram used for describing the following example embodiments, hatching is omitted in order to prevent travel of light and the like from becoming unclear.

A direction of an arrow in the drawings indicates one example and does not limit a direction of travel of light or a signal. A line indicating travel of light in the drawings is conceptual and does not accurately illustrate a state of a travel direction of actual light. For example, in the following drawings, illustration of a change in a travel direction and a state of light due to refraction at an interface between air and a material, reflection, diffusion and the like may be omitted, and a light flux may be illustrated by using one line.

First Example Embodiment

First, a light-receiving device according to a first example embodiment of the present invention is described with reference to the drawings. The light-receiving device of the present example embodiment is a device that receives an optical signal used for optical space communication.

Figure 2:
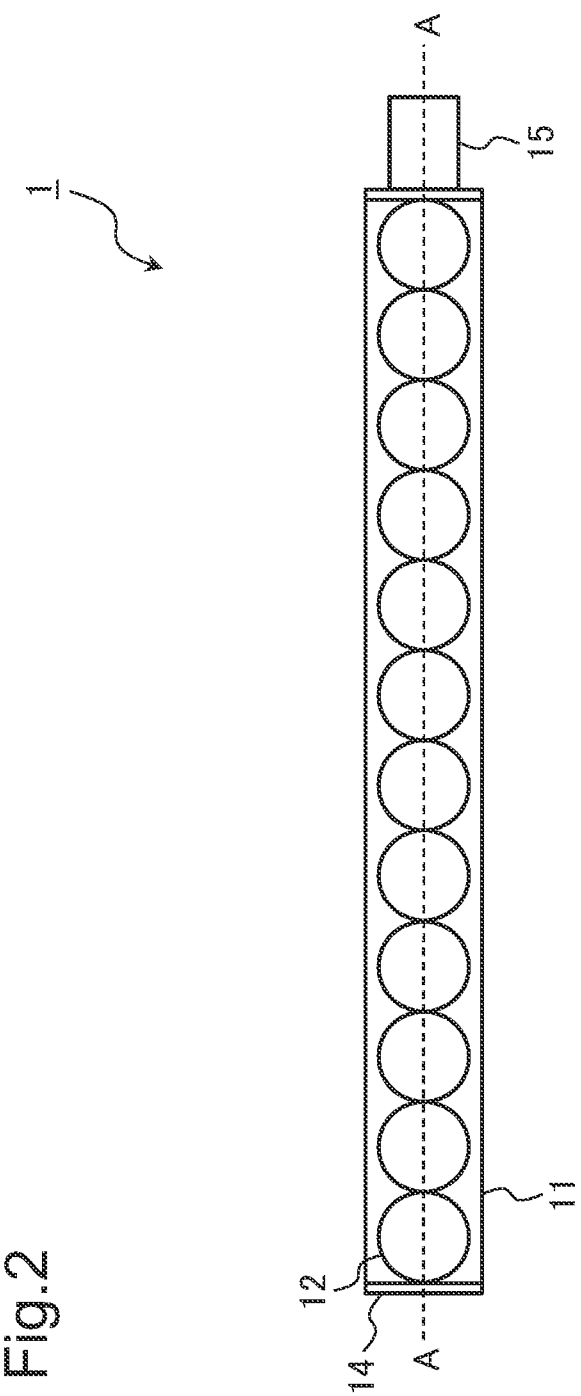
FIG. 2 is a top view of one example of the light-receiving device according to the first example embodiment of the present invention.
Figure 3:
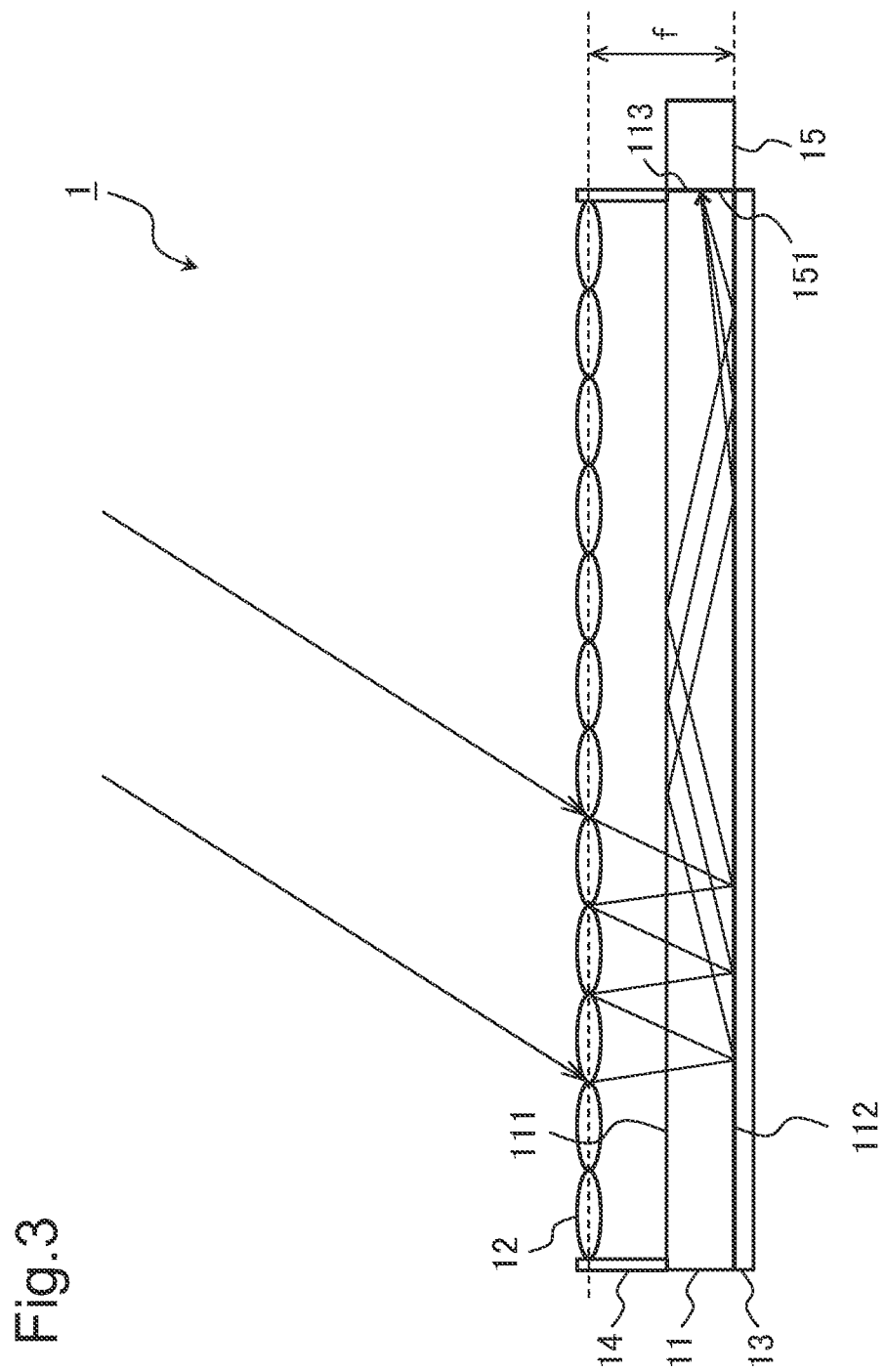
FIG. 3 is a cross-sectional diagram of one example of the light-receiving device according to the first example embodiment of the present invention.

FIGS. 1 to 3 each are a conceptual diagram for describing one example of a configuration of a light-receiving device 1 according to the present example embodiment. FIG. 1 is a perspective view of the light-receiving device 1. FIG. 2 is a top view of the light-receiving device 1. FIG. 3 is a cross-sectional diagram in which the light-receiving device 1 is cut along an A-A line in FIG. 2. FIG. 3 illustrates an arrow conceptually indicating light entering the light-receiving device 1 and travel of light inside the light-receiving device 1.

The light-receiving device 1 includes a light guide plate 11, a lens sheet 12, a directional light-guide layer 13, a support member 14, and an optical receiver 15.

The light guide plate 11 is a plate-like transparent member having a first surface 111 and a second surface 112 as principal surfaces opposed to each other. The transparent member is a member through which light of a wavelength region including a wavelength of an optical signal is transmitted. The light guide plate 11 is preferably a member through which light of a wavelength region including a visible region and an infrared region is transmitted. The light guide plate 11 has an elongated plate-like outer shape, and on one end surface of the plate, an emission surface 113 is formed. The first surface 111 is an incident surface which an optical signal refracted by the lens sheet 12 enters. The emission surface 113 is an end from which an optical signal that has propagated inside the light guide plate 11 is emitted. In FIG. 1, the light guide plate 11 is illustrated as being flat-plate-shaped, but the light guide plate 11 may be formed in a curved shape or may include a curved portion.

On an upper side of the first surface 111 of the light guide plate 11, the lens sheet 12 supported by the support member 14 is disposed. On the second surface 112 of the light guide plate 11, the directional light-guide layer 13 is disposed. On the emission surface 113 of the light guide plate 11, the optical receiver 15 is disposed.

The light guide plate 11 is formed of a material through which light such as an optical signal is transmitted. For example, the light guide plate 11 can be configured by using a substance such as glass or plastic. A material of the light guide plate 11 is not limited as long as light such as an optical signal can be transmitted.

A travel direction of an optical signal that is refracted by the lens sheet 12 and has entered an inside of the light guide plate 11 from the first surface 111 is changed toward the emission surface 113 by the directional light-guide layer 13 disposed on the second surface 112. The optical signal the travel direction of which has been changed by the directional light-guide layer 13 propagates inside the light guide plate 11 toward the emission surface 113. FIG. 3 illustrates, by using an arrow, an optical signal made incident from the first surface 111 propagate inside the light guide plate 11 toward the optical receiver 15.

The lens sheet 12 is supported by the support member 14 on an upper side of the first surface 111 of the light guide plate 11. The lens sheet 12 has a structure in which a plurality of lenses are arranged in a row on one sheet. A plurality of lenses configuring the lens sheet 12 are focused on different focal positions of the directional light-guide layer 13 disposed on the second surface 112 of the light guide plate 11. In the example of FIG. 3, at a position of a focal distance f of the lens sheet 12, the directional light-guide layer 13 is disposed. The lens sheet 12 may be configured by using a substance such as glass or plastic. A material of the lens sheet 12 is not limited as long as an optical signal can be refracted to a focal position of a plurality of lenses.

The directional light-guide layer 13 is disposed on the second surface 112 of the light guide plate 11. The directional light-guide layer 13 changes a travel direction of an optical signal. The directional light-guide layer 13 guides an optical signal in such a way that light entering an inside of the light guide plate 11 from the first surface 111 of the light guide plate 11 travels toward the emission surface 113.

The directional light-guide layer 13 can be achieved, for example, by a reflection-type diffraction grating having a structure in which a plurality of gratings having a height of a micrometer order are arranged. The directional light-guide layer 13 can be achieved, for example, by a blazed diffraction grating or a holographic diffraction grating. The directional light-guide layer 13 is configured at a grating interval in which light made incident from the first surface 111 travels toward the emission surface 113.

Further, the directional light-guide layer 13 can be achieved, for example, by a hologram light-guide film that selectively guides an optical signal of a predetermined wavelength. When being used as a directional light-guide layer 13, a hologram light-guide film is configured in such a way as to receive an optical signal of linearly polarized light.

The support member 14 supports the lens sheet 12 in such a way as to be positioned on an upper side of the first surface 111 of the light guide plate 11. The support member 14 supports the lens sheet 12 in such a way that a distance between a principal surface of the lens sheet 12 and the second surface 112 of the light guide plate 11 is equal to a focal distance f of the lens sheet 12. A plurality of lenses configuring the lens sheet 12 are set as having the same focal distance f, but a certain amount of error may be included. A material and a shape of the support member 14 are not specifically limited.

The optical receiver 15 is disposed in such a way that a light-receiving surface 151 faces the emission surface 113 of the light guide plate 11. The optical receiver 15 receives an optical signal emitted from the emission surface 113 of the light guide plate 11. The optical receiver 15 converts the received optical signal into an electric signal. The optical receiver 15 outputs the electric signal after the conversion to a decoder (not illustrated).

The optical receiver 15 can be achieved, for example, by an element such as a photodiode or a photo transistor. When being achieved by an avalanche photodiode, the optical receiver 15 can cope with high-speed communication. The optical receiver 15 may be achieved by an element other than a photodiode, a photo transistor, and an avalanche photodiode as long as an optical signal can be converted into an electric signal.

The optical receiver 15 receives light of a wavelength region of an optical signal to be received. The optical receiver 15 receives, for example, an optical signal of an infrared region. The optical receiver 15 receives, for example, an optical signal of a wavelength of a 1.5-micrometer (μm) band. A wavelength band of an optical signal received by the optical receiver 15 is not limited to a 1.5-μm band and can be optionally set by being matched with a wavelength of an optical signal transmitted from a light-transmission device (not illustrated). A wavelength band of an optical signal received by the optical receiver 15 may be set, for example, as a 0.8-μm band, a 1.55-μm band, or a 2.2-μm band. Further, a wavelength band of an optical signal received by the optical receiver 15 may be set, for example, as a 0.8 to 1-μm band. When a wavelength band of an optical signal is short, absorption caused by moisture in an atmosphere is small, resulting in an advantage for optical space communication during rain.

As described above, a configuration of the light-receiving device 1 of the present example embodiment has been described. The configuration illustrated each in FIGS. 1 to 3 is one example and does not limit the configuration of the light-receiving device 1 according to the present example embodiment to a form as is.

Modified Example 1

Next, a light-receiving device of a modified example 1 according to the present example embodiment is described with reference to drawings. The light-receiving device according to the present modified example includes a light guide plate formed in a flat plate-like shape and a lens sheet associated with the light guide plate.

Figure 4:
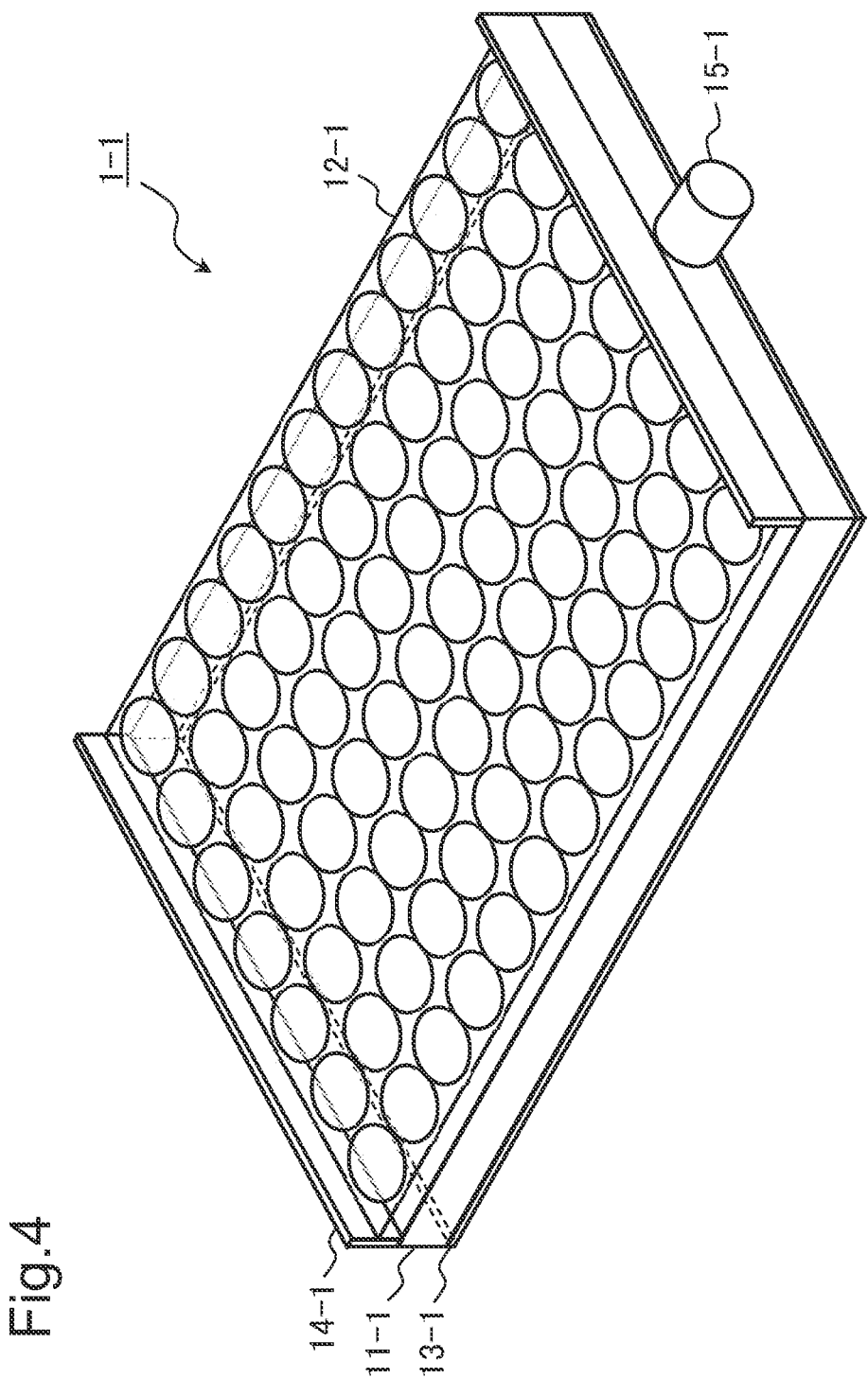
FIG. 4 is a perspective view of a light-receiving device of a modified example 1 according to the first example embodiment of the present invention.
Figure 5:
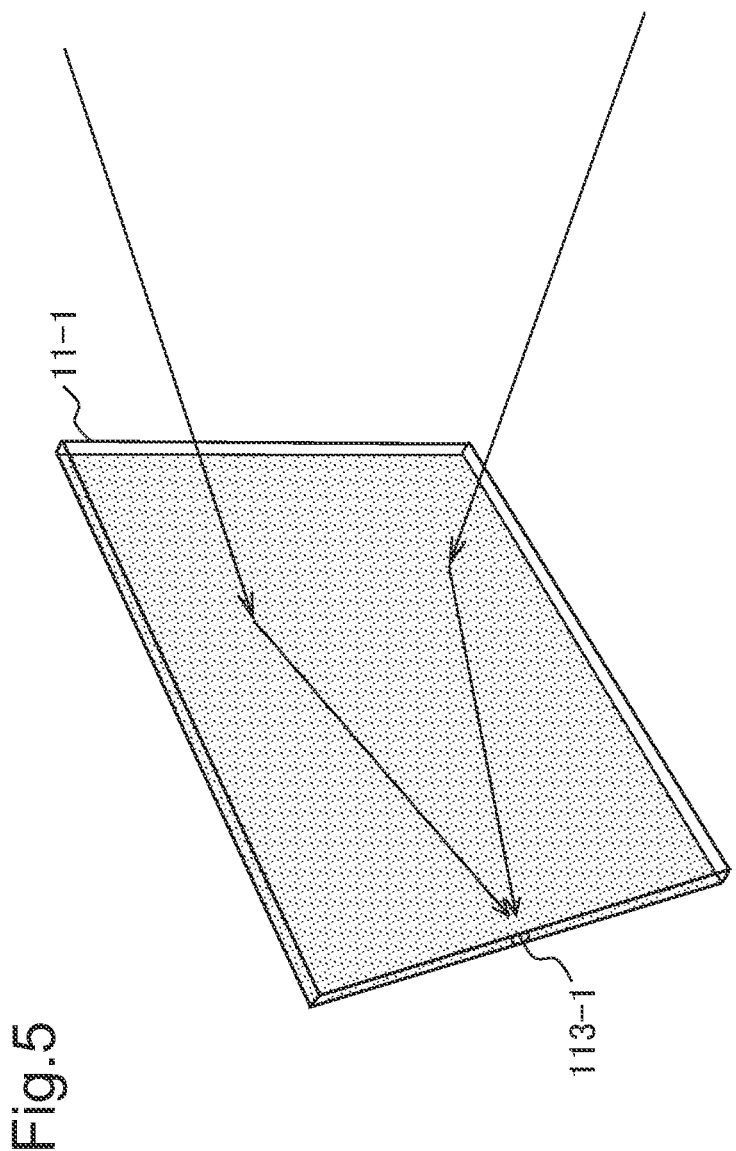
FIG. 5 is a conceptual diagram illustrating one example of light guiding in a light guide plate of the light-receiving device of the modified example 1 according to the first example embodiment of the present invention.

FIGS. 4 and 5 are each a conceptual diagram for describing one example of a configuration of a light-receiving device 1-1 according to the present modified example. FIG. 4 is a perspective view illustrating one example of a configuration of the light-receiving device 1-1. FIG. 5 is a conceptual diagram illustrating one example of light guiding in a light guide plate 11-1 of the light-receiving device 1-1.

The light-receiving device 1-1 includes a light guide plate 11-1, a lens sheet 12-1, a directional light-guide layer 13-1, a support member 14-1, and an optical receiver 15-1. Each of the light guide plate 11-1, the lens sheet 12-1, the directional light-guide layer 13-1, the support member 14-1, and the optical receiver 15-1 is configured in such a way as to correspond to each of the light guide plate 11, the lens sheet 12, the directional light-guide layer 13, the support member 14, and the optical receiver 15 of the light-receiving device 1. In the following, description of a feature similar to the light-receiving device 1 is omitted.

The light guide plate 11-1 is a plate-like transparent member having a first surface and a second surface as principal surfaces opposed to each other. A material and characteristics of the light guide plate 11-1 are similar to the light guide plate 11 of the light-receiving device 1. The light guide plate 11-1 has a flat-plate-like outer shape, and on one end surface thereof, an emission surface 113-1 is formed. The first surface is an incident surface which an optical signal refracted by the lens sheet 12-1 enters. The emission surface 113-1 is an end from which an optical signal that has propagated inside the light guide plate 11-1 is emitted. In FIGS. 4 and 5, the light guide plate 11-1 having a flat-plate-like outer shape is illustrated, but an optical signal emitted from the emission surface 113-1 at a position where the optical receiver 15-1 is not installed is not received by the optical receiver 15-1.

On an upper side of the first surface of the light guide plate 11-1, the lens sheet 12-1 supported by the support member 14-1 is disposed. On the second surface of the light guide plate 11-1, the directional light-guide layer 13-1 is disposed. On the emission surface 113-1 of the light guide plate 11-1, the optical receiver 15 is disposed.

A travel direction of an optical signal that is refracted by the lens sheet 12-1 and enters an inside of the light guide plate 11-1 from the first surface is changed toward the emission surface 113-1 by the directional light-guide layer 13-1 disposed on the second surface. The optical signal the travel direction of which has been changed by the directional light-guide layer 13 propagates inside the light guide plate 11 toward the emission surface 113-1. FIG. 5 illustrates, by using an arrow, an optical signal entering an inside of the light guide plate 11 from the first surface propagates inside the light guide plate 11-1 toward the optical receiver 15-1. As illustrated in FIG. 5, when the light guide plate 11-1 has a rectangular flat-plate shape, an optical signal may not be always guided to the optical receiver 15-1, depending on an incident position of the optical signal.

The lens sheet 12-1 is supported by the support member 14-1 on an upper side of the first surface of the light guide plate 11-1. A material and characteristics of the lens sheet 12-1 are similar to the lens sheet 12 of the light-receiving device 1. The lens sheet 12-1 has a structure in which a plurality of lenses are arranged on one sheet. A plurality of lenses configuring the lens sheet 12-1 are focused on different focal positions of the directional light-guide layer 13-1 disposed on the second surface of the light guide plate 11-1.

The directional light-guide layer 13-1 is disposed on the second surface of the light guide plate 11-1. A material and characteristics of the directional light-guide layer 13-1 are similar to the directional light-guide layer 13 of the light-receiving device 1. The directional light-guide layer 13-1 guides an optical signal in such a way that light entering an inside of the light guide plate 11-1 from the first surface of the light guide plate 11-1 travels toward the emission surface 113-1.

The support member 14-1 supports the lens sheet 12-1 in such a way as to be positioned on an upper side of the first surface of the light guide plate 11-1. The support member 14-1 supports the lens sheet 12-1 in such a way that a distance between a principal surface of the lens sheet 12-1 and the second surface of the light guide plate 11-1 is equal to a focal distance f of the lens sheet 12-1. A material and a shape of the support member 14-1 are not specifically limited.

The optical receiver 15-1 is disposed in such a way that a light-receiving surface 151 faces the emission surface 113-1 of the light guide plate 11-1. The optical receiver 15-1 has a configuration similar to the optical receiver 15 of the light-receiving device 1. The optical receiver 15-1 receives an optical signal emitted from the emission surface 113-1 of the light guide plate 11-1. The optical receiver 15-1 converts the received optical signal into an electric signal. The optical receiver 15-1 outputs the electric signal after the conversion to a decoder (not illustrated).

As described above, a configuration of the light-receiving device 1-1 according to the present modified example has been described. The configuration illustrated each in FIGS. 4 and 5 is one example and does not limit the configuration of the light-receiving device 1-1 according to the present modified example to a form as is.

Modified Example 2

Next, a light-receiving device of a modified example 2 according to the present example embodiment is described with reference to a drawing. In the light-receiving device according to the present modified example, a color filter that selectively transmits light of a wavelength region of an optical signal to be received is disposed.

Figure 6:
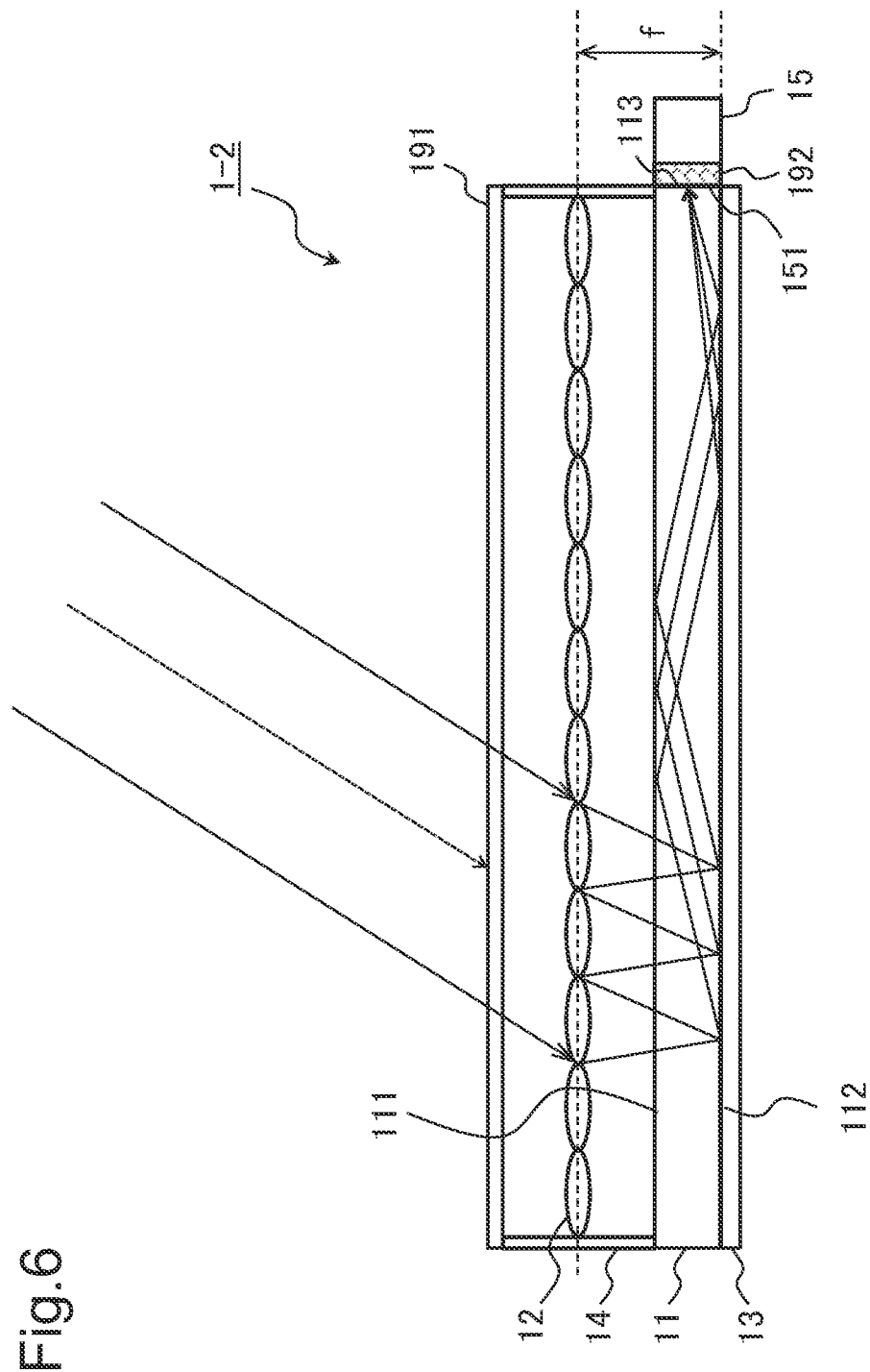
FIG. 6 is a cross-sectional diagram of a light-receiving device of a modified example 2 according to the first example embodiment of the present invention.

FIG. 6 is a conceptual diagram for describing one example of a configuration of a light-receiving device 1-2 of the present modified example. The light-receiving device 1-2 is different from the light-receiving device 1 in that a first color filter 191 and a second color filter 192 are included.

The first color filter 191 is supported by a support member 14 and is disposed on an upper side of an incident surface side of a lens sheet 12. The first color filter 191 is a color filter that selectively transmits light of a wavelength region of signal light. The first color filter 191 can be configured by using an inexpensive filter that selectively transmits light of a wide wavelength region, compared with the second color filter 192. In FIG. 6, while a part of unnecessary light being absorbed by the first color filter 191 is illustrated by a dotted-line arrow, the part of unnecessary light may be reflected by the first color filter 191.

The second color filter 192 is disposed on a light-receiving surface 151 of an optical receiver 15. The second color filter 192 is a color filter that selectively transmits light of a wavelength region of signal light. The second color filter 192 is preferably configured by using a precise filter that selectively transmits light of a narrow wavelength region, compared with the first color filter 191. The second color filter 192 disposed on the light-receiving surface 151 of the optical receiver 15 may have a small area, and therefore an expensive color filter that transmits light of a narrow wavelength region can be used.

The light-receiving device 1-2 according to the present modified example reduces a ratio of background light included in signal light by narrowing down a wavelength region of received signal light in the first color filter 191 and further narrowing down a wavelength region of the signal light in the second color filter 192. As a result, according to the light-receiving device 1-2 of the present modified example, a signal-noise ratio of signal light is improved, compared with the light-receiving device 1.

As described above, the light-receiving device according to the present example embodiment includes a light guide plate, a support member, a directional light-guide layer, and an optical receiver. The light guide plate is a transparent member having a first surface and a second surface as principal surfaces opposed to each other, and on at least one end, an emission surface is formed. The support member supports a lens sheet having a structure in which a plurality of lenses are arranged and is disposed opposite to the first surface and the lens sheet in such a way that a distance between a principal surface of the lens sheet and the second surface is equal to a focal distance of the plurality of lenses. The directional light-guide layer is disposed on the second surface of the light guide plate and guides a travel direction of an optical signal entering an inside of the light guide plate toward an emission surface. The optical receiver receives an optical signal emitted from the emission surface of the light guide plate and converts the received optical signal into an electric signal.

According to one aspect of the present example embodiment, a light guide plate has a shape extended in a uniaxial direction, and a lens sheet has a structure in which a plurality of lenses are arranged in a row in association with a first surface of the light guide plate.

According to one aspect of the present example embodiment, a first color filter that is disposed on an upper side of a lens sheet and selectively transmits light of a wavelength region of an optical signal is further included. According to one aspect of the present example embodiment, a second color filter that is disposed on a light receiving surface of an optical receiver and selectively transmits light of a wavelength region of an optical signal emitted from an emission surface of a light guide plate is further included. According to one aspect of the present example embodiment, a second color filter selectively transmits an optical signal of a wavelength region narrower than in a first color filter.

The light-receiving device according to the present example embodiment can be installed, for example, in an automobile. When the light-receiving device of the present example embodiment is installed, vehicle-to-vehicle communication based on space optical communication is enabled between vehicles. Further, when the light-receiving device according to the present example embodiment is configured in such a way as to receive an optical signal transmitted from a light-transmission device (not illustrated) installed on a road, road-to-vehicle communication based on space optical communication is enabled between a road and a vehicle.

The light-receiving device of the present example embodiment is also applicable to space optical communication between moving bodies not limited to an automobile, such as an airplane, a vessel, an electric car, a motorcycle, a bicycle, and a drone. The light-receiving device according to the present example embodiment is also applicable to space optical communication between objects in a state where at least one of the objects is left to stand. Applied examples of the light-receiving device according to the present example embodiment are not limited to the above-cited examples and are applicable to space optical communication between any objects disposed in a location where an optical signal can be transmitted/received.

According to the light-receiving device of the present example embodiment, beams of signal light coming from various directions are collected by a lens sheet including a plurality of lenses, and therefore light reception is enabled even when an optical transmission axis for optical signals of these beams is deviated from an optical reception axis. In other words, according to the light-receiving device of the present example embodiment, optical signals coming from various directions can be received.

Second Example Embodiment

Next, a light-receiving device according to a second example embodiment of the present invention is described with reference to drawings. The light-receiving device according to the present example embodiment is different from the first example embodiment in that a configuration for reducing background light included in an optical signal is included.

According to the present example embodiment, an example in which a light-transmission device which is not illustrated converts an optical signal of linearly polarized light having one direction as a polarization direction into circularly polarized light and transmits the light acquired by the conversion toward the light-receiving device of the present example embodiment is described. The light-receiving device according to the present example embodiment receives an optical signal of circularly polarized light transmitted from the light-transmission device, converts the signal light of circularly polarized light into linearly polarized light, and causes the linearly polarized light to enter a first surface of a light guide plate.

Figure 7:
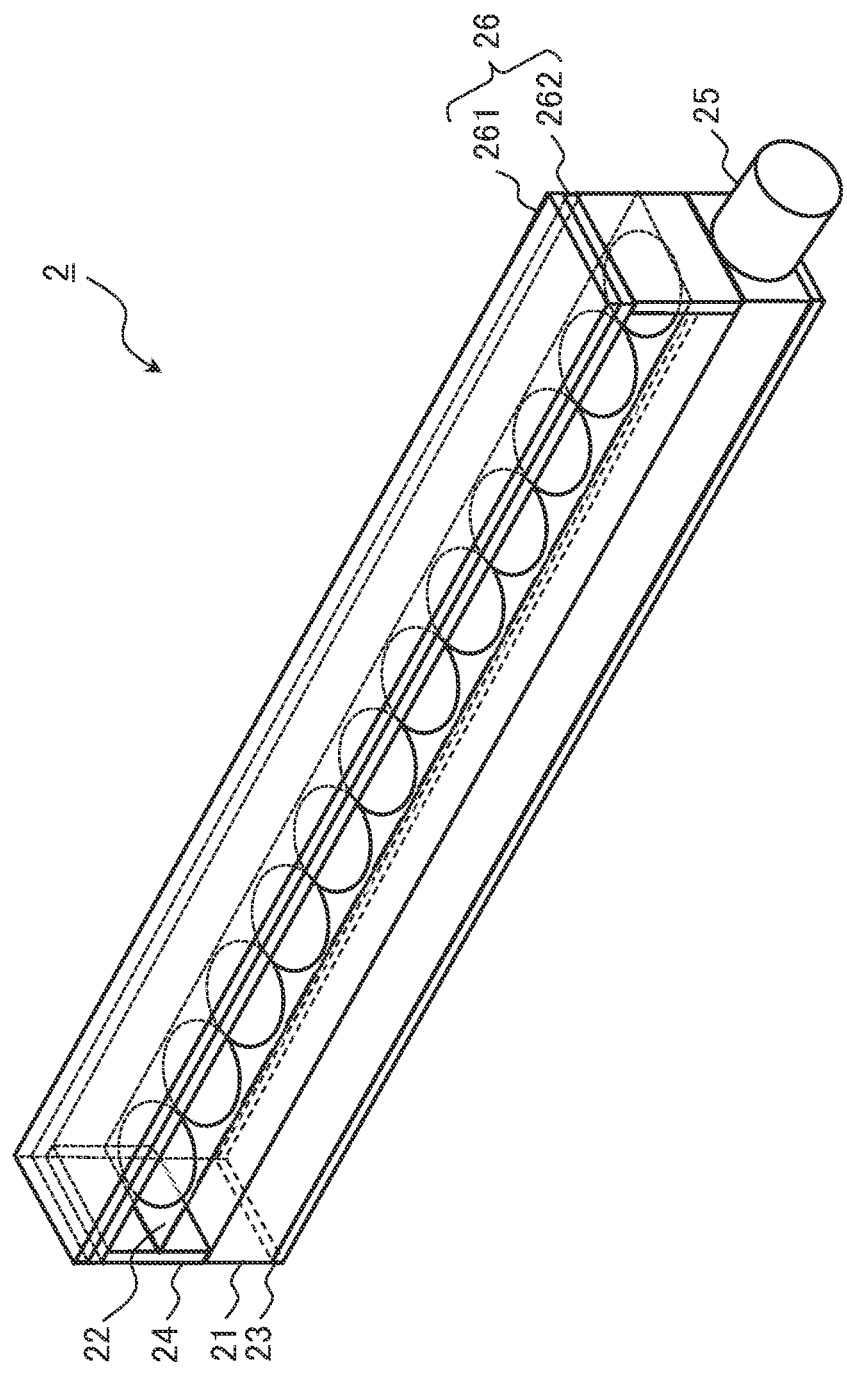
FIG. 7 is a perspective view of one example of a light-receiving device according to a second example embodiment of the present invention.
Figure 8:
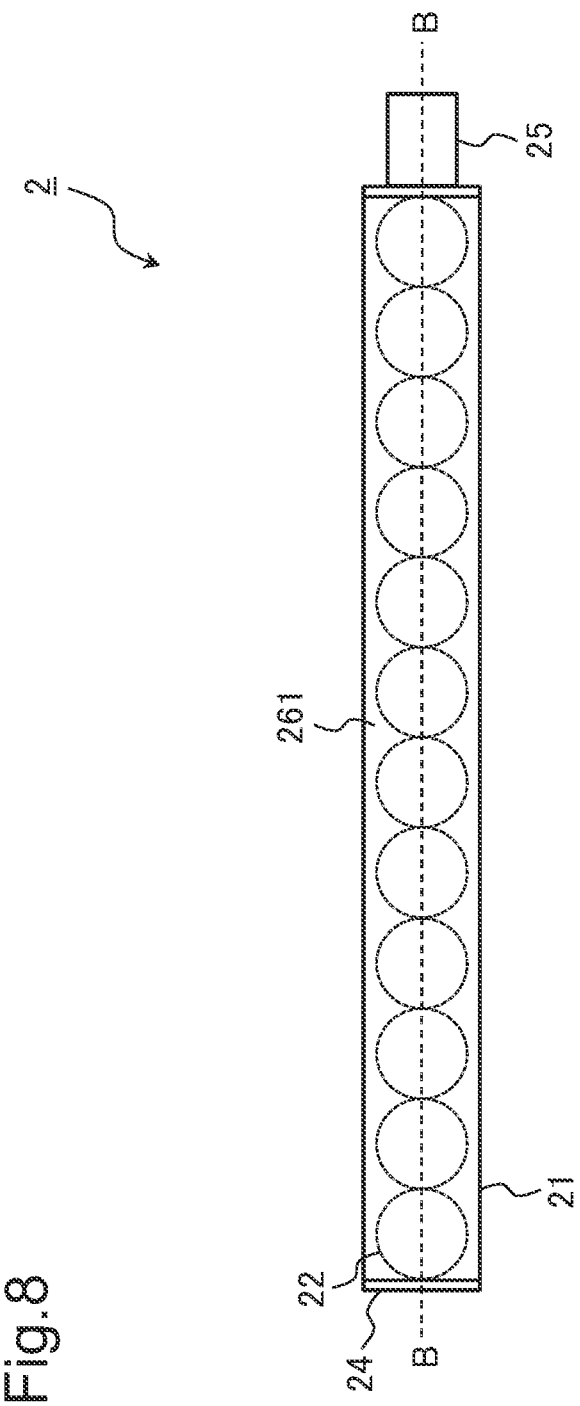
FIG. 8 is a top view of one example of the light-receiving device according to the second example embodiment of the present invention.
Figure 9:
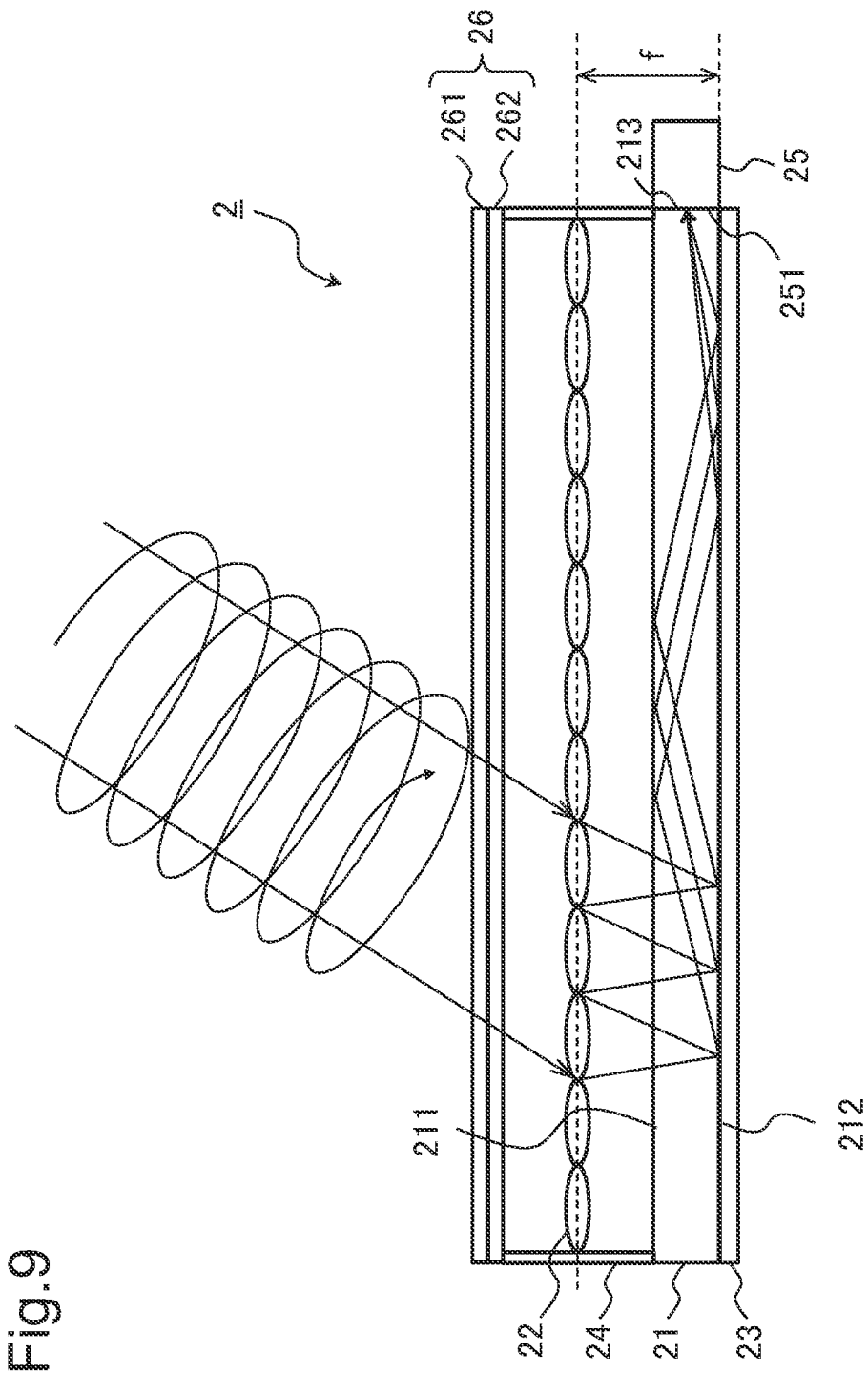
FIG. 9 is a cross-sectional diagram of one example of the light-receiving device according to the second example embodiment of the present invention.

FIGS. 7 to 9 each are a conceptual diagram for describing one example of a configuration of a light-receiving device 1 according to the present example embodiment. FIG. 7 is a perspective view of a light-receiving device 2. FIG. 8 is a top view of the light-receiving device 2. FIG. 9 is a cross-sectional diagram in which the light-receiving device 2 is cut along a B-B line in FIG. 8. FIG. 9 illustrates an arrow conceptually indicating light entering the light-receiving device 2 and travel of light inside the light-receiving device 2.

The light-receiving device 2 includes a light guide plate 21, a lens sheet 22, a directional light-guide layer 23, a support member 24, an optical receiver 25, and a polarization element 26. The configuration of each of the light guide plate 21, the lens sheet 22, the directional light-guide layer 23, the support member 24, and the optical receiver 25 corresponds to each of the light guide plate 11, the lens sheet 12, the directional light-guide layer 13, the support member 14, and the optical receiver 15 of the light-receiving device 1 according to the first example embodiment. In the following, description of a feature similar to the light-receiving device 1 may be omitted.

The light guide plate 21 is a plate-like transparent member having a first surface 211 and a second surface 212 as principal surfaces opposed to each other. A material and characteristics of the light guide plate 21 are similar to the light guide plate 11 of the light-receiving device 1 according to the first example embodiment. The light guide plate 21 has an elongated plate-like outer shape, and on one end surface thereof, an emission surface 213 is formed. The first surface 211 is an incident surface which an optical signal refracted by the lens sheet 22 enters. The emission surface 213 is an end from which an optical signal that has propagated inside the light guide plate 21 is emitted. The light guide plate 21 may have a flat-plate-like outer shape as in the modified example 1 according to the first example embodiment.

On an upper side of the first surface 211 of the light guide plate 21, the lens sheet 22 supported by the support member 24 is disposed. On the second surface 212 of the light guide plate 21, the directional light-guide layer 23 is disposed. On the emission surface 213 of the light guide plate 21, the optical receiver 25 is disposed.

A travel direction of an optical signal that is refracted by the lens sheet 22 and enters an inside of the light guide plate 21 from the first surface 211 is changed toward the emission surface 213 by the directional light-guide layer 23 disposed on the second surface 212. The optical signal entering the light guide plate 21 is linearly polarized light. The optical signal the travel direction of which has been changed by the directional light-guide layer 23 propagates inside the light guide plate 21 toward the emission surface 213. FIG. 9 illustrates, by using an arrow, an optical signal made incident from the first surface 211 propagate inside the light guide plate 21 toward the optical receiver 25.

The lens sheet 22 is supported by the support member 24 on an upper side of the first surface 211 of the light guide plate 21. A material, characteristics, and a shape of the lens sheet 22 are similar to the lens sheet 12 of the light-receiving device 1. A plurality of lenses configuring the lens sheet 22 are focused on different focal positions of the directional light-guide layer 23 disposed on the second surface 212 of the light guide plate 21. On an upper side of an incident side of the lens sheet 22, the polarization element 26 is disposed. Signal light converted by the polarization element 26 from circularly polarized light to linearly polarized light is made incident into the lens sheet 22.

The directional light-guide layer 23 is disposed on the second surface 212 of the light guide plate 21. The directional light-guide layer 23 changes a travel direction of an optical signal (linearly polarized light). The directional light-guide layer 23 is designed in such a way as to conform to a polarization direction of a predetermined direction. The predetermined direction is a polarization direction of linearly polarized light guided by the directional light-guide layer 23 toward the optical receiver 25. The directional light-guide layer 23 guides an optical signal in such a way that an optical signal entering the light guide plate 21 from the first surface 211 of the light guide plate 21 travels toward the emission surface 213.

The support member 24 supports the lens sheet 22 and the polarization element 26 in such a way as to be positioned on an upper side of the first surface 211 of the light guide plate 21. The support member 24 supports the lens sheet 22 in such a way that a distance between a principal surface of the lens sheet 22 and the second surface 212 of the light guide plate 21 is equal to a focal distance f of the lens sheet 22. Further, the support member 24 supports the polarization element 26 on an upper side of an incident side of the lens sheet 22. A material and a shape of the support member 24 are not specifically limited.

The optical receiver 25 is disposed in such a way that a light-receiving surface 251 faces the emission surface 213 of the light guide plate 21. The optical receiver 25 has a configuration similar to the optical receiver 15 of the light-receiving device 1. The optical receiver 25 receives an optical signal emitted from the emission surface 213 of the light guide plate 21. The optical receiver 25 converts the received optical signal into an electric signal. The optical receiver 25 outputs the electric signal after the conversion to a decoder (not illustrated).

The polarization element 26 is supported by the support member 24 and is disposed on an upper side of an incident surface side of the lens sheet 22. The polarization element 26 has a structure in which a wavelength plate 261 and a polarization plate 262 are stacked. When a polarization direction of linearly polarized light is not uniformed, the polarization plate 262 may be omitted.

The wavelength plate 261 is disposed on an upper surface of the polarization plate 262. The wavelength plate 261 is a ¼ wavelength plate that provides a phase difference of $\lambda/4$ ($\pi/2$) to a polarization plane of an optical signal (circularly polarized light) coming via propagation though a space and converts the optical signal (circularly polarized light) from circularly polarized light to linearly polarized light (?: a wavelength of the optical signal). The optical signal converted to linearly polarized light by the wavelength plate 261 enters the polarization plate 262.

The polarization plate 262 is disposed on a lower surface of the wavelength plate 261. The polarization plate 262 uniforms, to a predetermined direction, a polarization direction of an optical signal (linearly polarized light) converted into linearly polarized light by the wavelength plate 261. The optical signal (linearly polarized light) the polarization direction of which has been uniformed to the predetermined direction by the polarization plate 262 enters the lens sheet 22.

When linearly polarized light is used as an optical signal propagated in a space, light-receiving efficiency is decreased when an incident direction of linearly polarized light with respect to the directional light-guide layer 23 is inclined. Therefore, as an optical signal propagated in a space, circularly polarized light is preferably used. When a polarization direction of an optical signal (linearly polarized light) converted by the polarization plate 262 from circularly polarized light to linearly polarized light is uniformed to a predetermined direction, light-receiving efficiency is improved.

As described above, a configuration of the light-receiving device 2 according to the present example embodiment has been described. The configuration illustrated each in FIGS. 7 to 9 is one example and does not limit the configuration of the light-receiving device 2 according to the present example embodiment to a form as is.

Modified Example 3

Next, a light-receiving device of a modified example 3 according to the present example embodiment is described with reference to a drawing. In the light-receiving device according to the present modified example, a light absorption layer is disposed on a lower surface of a directional light-guide layer 23 in order to prevent stray light from being guided to an inside of a light guide plate 21.

Figure 10:
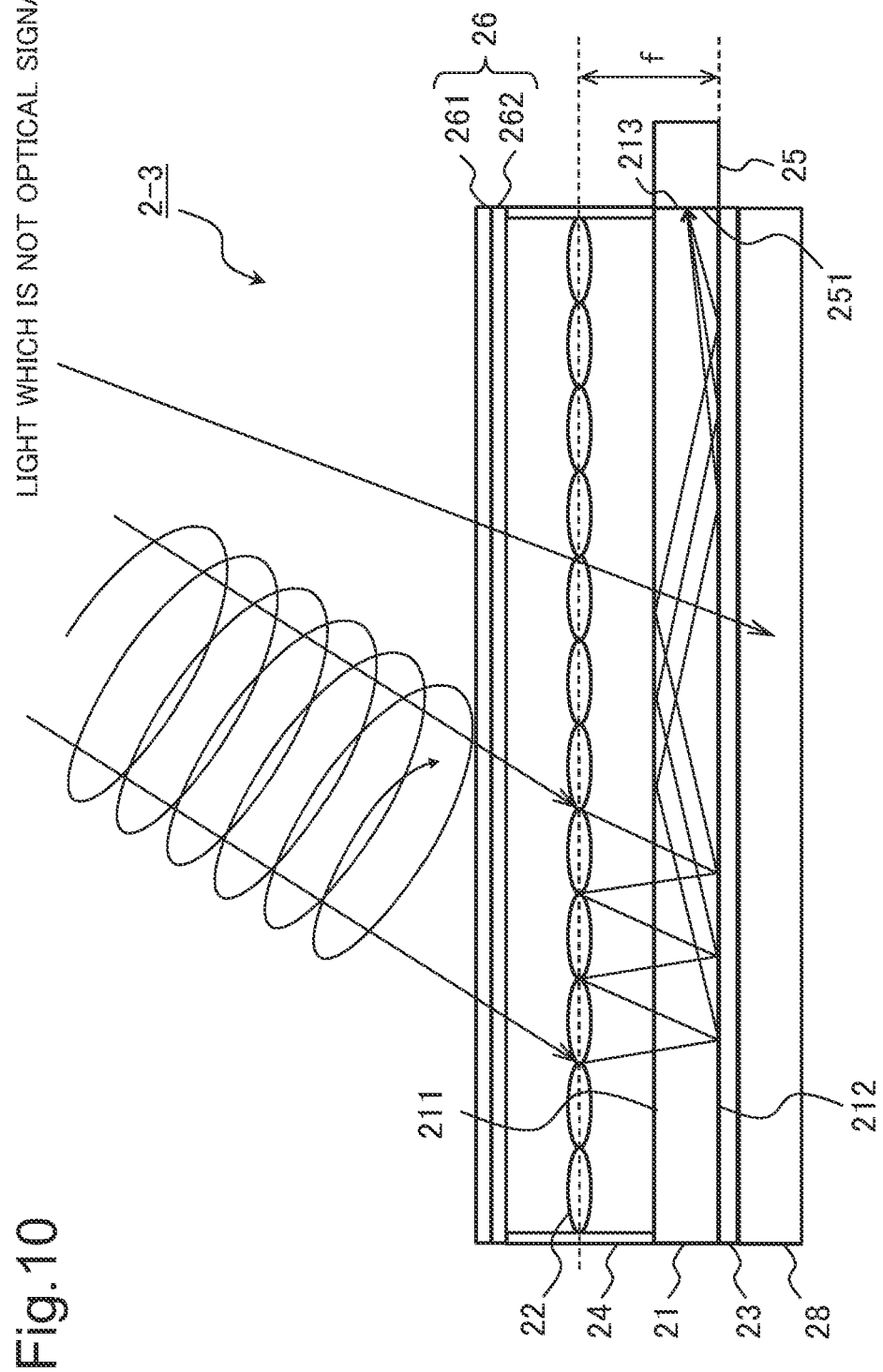
FIG. 10 is a cross-sectional diagram of a light-receiving device of a modified example 3 according to the second example embodiment of the present invention.

FIG. 10 is a conceptual diagram for describing one example of a configuration of a light-receiving device 2-3 according to the present modified example. The light-receiving device 2-3 is different from the light-receiving device 2 in that a light absorption layer 28 is included.

The light absorption layer 28 is formed on a lower surface of the directional light-guide layer 23. The light absorption layer 28 is an absorption layer that absorbs light. For the light absorption layer 28, for example, a substance having a large light absorption ratio is used. However, a substance for the light absorption layer 28 is not specifically limited as long as light other than signal light made incident from an outside, stray light propagating inside the light guide plate 21, and the like are efficiently absorbed.

According to the light-receiving device 2-3 of the present modified example, it is difficult for light other than an optical signal to be guided to the optical receiver 25, and therefore a signal-noise ratio (SN ratio) of light guided to the optical receiver 25 is improved.

As described above, in the light-receiving device according to the present example embodiment, a polarization element including a wavelength plate that converts an optical signal of circularly polarized light into linearly polarized light and a polarization plate that uniforms a polarization direction of an optical signal converted into linearly polarized light by the wavelength plate is disposed on an upper side of the lens sheet. A directional light-guide layer is a hologram layer that guides, toward an optical receiver, an optical signal of linearly polarized light having a polarization direction in a predetermined direction. According to one aspect of the present example embodiment, a light absorption layer that absorbs light is further provided on a lower surface of the directional light-guide layer.

When an optical signal is circularly polarized light and light guiding based on a hologram layer depends on a polarization direction of linearly polarized light, noise may be generated with respect to a received optical signal when solar light is received in addition to an optical signal. The light-receiving device according to the present example embodiment guides, through a hologram layer, an optical signal (linearly polarized light) having been passed through a wavelength plate that converts an optical signal of circularly polarized light into linearly polarized light having a polarization direction in a predetermined direction and therefore can selectively receive an optical signal by using an optical receiver. Therefore, according to the light-receiving device of the present example embodiment, noise which may be generated due to background light in optical space communication can be reduced.

Third Example Embodiment

Next, a light-receiving device according to a third example embodiment of the present invention is described with reference to drawings. The light-receiving device according to the present example embodiment is different from the first example embodiment in that a shutter that narrows down a light collection range is included. According to the present example embodiment, description is made by using an example in which a shutter is added to the light-receiving device 1 according to the first example embodiment.

Figure 11:
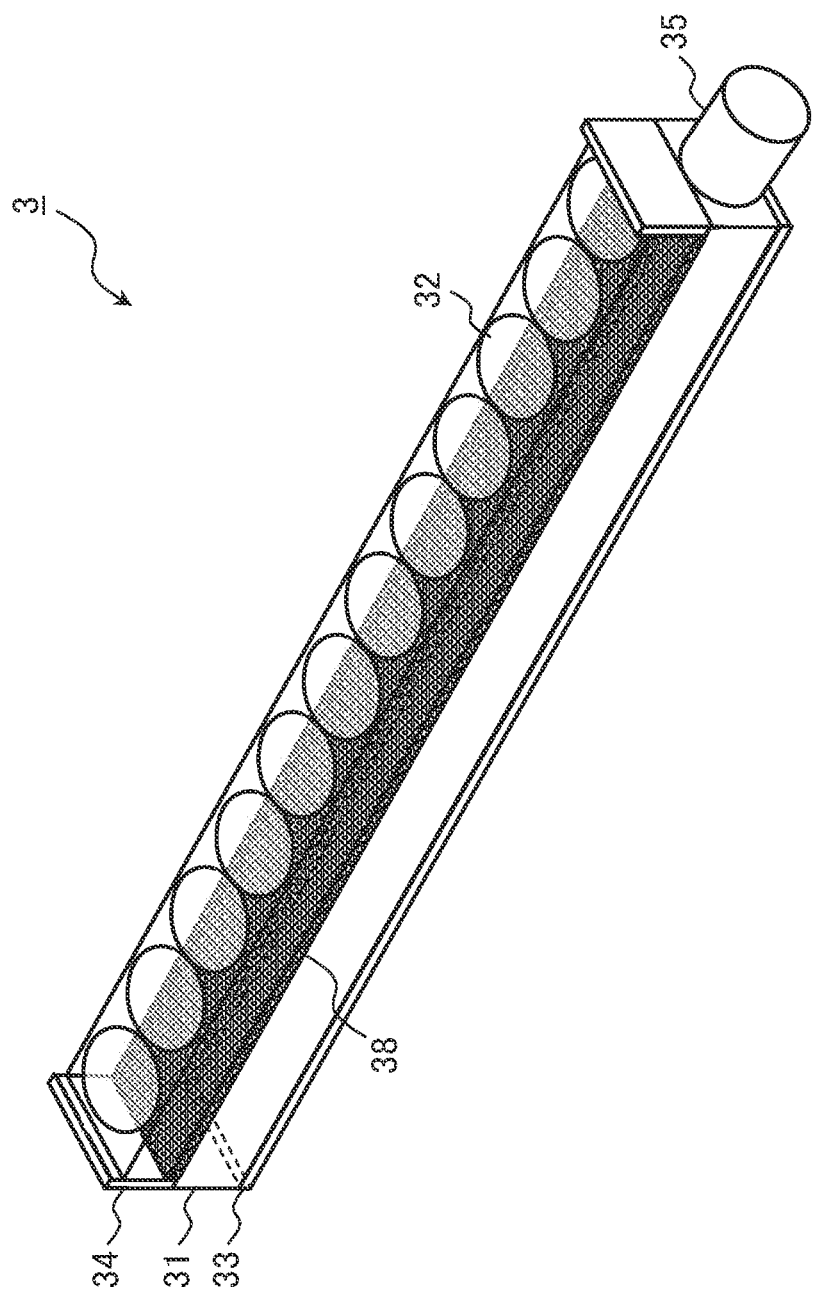
FIG. 11 is a perspective view of one example of a light-receiving device according to a third example embodiment of the present invention.
Figure 12:
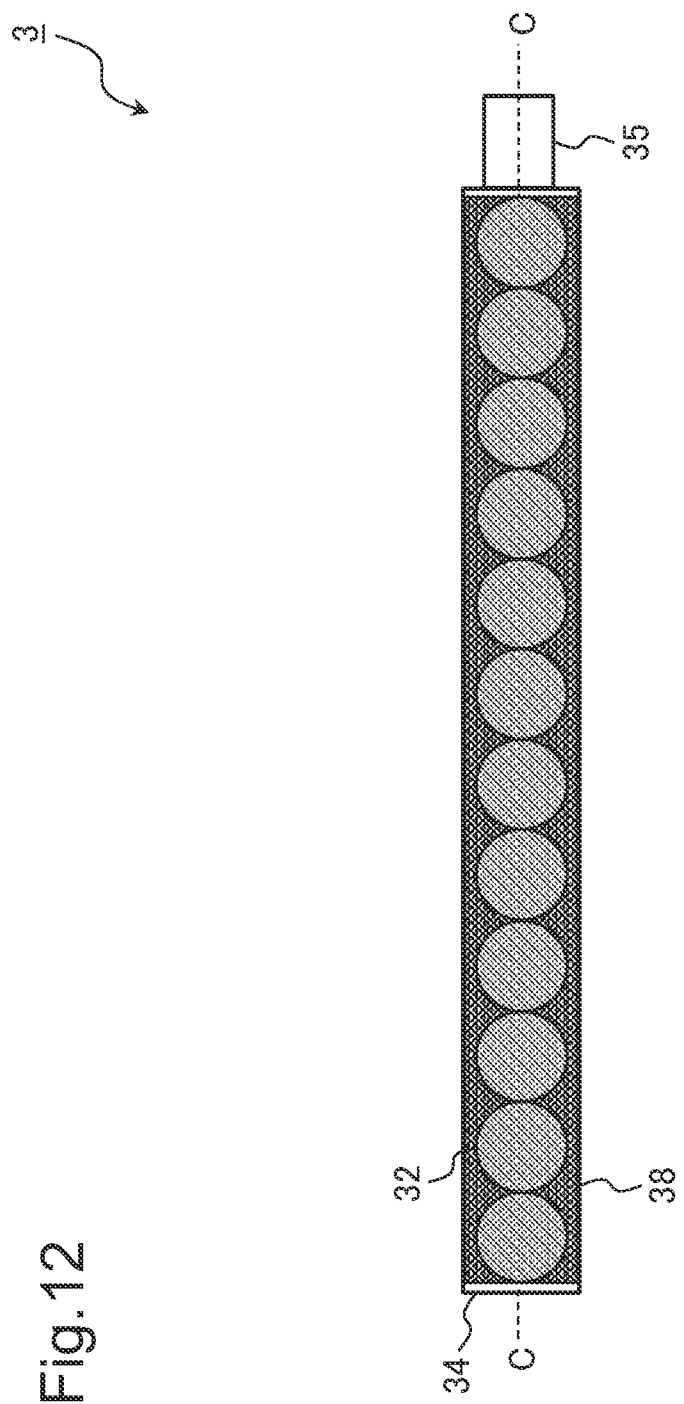
FIG. 12 is a top view of one example of the light-receiving device according to the third example embodiment of the present invention.
Figure 13:
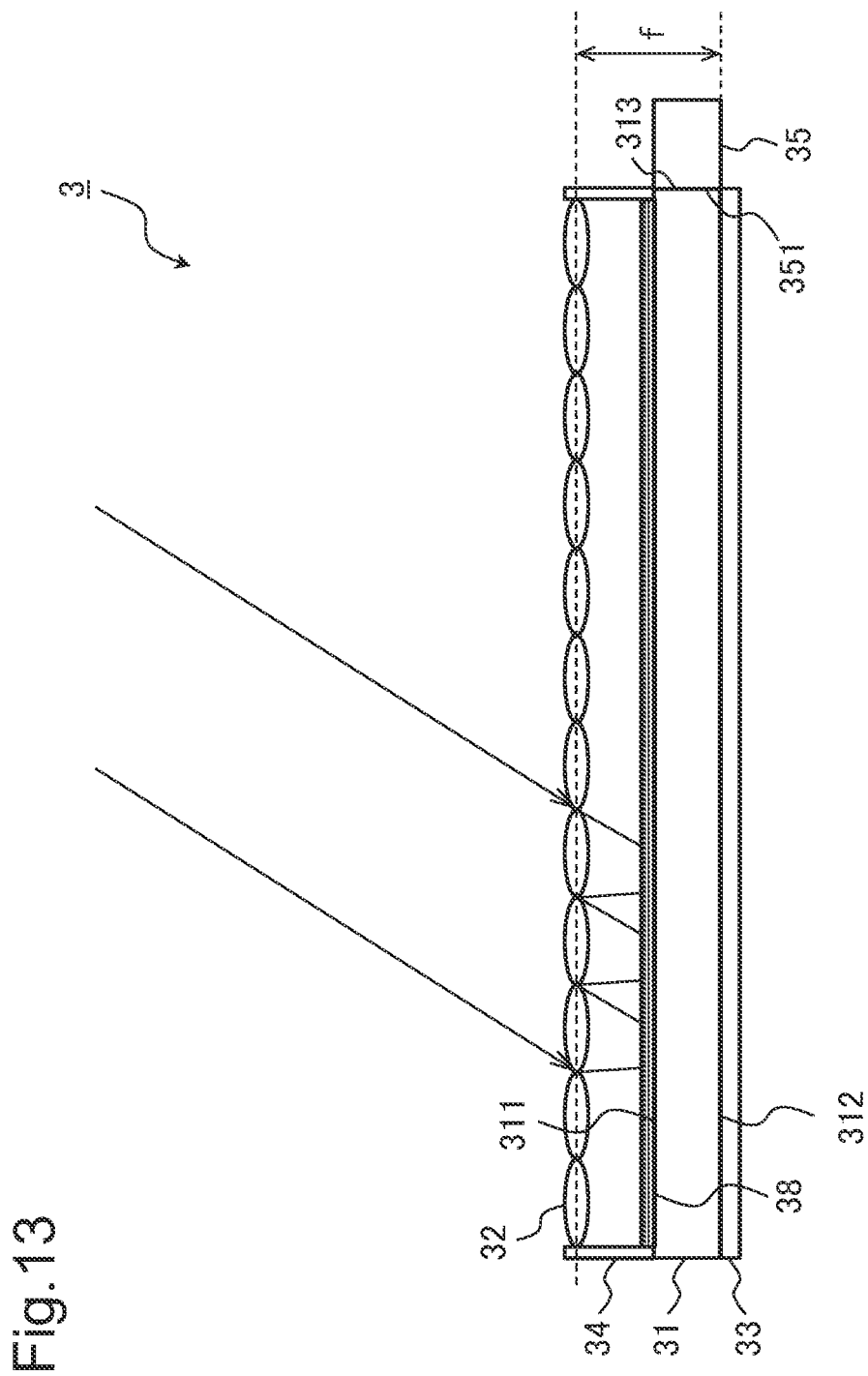
FIG. 13 is a cross-sectional diagram of one example of the light-receiving device according to the third example embodiment of the present invention.
Figure 14:
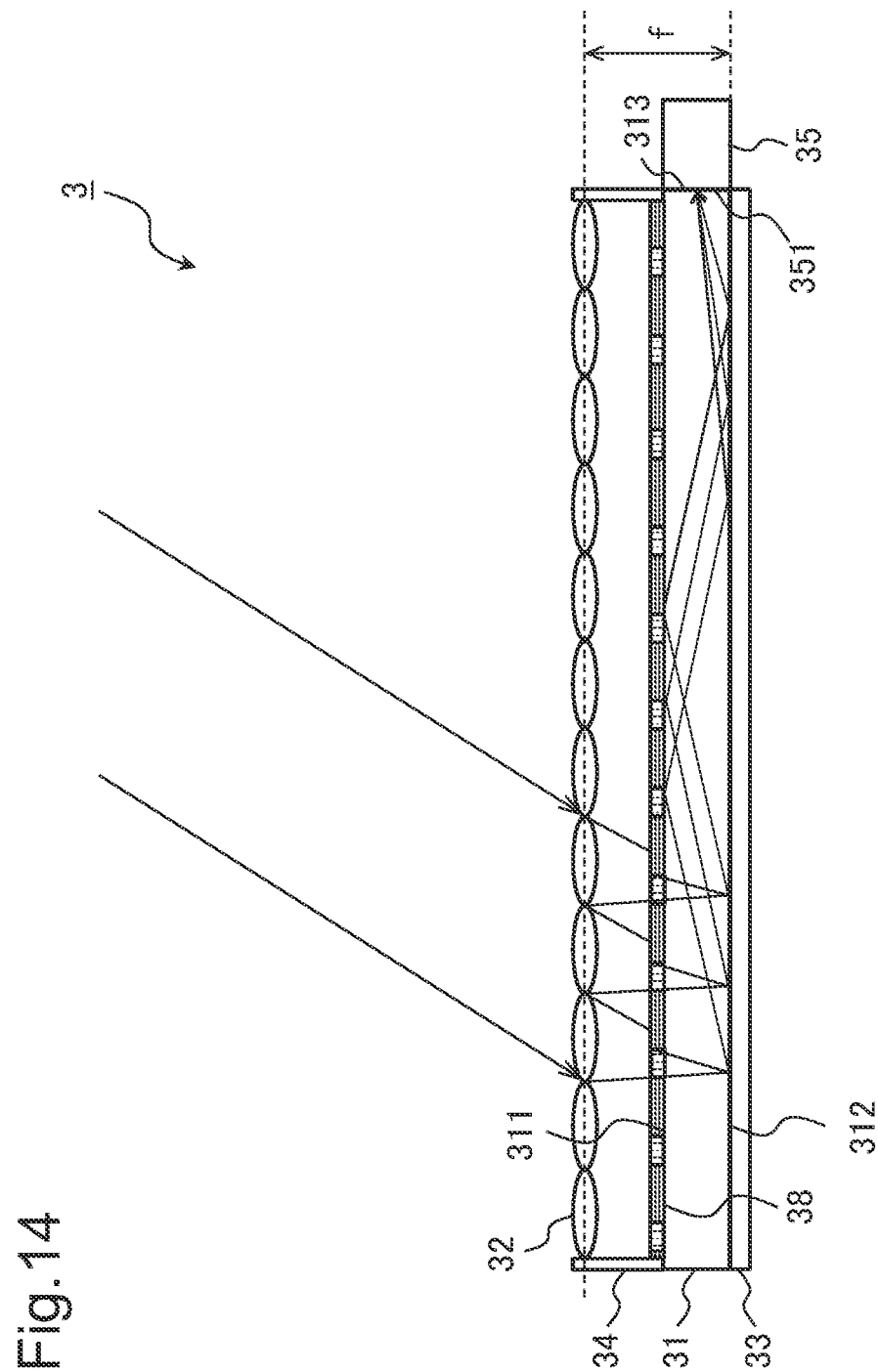
FIG. 14 is a conceptual diagram for describing light reception of an optical signal in one example of the light-receiving device according to the third example embodiment of the present invention.

FIGS. 11 to 14 each are a conceptual diagram for describing one example of a configuration of a light-receiving device 3 according to the present example embodiment. FIG. 11 is a perspective view of the light-receiving device 3. FIG. 12 is a top view of the light-receiving device 3. FIGS. 13 and 14 each are a cross-sectional diagram in which the light-receiving device 3 is cut along a C-C line in FIG. 12. FIGS. 13 and 14 each illustrate an arrow conceptually indicating light entering the light-receiving device 3 and travel of light inside the light-receiving device 3.

The light-receiving device 3 includes a light guide plate 31, a lens sheet 32, a directional light-guide layer 33, a support member 34, an optical receiver 35, and a shutter 38. The configuration of each of the light guide plate 31, the lens sheet 32, the directional light-guide layer 33, the support member 34, and the optical receiver 35 corresponds to each of the light guide plate 11, the lens sheet 12, the directional light-guide layer 13, the support member 14, and the optical receiver 15 of the light-receiving device 1 according to the first example embodiment. In the following, description of a feature similar to the light-receiving device 1 may be omitted.

The light guide plate 31 is a plate-like transparent member having a first surface 311 and a second surface 312 as principal surfaces opposed to each other. A material and characteristics of the light guide plate 31 are similar to the light guide plate 11 of the light-receiving device 1. The light guide plate 31 has a flat-plate-like outer shape, and on one end surface of the plate, an emission surface 313 is formed. The first surface 311 is an incident surface which an optical signal refracted by the lens sheet 32 enters. The emission surface 313 is an end from which an optical signal that has propagated inside the light guide plate 31 is emitted.

On an upper side of the first surface 311 of the light guide plate 31, the lens sheet 32 supported by the support member 34 is disposed. On the second surface 312 of the light guide plate 31, the directional light-guide layer 33 is disposed. On the emission surface 313 of the light guide plate 31, the optical receiver 35 is disposed.

A travel direction of an optical signal that is refracted by the lens sheet 32 and enters an inside of the light guide plate 31 from the first surface 311 is changed toward the emission surface 313 by the directional light-guide layer 33 disposed on the second surface 312. The optical signal the travel direction of which has been changed by the directional light-guide layer 33 propagates inside the light guide plate 31 toward the emission surface 313. FIG. 14 illustrates, by using an arrow, an optical signal entering an inside of the light guide plate 31 from the first surface 311 propagate inside the light guide plate 31 toward the optical receiver 35.

The lens sheet 32 is supported by the support member 34 on an upper side of the first surface 311 of the light guide plate 31. A material and characteristics of the lens sheet 32 are similar to the lens sheet 12 of the light-receiving device 1. The lens sheet 32 has a structure in which a plurality of lenses are arranged on one sheet. A plurality of lenses configuring the lens sheet 32 are focused on different focal positions of the directional light-guide layer 33 disposed on the second surface 312 of the light guide plate 31.

The directional light-guide layer 33 is disposed on the second surface 312 of the light guide plate 31. A material and characteristics of the directional light-guide layer 33 are similar to the directional light-guide layer 13 of the light-receiving device 1. The directional light-guide layer 33 guides an optical signal in such a way that light entering an inside of the light guide plate 31 from the first surface 311 of the light guide plate 31 travels toward the emission surface 313.

The support member 34 supports the lens sheet 32 in such a way as to be positioned on an upper side of the first surface 311 of the light guide plate 31. The support member 34 supports the lens sheet 32 in such a way that a distance between a principal surface of the lens sheet 32 and the second surface 312 of the light guide plate 31 is equal to a focal distance f of the lens sheet 32. A material and a shape of the support member 34 are not specifically limited.

The optical receiver 35 is disposed in such a way that a light-receiving surface 351 faces the emission surface 313 of the light guide plate 31. The optical receiver 35 has a configuration similar to the optical receiver 15 of the light-receiving device 1. The optical receiver 35 receives an optical signal emitted from the emission surface 313 of the light guide plate 31. The optical receiver 35 converts the received optical signal into an electric signal. The optical receiver 35 outputs the electric signal after the conversion to a decoder (not illustrated).

The shutter 38 is a liquid crustal element that can be subjected to opening/closing control by a control device which is not illustrated. The shutter 38 is subjected to opening/closing control with respect to each set of a plurality of lenses configuring the lens sheet 32. Opening/closing when the shutter 38 is opened may be uniformly controlled in the entire surface of the shutter 38 or a part of the shutter 38 may be selectively controlled. The shutter 38 can be achieved, for example, by a liquid crystal shutter in which a plurality of cells including birefringent liquid crystal molecules sealed therein are sandwiched between two linear polarizers having polarization directions intersecting with each other.

FIG. 13 illustrates a state in which the entire surface of the shutter 38 is closed. In a state where the entire surface of the shutter 38 is closed, an optical signal does not enter the first surface 311 of the light guide plate 31. FIG. 14 illustrates a state in which a part of the shutter 38 is opened. When the shutter 38 is opened, an optical signal enters the first surface 311 of the light guide plate 31 of a portion in which the shutter 38 is opened and signal light of the optical signal is guided to the optical receiver 35.

When, for example, the light-receiving device 3 is used in a situation where direct sunlight is made incident, the directional light-guide layer 33 may be damaged at a position such as a focal position of a lens configuring the lens sheet 38 when sunlight directly enters the light guide plate 31. In such a case, according to an incident degree of sunlight, control is performed in such way as to decrease an aperture rate of the shutter 38, and thereby an incident amount of light to the light guide plate 31 may be reduced. The shutter 38 may be configured, for example, in such a way as to be able to variably control a transmittance of light. When an opening/closing state of the shutter 38 can be variably controlled, in a case of strong sunlight and the like, it is easy to receive an optical signal by decreasing an aperture rate of the shutter 38. When a position which an optical signal enters is previously known, an optical signal can be efficiently received by executing control in such a way as to selectively open the shutter 38 of the position. When, for example, an optical sensor is disposed at any position on an upper side of the shutter 38, a coming direction of an optical signal is estimated based on light received by the optical sensor, and control may be executed in such a way as to open the shutter 38 of a portion that easily receives an optical signal from the coming direction.

As described above, a configuration of the light-receiving device 3 according to the present example embodiment has been described. The configuration illustrated each in FIGS. 11 to 14 is one example and does not limit the configuration of the light-receiving device 3 according to the present example embodiment to a form as is.

As described above, the light-receiving device according to the present example embodiment further includes a shutter that is disposed on an upper surface of a first surface of a light guide plate and includes a liquid crystal element capable of controlling at least a part of an aperture state. Therefore, according to the present example embodiment, light can be prevented from concentrating on a focus of a lens configuring a lens sheet, and therefore a directional light-guide layer can be prevented from being damaged by strong light such as direct sunlight. Further, according to the present example embodiment, an amount of light received by an optical receiver can be controlled, and therefore an influence of background light which may be included in signal light can be reduced.

[Reduction of Background Light]

FIGS. 15A to 15E are diagrams for describing that background light is reduced by using components of the light-receiving devices according to the first to third example embodiments and thereby a signal-noise ratio is improved. FIGS. 15A to 15E illustrate a graph for verifying how wavelength dependency of energy of an optical signal and background light (sunlight) is changed by using components of the light-receiving devices according to the first to third example embodiments. Wavelength dependency of energy of an optical signal and background light in FIGS. 15A to 15E indicate a conceptual relation and does not accurately illustrate these items. FIGS. 15A to 15E illustrate an example in which an optical signal of an infrared region is used.

Figure 15A:
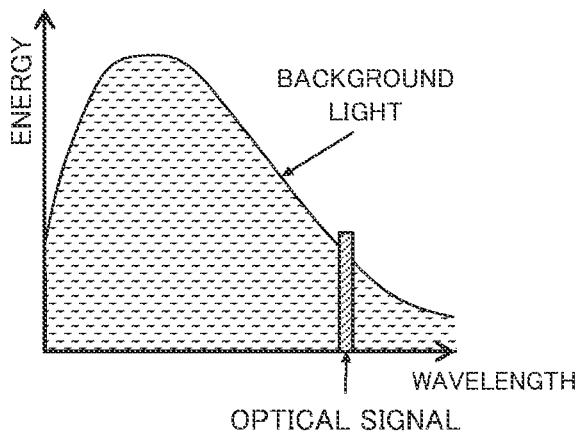
FIGS. 15A to 15E are conceptual diagrams for describing that a signal-noise ratio (SN ratio) is improved by using components of the light-receiving devices according to the first to third example embodiments.

FIG. 15A is a graph indicating wavelength dependency of energy of an optical signal and background light in which background light and an optical signal propagating in a space are directly received as are by an optical receiver. In FIG. 15A, energy of background light of a visible region is larger than an optical signal.

Figure 15B:
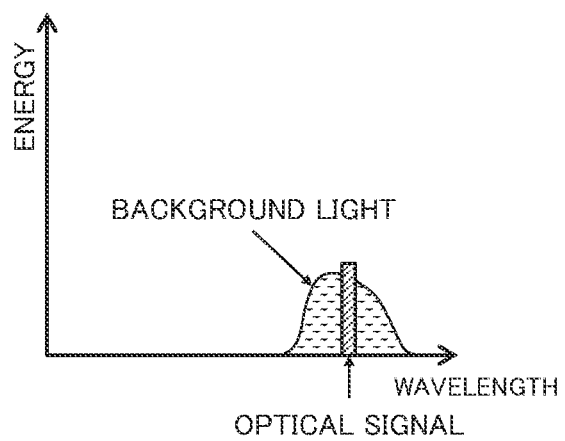

FIG. 15B is a graph indicating wavelength dependency of energy of an optical signal and background light when being received by a light-receiving device in which the directional light-guide layer 23 (a hologram layer) and the first color filter 191 are combined. In FIG. 15B, energy of background light of a visible region is eliminated, and therefore a signal-noise ratio is improved.

Figure 15C:
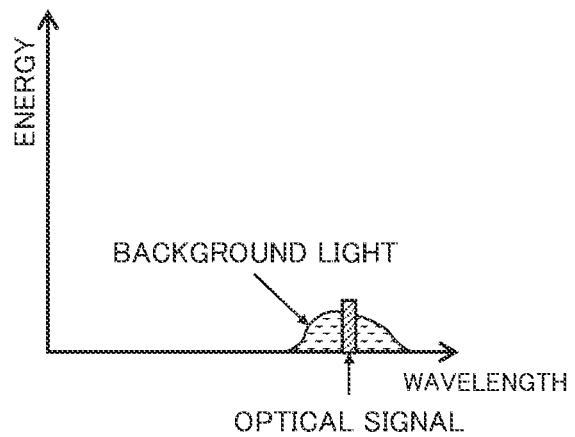

FIG. 15C is a graph indicating wavelength dependency of energy of an optical signal and background light when being received by a light-receiving device in which the directional light-guide layer 23 (a hologram layer), the first color filter 191, and the wavelength plate 261 are combined. In FIG. 15C, a component having a different rotation direction is eliminated from an optical signal of circularly polarized light, and therefore a signal-noise ratio is improved, compared with FIG. 15B.

Figure 15D:
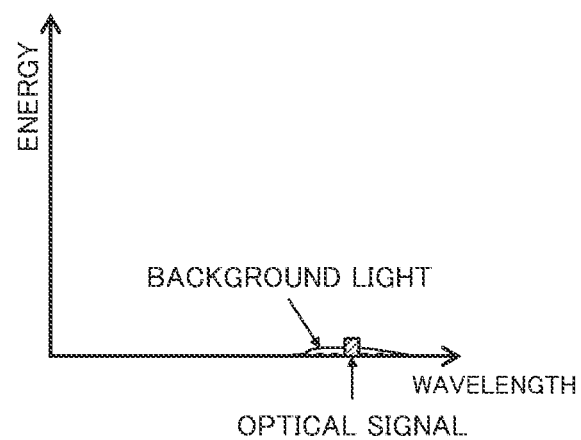

FIG. 15D is a graph indicating wavelength dependency of energy of an optical signal and background light when being received by a light-receiving device in which the directional light-guide layer 23 (a hologram layer), the first color filter 191, the wavelength plate 261, and the shutter 38 are combined. In FIG. 15D, a light-receiving amount is reduced by the shutter 38, and therefore an influence of background light is decreased, compared with FIG. 15C.

Figure 15E:
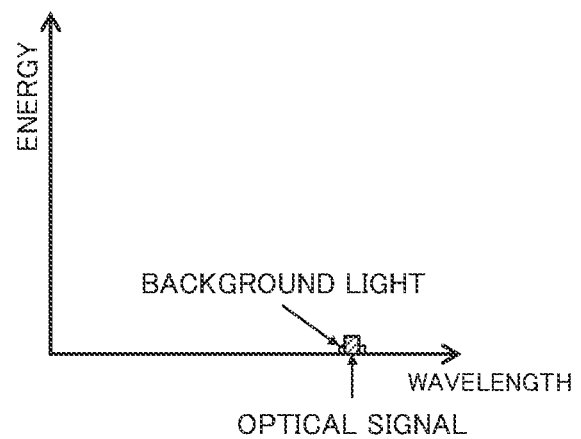

FIG. 15E is a graph indicating wavelength dependency of energy of an optical signal and background light when being received by a light-receiving device in which the directional light-guide layer 23 (a hologram layer), the first color filter 191, the wavelength plate 261, the shutter 38, and the second color filter 192 are combined. In FIG. 15E, by the second color filter 192, a wavelength region of light received by an optical receiver is narrowed in conform to a wavelength region of an optical signal, and therefore a signal-noise ratio is improved, compared with FIG. 15D.

As described above, when components of the light-receiving devices according to the first to third example embodiments are combined, a signal-noise ratio of an optical signal received by an optical receiver is further improved.

Fourth Example Embodiment

Next, a light-receiving device according to a fourth example embodiment of the present invention is described with reference to drawings. The light-receiving device according to the present example embodiment is different from the first example embodiment in that an optical sensor that detects a coming direction of an optical signal is included.

Figure 16:
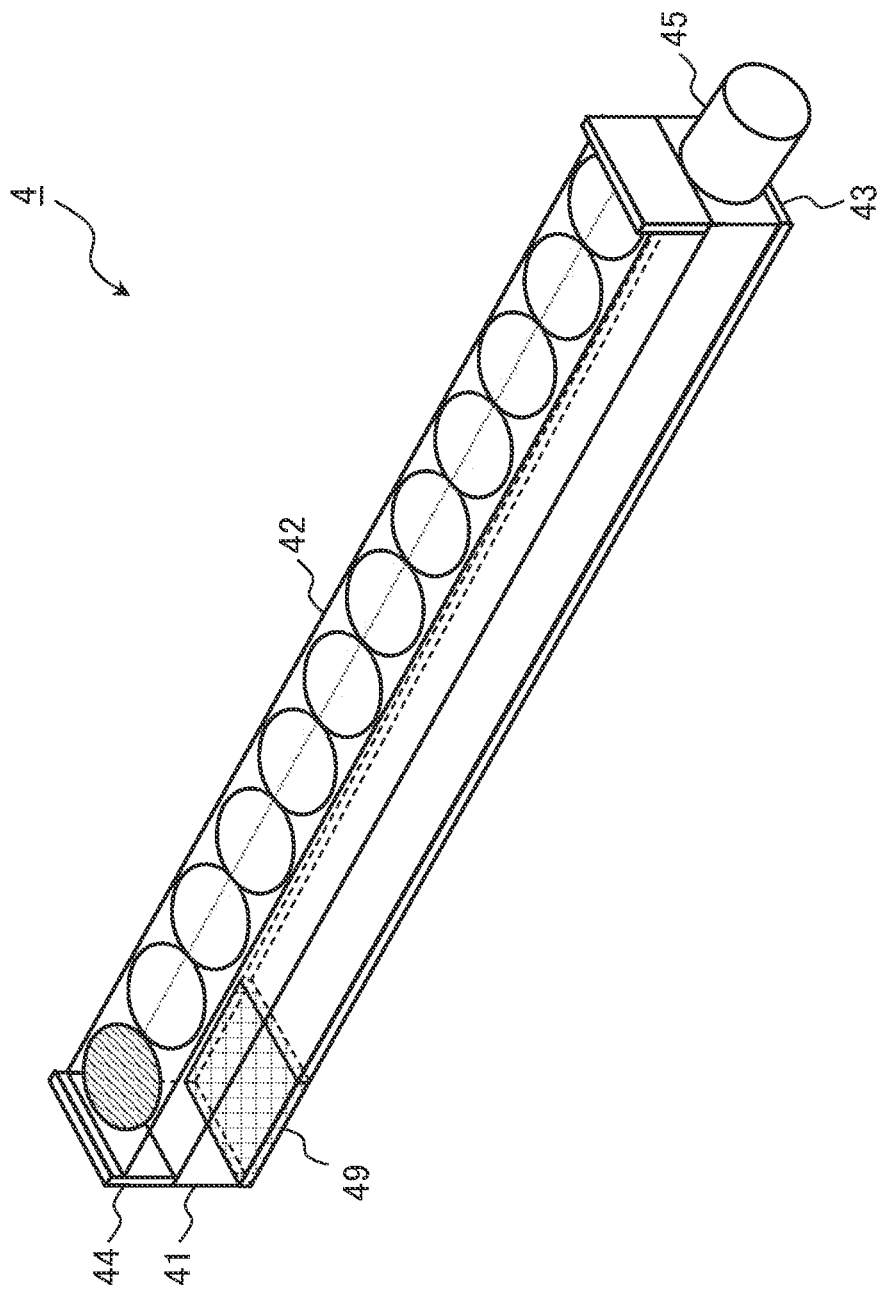
FIG. 16 is a perspective view of one example of a light-receiving device according to a fourth example embodiment of the present invention.
Figure 17:
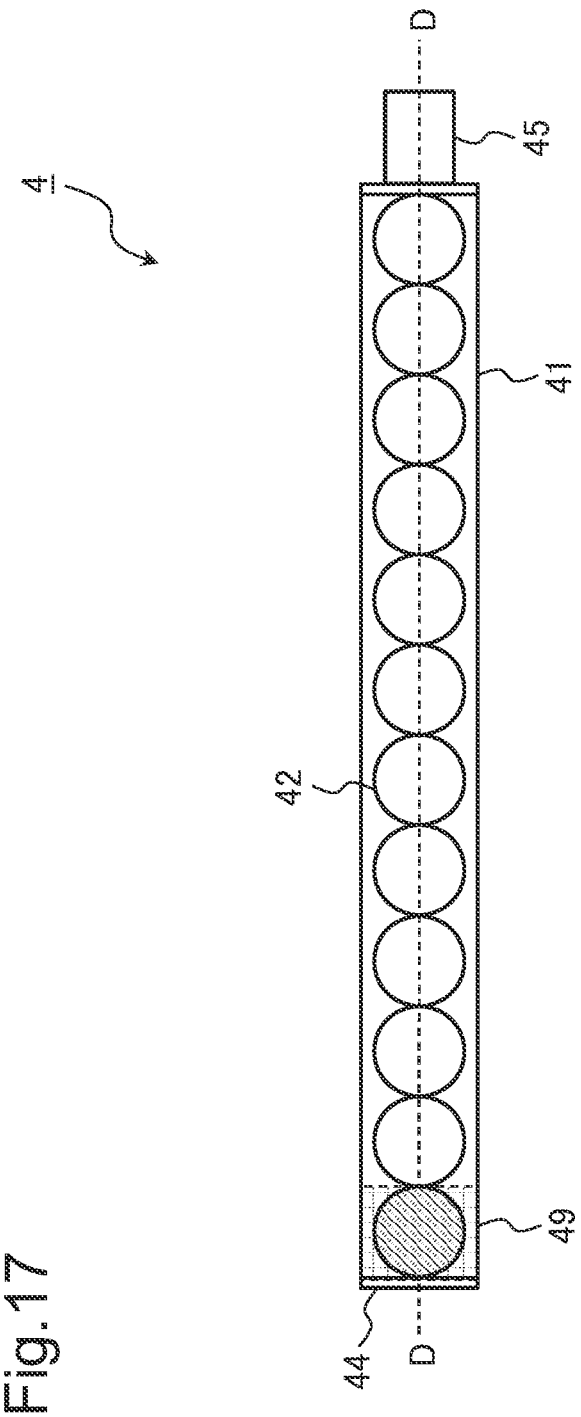
FIG. 17 is a top view of one example of the light-receiving device according to the fourth example embodiment of the present invention.
Figure 18:
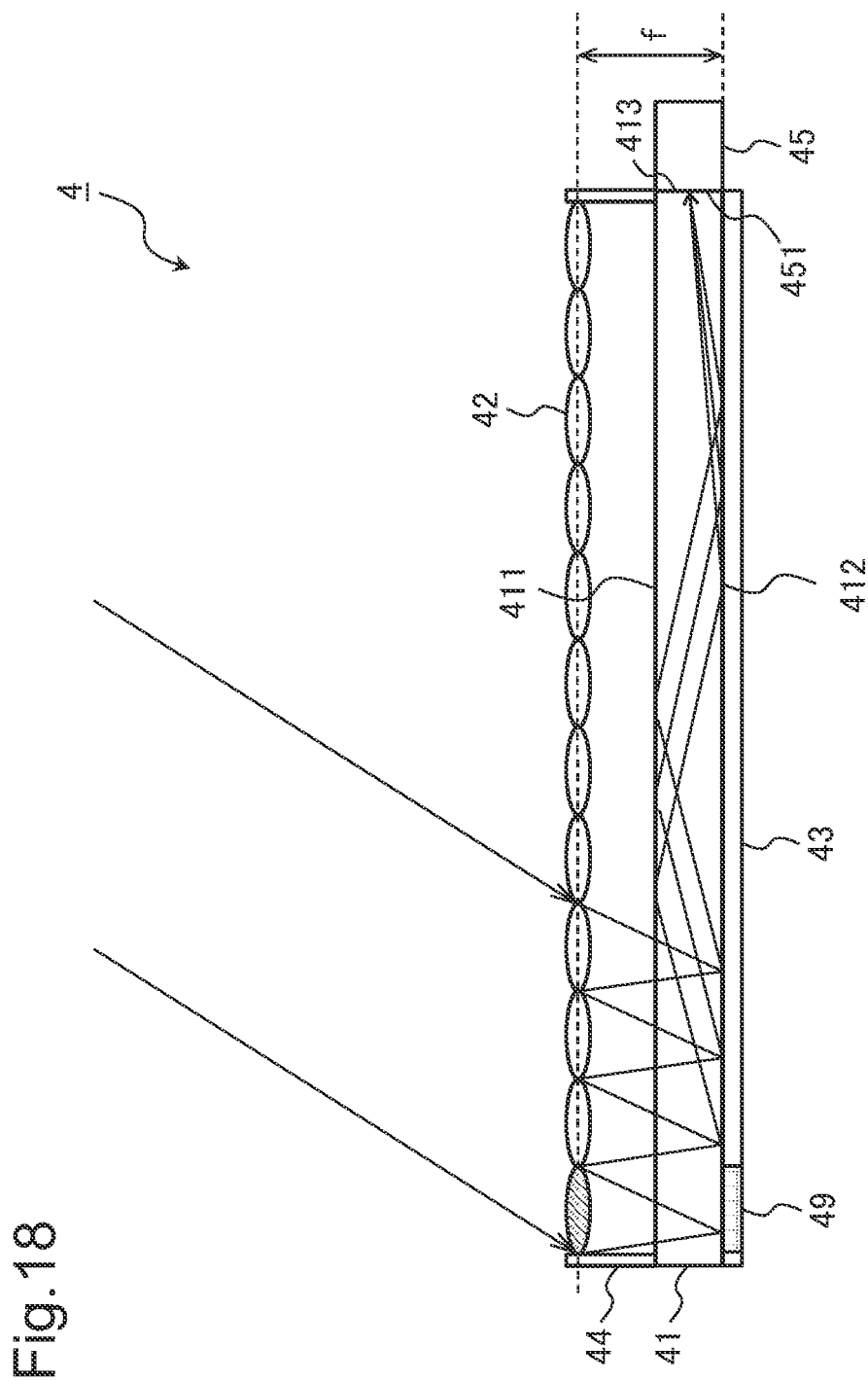
FIG. 18 is a cross-sectional diagram of one example of the light-receiving device according to the fourth example embodiment of the present invention.
Figure 19:
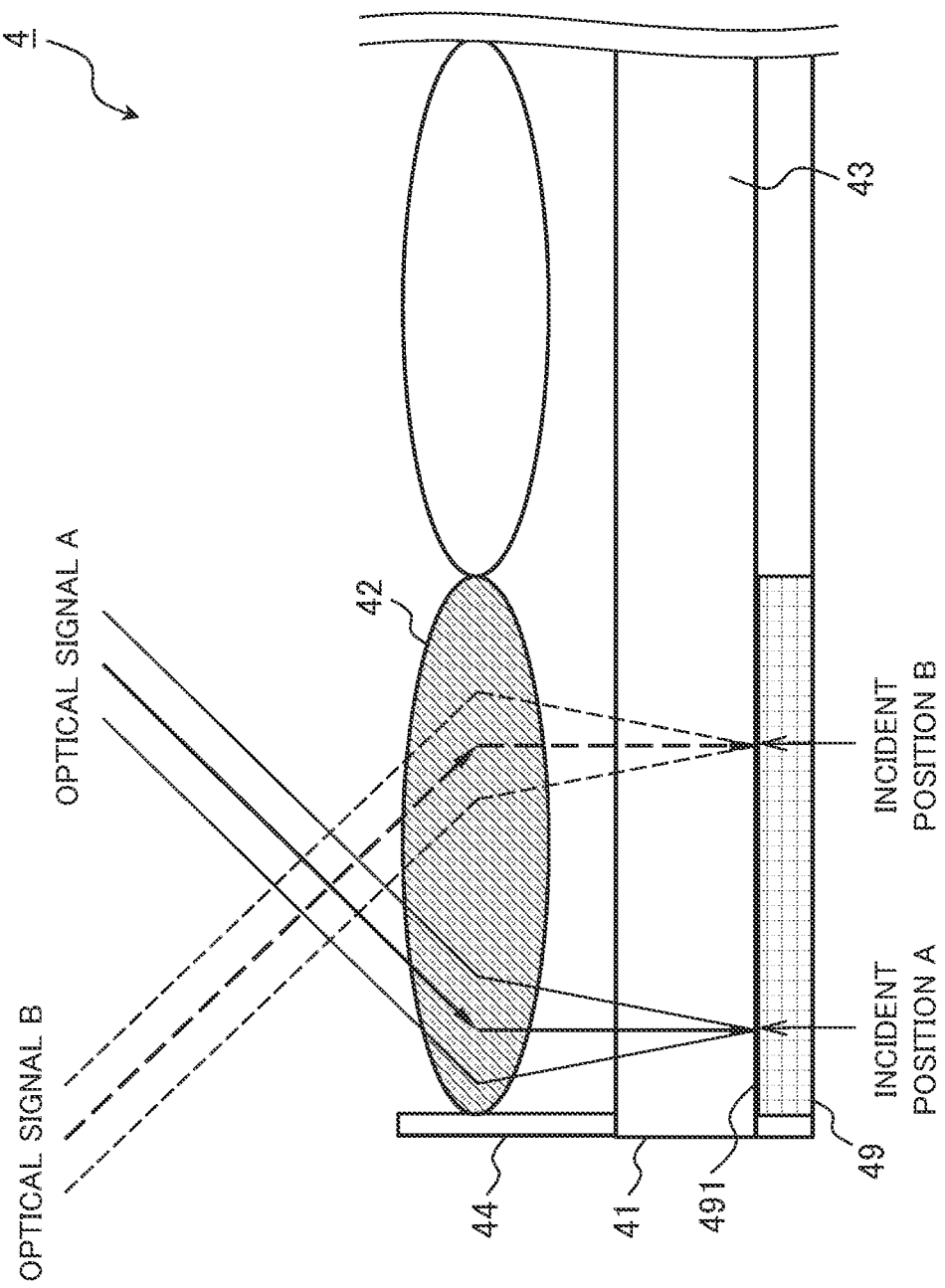
FIG. 19 is a conceptual diagram for describing detection of a light-transmission direction of an optical signal in one example of the light-receiving device according to the fourth example embodiment of the present invention.

FIGS. 16 to 19 each are a conceptual diagram for describing one example of a configuration of a light-receiving device 4 according to the present example embodiment. FIG. 16 is a perspective view of the light-receiving device 4. FIG. 17 is a top view of the light-receiving device 4. FIG. 18 is a cross-sectional diagram in which the light-receiving device 4 is cut along a D-D line in FIG. 17. FIG. 19 is a conceptual diagram for describing one example in which a coming direction of an optical signal received by the light-receiving device 4 is detected. FIGS. 18 and 19 each illustrate an arrow conceptually indicating light entering the light-receiving device 4 and travel of light inside the light-receiving device 4.

The light-receiving device 4 includes a light guide plate 41, a lens sheet 42, a directional light-guide layer 43, a support member 44, an optical receiver 45, and an optical sensor 49. The configuration of each of the light guide plate 41, the lens sheet 42, the directional light-guide layer 43, the support member 44, and the optical receiver 45 corresponds to each of the light guide plate 11, the lens sheet 12, the directional light-guide layer 13, the support member 14, and the optical receiver 15 of the light-receiving device 1 according to the first example embodiment. In the following, description of a feature similar to the light-receiving device 1 may be omitted.

The light guide plate 41 is a plate-like transparent member having a first surface 411 and a second surface 412 as principal surfaces opposed to each other. A material and characteristics of the light guide plate 41 are similar to the light guide plate 11 of the light-receiving device 1. The light guide plate 41 has a flat-plate-like outer shape, and an emission surface 413 is formed on one end surface thereof. The first surface 411 is an incident surface which an optical signal refracted by the lens sheet 42 enters. The emission surface 413 is an end from which an optical signal that has propagated inside the light guide plate 41 is emitted.

On an upper side of the first surface 411 of the light guide plate 41, the lens sheet 42 supported by the support member 44 is disposed. On the second surface 412 of the light guide plate 41, the directional light-guide layer 43 is disposed. On a part of the second surface 412 of the light guide plate 41, the optical sensor 49 is disposed. The optical sensor 49 is disposed in such a way that a detection surface of the sensor faces the second surface 412 opposed to a lens at a position most distant from the emission surface 413. On the emission surface 413 of the light guide plate 41, the optical receiver 45 is disposed.

A travel direction of most part of an optical signal that is refracted by the lens sheet 42 and enters an inside of the light guide plate 41 from the first surface 411 is changed toward the emission surface 413 by the directional light-guide layer 43 disposed on the second surface 412. A part of the optical signal that is refracted by the lens sheet 42 and enters an inside of the light guide plate 41 from the first surface 411 enters the optical sensor 49. The optical signal the travel direction of which has been changed by the directional light-guide layer 43 propagates inside the light guide plate 41 toward the emission surface 413. FIG. 18 illustrates, by using an arrow, an optical signal entering an inside of the light guide plate 41 from the first surface 411 propagate inside the light guide plate 41 toward the optical receiver 45.

The lens sheet 42 is supported by the support member 44 on an upper side of the first surface 411 of the light guide plate 41. A material and characteristics of the lens sheet 42 are similar to the lens sheet 12 of the light-receiving device 1. The lens sheet 42 has a structure in which a plurality of lenses are arranged in a row on one sheet. A plurality of lenses configuring the lens sheet 42 are focused on different focal positions of the directional light-guide layer 43 or the optical sensor 49 disposed on the second surface 412 of the light guide plate 41. In FIGS. 16 to 19, a lens positioned on an upper side of the optical sensor 49 is clearly indicated by using hatching, but the lens is the same as other lenses.

The directional light-guide layer 43 is disposed on the second surface 412 of the light guide plate 41. A material and characteristics of the directional light-guide layer 43 are similar to the directional light-guide layer 13 of the light-receiving device 1. The directional light-guide layer 43 guides an optical signal in such a way that light entering an inside of the light guide plate 41 from the first surface 411 of the light guide plate 41 travels toward the emission surface 413.

The support member 44 supports the lens sheet 42 in such a way as to be positioned on an upper side of the first surface 411 of the light guide plate 41. The support member 44 supports the lens sheet 42 in such a way that a distance between a principal surface of the lens sheet 42 and the second surface 412 of the light guide plate 41 is equal to a focal distance f of the lens sheet 42. A material and a shape of the support member 44 are not specifically limited.

The optical receiver 45 is disposed in such a way that a light-receiving surface 451 faces the emission surface 413 of the light guide plate 41. The optical receiver 45 has a configuration similar to the optical receiver 15 of the light-receiving device 1. The optical receiver 45 receives an optical signal emitted from the emission surface 413 of the light guide plate 41. The optical receiver 45 converts the received optical signal into an electric signal. The optical receiver 45 outputs the electric signal after the conversion to a decoder (not illustrated).

The optical sensor 49 is an imaging element disposed in such a way that a detection surface 491 of the sensor faces a second surface of the light guide plate 41 in association with at least one lens configuring the lens sheet 42. The optical sensor 49 is a sensor that detects incident light on the detection surface 491 and outputs an incident position of the detected incident light to a detection device which is not illustrated. The optical sensor 49 may be a two-dimensional sensor that detects a two-dimensional position of incident light or may be a one-dimensional sensor that detects a one-dimensional position of incident light. When a hologram layer is used for the directional light-guide layer 43, light entering the directional light-guide layer 43 leaks to the other side. Therefore, when a hologram layer is used for the directional light-guide layer 43, configuration may be made in which at least one optical sensor 49 is installed on a lower surface of the directional light-guide layer 43.

As in FIG. 19, in the optical sensor 49, an optical signal enters an incident position according to a coming direction. For example, an optical signal A enters an incident position A, and an optical signal B enters an incident position B. Therefore, if a relation between a coming direction of an optical signal and a position on the detection surface 491 of the optical sensor 49 is recorded, a coming direction of an optical signal can be estimated based on a position on the detection surface 491 where the optical signal is detected.

In order to guide, to the optical receiver 45, more optical signals made incident to the light guide plate 41, the optical sensor 49 is preferably disposed in association with a lens located at a position distant from the optical receiver 45. When an optical signal can be guided toward the optical receiver 45 by being passed through the optical sensor 49, the optical sensor 49 may be disposed in association with at least any one of lenses.

As described above, a configuration of the light-receiving device 4 according to the present example embodiment has been described. The configuration illustrated each in FIGS. 16 to 19 is one example and does not limit the configuration of the light-receiving device 4 according to the present example embodiment to a form as is.

As described above, the light-receiving device according to the present example embodiment further includes an optical sensor disposed in such a way that a detection surface of the sensor faces at least a part of a second surface of a light guide plate. According to the light-receiving device of the present example embodiment, a coming direction of an optical signal can be estimated based on the incident position where the optical signal enters the optical sensor.

In order to enable bidirectional communication, it is necessary to detect a coming direction of signal light. The light-receiving device according to the present example embodiment can detect a coming direction of signal light by disposing optical sensors (imaging elements) on a directional light-guide layer side by side.

When vehicle-to-vehicle communication is performed by mounting the light-receiving device according to the present example embodiment on an automobile, a configuration may be made in such a way as to detect a coming direction of signal light by using, instead of a two-dimensional sensor, a one-dimensional sensor disposed horizontally to a road surface. For example, a one-dimensional sensor for vehicle-to-vehicle communication may be disposed in such a way as to receive signal light traveling horizontally to a road surface, and a one-dimensional sensor for a signal may be disposed in such a way as to receive signal light traveling from a direction (upper direction) of a signal.

Fifth Example Embodiment

Next, a light-receiving device according to a fifth example embodiment of the present invention is described with reference to drawings. The light-receiving device according to the present example embodiment is different from the first example embodiment in that first surfaces of a plurality of light-receiving devices are cylindrically disposed by being directed outward and an optical signal coming from a horizontal direction is received.

Figure 20:
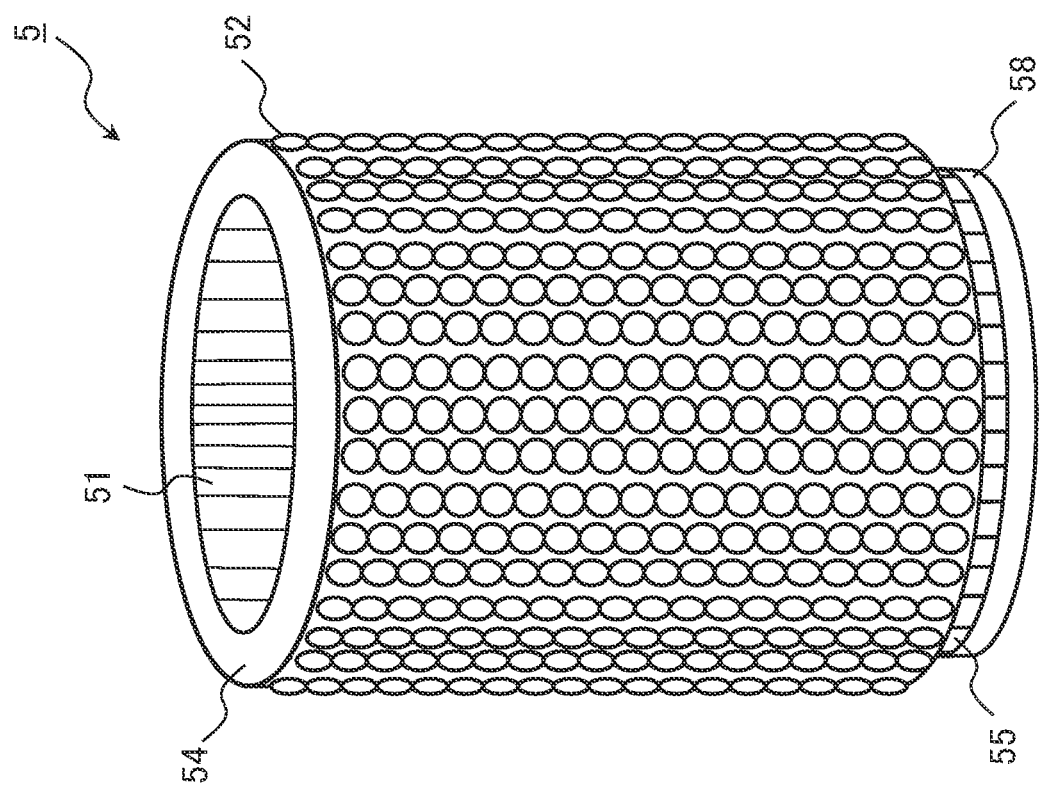
FIG. 20 is a perspective view of one example of a light-receiving device according to a fifth example embodiment of the present invention.
Figure 21:
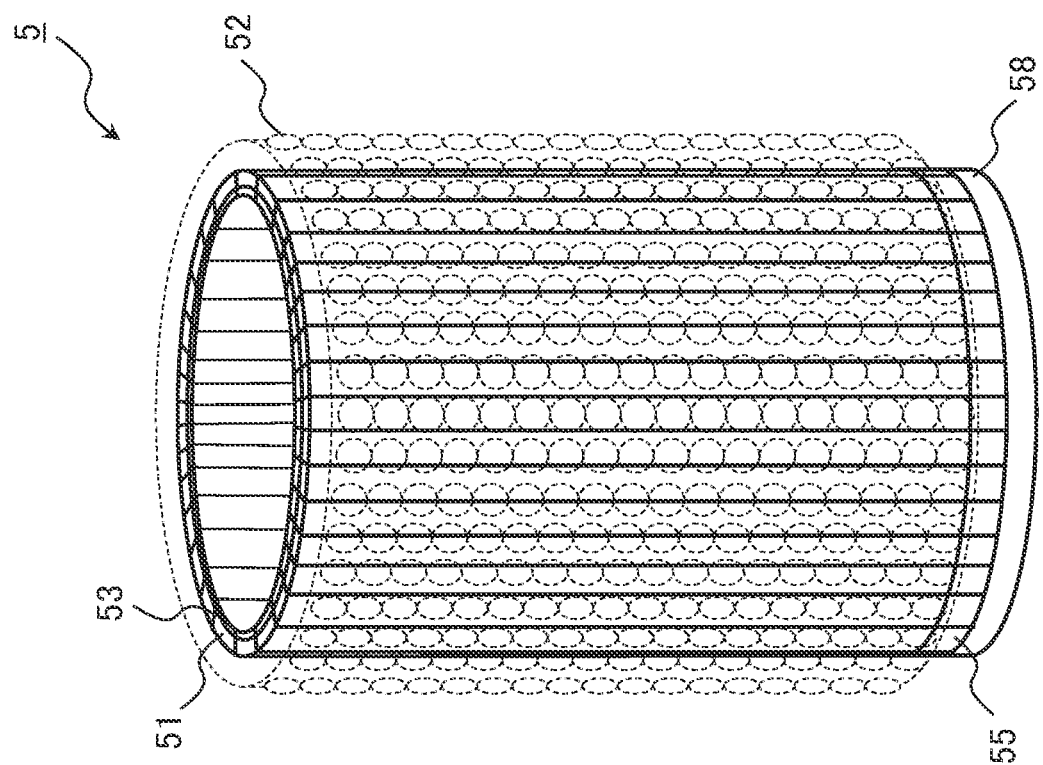
FIG. 21 is a conceptual diagram for describing a light guide portion of one example of the light-receiving device according to the fifth example embodiment of the present invention.
Figure 22:
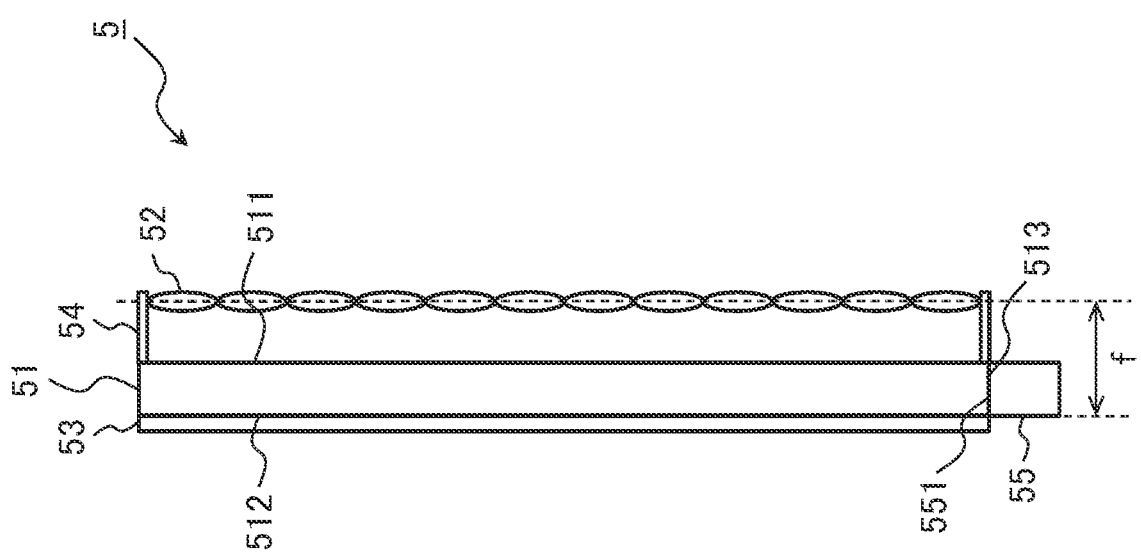
FIG. 22 is a cross-sectional diagram of one example of the light-receiving device according to the fifth example embodiment of the present invention.

FIGS. 20 to 22 each are a conceptual diagram for describing one example of a configuration of a light-receiving device 5 according to the present example embodiment. FIG. 20 is a perspective view of the light-receiving device 5. FIG. 21 is a perspective view of the light-receiving device 5 in which some of components are seen through. FIG. 22 is a cross-sectional diagram of the light-receiving device 5.

The light-receiving device 5 includes a plurality of light guide plates 51, a lens sheet 52, a plurality of directional light-guide layers 53, a support member 54, a plurality of optical receivers 55, and a base 58. The configuration of each of the light guide plate 51, the lens sheet 52, the directional light-guide layer 53, the support member 54, and the optical receiver 55 corresponds to each of the light guide plate 11, the lens sheet 12, the directional light-guide layer 13, the support member 14, and the optical receiver 15 of the light-receiving device 1 according to the first example embodiment. Each of a light guide plate 51, a directional light-guide layer 53, and an optical receiver 55 configuring the plurality of light guide plates 51, the plurality of directional light-guide layers 53, and the plurality of optical receivers 55 configures one light-receiving unit. In the following, description of a feature similar to the light-receiving device 1 may be omitted.

The light guide plate 51 is a plate-like transparent member having a first surface 511 and a second surface 512 as principal surfaces opposed to each other. A material and characteristics of the light guide plate 51 are similar to the light guide plate 11 of the light-receiving device 1. In the light guide plate 51, a principal surface is curved in conformity to a shape (cylindrical) of the light-receiving device 5 and on one end surface of the surface, an emission surface 513 is formed. The first surface 511 is an incident surface which an optical signal refracted by the lens sheet 52 enters. The emission surface 513 is an end from which an optical signal that has propagated inside the light guide plate 51 is emitted.

The plurality of light guide plates 51 are cylindrically arranged in such a way that the first surface 511 is directed outward, the second surface 512 is directed inward, and the emission surface 513 is directed to a side of the base 58. On an upper surface of the plurality of light guide plates 51 cylindrically arranged, the support member 54 is disposed. The position of the plurality of light guide plates 51 is fixed by the support member 54.

On the first surface 511 of the light guide plate 51, the lens sheet 52 supported by the support member 54 is disposed in an opposite manner. On the second surface 512 of the light guide plate 51, the directional light-guide layer 53 is disposed. On the emission surface 513 of the light guide plate 51, the optical receiver 55 is disposed.

A travel direction of most part of an optical signal that is refracted by the lens sheet 52 and enters an inside of the light guide plate 51 from the first surface 511 is changed toward the emission surface 513 by the directional light-guide layer 53 disposed on the second surface 512. The optical signal the travel direction of which has been changed by the directional light-guide layer 53 propagates inside the light guide plate 51 toward the emission surface 513.

The lens sheet 52 is supported by the support member 54 in such a way as that at least any lens faces the first surfaces 511 of a plurality of light guide plates 51. A material and characteristics of the lens sheet 52 are similar to the lens sheet 12 of the light-receiving device 1. The lens sheet 52 has a structure in which a plurality of lenses are arranged on one sheet and has a cylindrical appearance in which two sides opposed to each other are connected. A plurality of lenses configuring the lens sheet 52 are focused on different focal positions of the directional light-guide layer 53 disposed on the same curved surface formed by second surfaces 512 of the plurality of light guide plates 51.

The directional light-guide layer 53 is disposed on the second surface 512 of the light guide plate 51. A material and characteristics of the directional light-guide layer 53 are similar to the directional light-guide layer 13 of the light-receiving device 1. The directional light-guide layer 53 guides an optical signal in such a way that light entering an inside of the light guide plate 51 from the first surface 511 of the light guide plate 51 travels toward the emission surface 513.

The support member 54 supports the lens sheet 52 in such a way as to face the first surface 511 of the light guide plate 51. The support member 54 supports the lens sheet 52 in such a way that a distance between a principal surface of the lens sheet 52 and the second surface 512 of the light guide plate 51 is equal to a focal distance f of the lens sheet 52. A material and a shape of the support member 54 are not specifically limited. In addition to the support member 54, a spacer for fixing a positional relationship between the light guide plate 51 and the lens sheet 52 may be disposed between the light guide plate 51 and the lens sheet 52.

The optical receiver 55 is disposed in such a way that a light-receiving surface 551 faces the emission surface 513 of the light guide plate 51. The optical receiver 55 is placed on the base 58 in such a way that a surface of an opposite side to the light-receiving surface 551 faces an upper surface of the base 58. The optical receiver 55 has a configuration similar to the optical receiver 15 of the light-receiving device 1. The optical receiver 55 receives an optical signal emitted from the emission surface 513 of the light guide plate 51. The optical receiver 55 converts the received optical signal into an electric signal. The optical receiver 55 outputs the electric signal after the conversion to a decoder (not illustrated).

The base 58 is a base for placing a plurality of light-receiving units cylindrically disposed. On an upper surface of the base 58, a plurality of light-receiving units cylindrically arranged in such a way that the optical receiver 55 is directed downward are placed. When a positional relationship among a plurality of light-receiving units can be fixed without the base 58, the base 58 may be omitted.

As described above, a configuration of the light-receiving device 5 according to the present example embodiment has been described. The configuration illustrated each in FIGS. 20 to 22 is one example and does not limit the configuration of the light-receiving device 5 according to the present example embodiment to a form as is.

When, for example, at a time of outputting an electric signal to a control device (not illustrated) from the optical receiver 55, a flag indicating by which one of light-receiving units an optical signal was received is included in the electric signal, it can be estimated from which one of directions in a horizontal direction an optical signal comes. When distribution (e.g., normal distribution) of an intensity of an optical signal received by a plurality of light-receiving units adjacent to each other is verified and a peak position of the distribution can be specified, a coming direction of the optical signal can be accurately estimated.

Figure 23A:
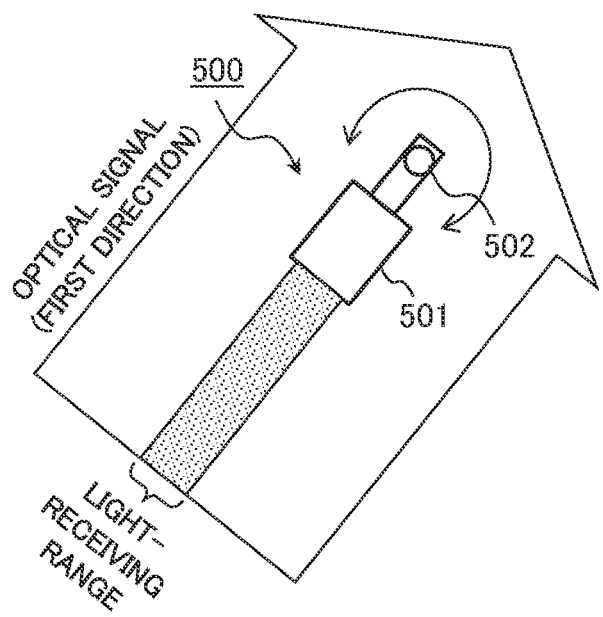
FIGS. 23A and 23B are conceptual diagrams for describing light reception in a light-receiving device according to a related technique.
Figure 23B:
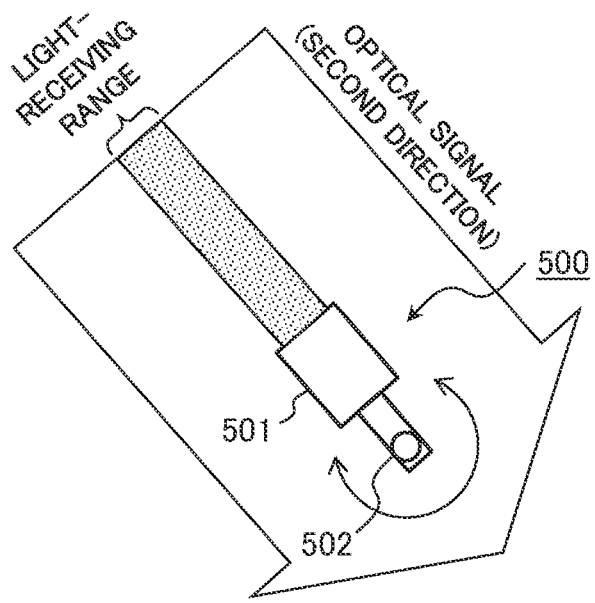

Here, in comparison with a related technique, light reception of the light-receiving device 5 according to the present example embodiment is described. Each of FIGS. 23A and 23B is a conceptual diagram illustrating an example in which an optical signal is received by a light-receiving device 500 according to a related technique. Each of FIGS. 24A and 24B is a conceptual diagram illustrating an example in which an optical signal is received by the light-receiving device 5 according to the present example embodiment.

As in FIGS. 23A and 23B, the light-receiving device 500 according to the related technique includes an optical receiver 501 and a movable mechanism 502 that supports the optical receiver 501 in such a way as to be rotatable with respect to one rotation axis. In the light-receiving device 500 according to the related technique, the movable mechanism 502 is rotated around a rotation axis and thereby a light-receiving direction is changed.

When, for example, signal light coming from a first direction is received by the optical receiver 501, the movable mechanism 502 is controlled by a control device (not illustrated) in such a way that a light-receiving surface is directed in the first direction. When signal light coming from a second direction different from the first direction is received by the optical receiver 501, the movable mechanism 502 is controlled by the control device in such a way that the light-receiving surface is directed in the second direction. In other words, when the light-receiving device 500 according to the related technique is used, it is necessary to control the movable mechanism 502 and thereby change the light-receiving surface of the optical receiver 501. In the light-receiving device 500 according to the related technique, when a coming direction of an optical signal is previously unknown, control to direct the light-receiving surface in the coming direction of the optical signal cannot be performed.

Figure 24A:
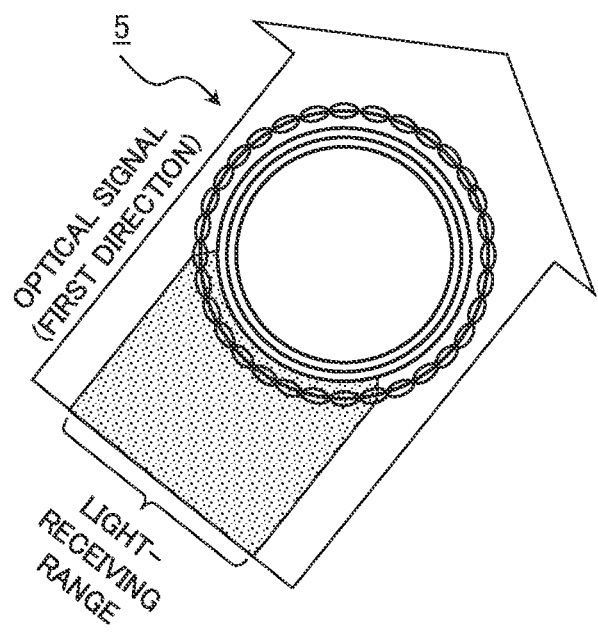
FIGS. 24A and 24B are conceptual diagrams for describing light reception in the light-receiving device according to the fifth example embodiment of the present invention.
Figure 24B:
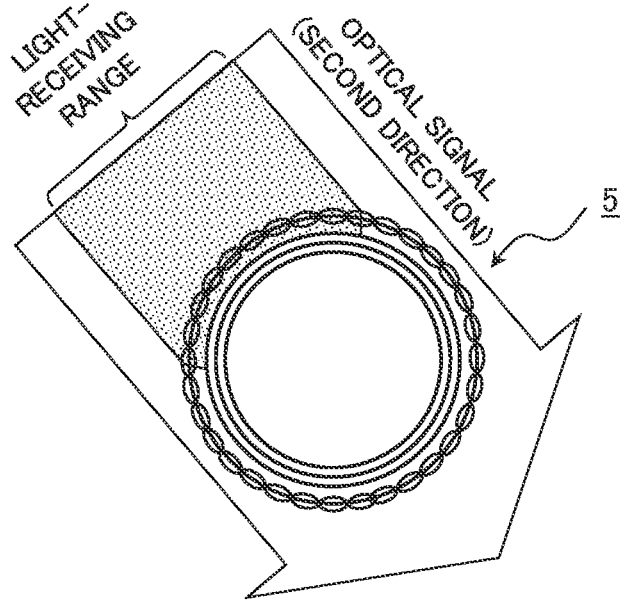

As in FIGS. 24A and 24B, the light-receiving device 5 according to the present example embodiment does not include a movable portion as in the light-receiving device 500 according the related technique. The light-receiving device 5 according to the present example embodiment can receive even signal light coming from a first direction and even signal light coming from a second direction without mechanically changing a light-receiving direction. In other words, the light-receiving device 5 according to the present example embodiment can receive an optical signal without mechanical control even when the coming direction of the optical signal is previously unknown. Further, the light-receiving device 5 according to the present example embodiment has a larger light-receiving area for an optical signal than the light-receiving device 500 according to the related technique, and therefore can receive an optical signal even when an optical transmission axis and an optical reception axis are misaligned to some extent.

Modified Example 4

Next, a light-receiving device according to a modified example 4 of the present example embodiment is described with reference to drawings. In the light-receiving device according to the present modified example, a plurality of columns of lenses are associated with one light guide plate, and an optical signal refracted by the plurality of columns of lenses is received by a single optical receiver.

Figure 25:
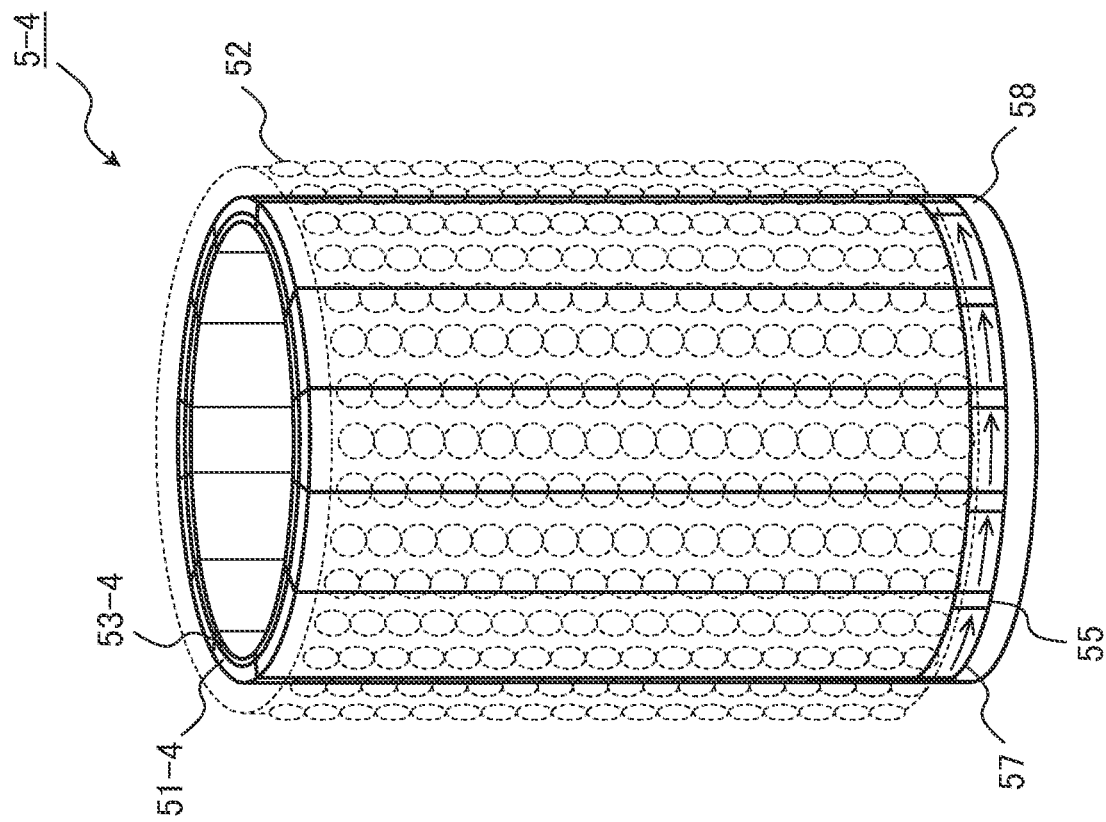
FIG. 25 is a conceptual diagram of one example of a light-receiving device of a modified example 4 according to the fifth example embodiment of the present invention.
Figure 26:
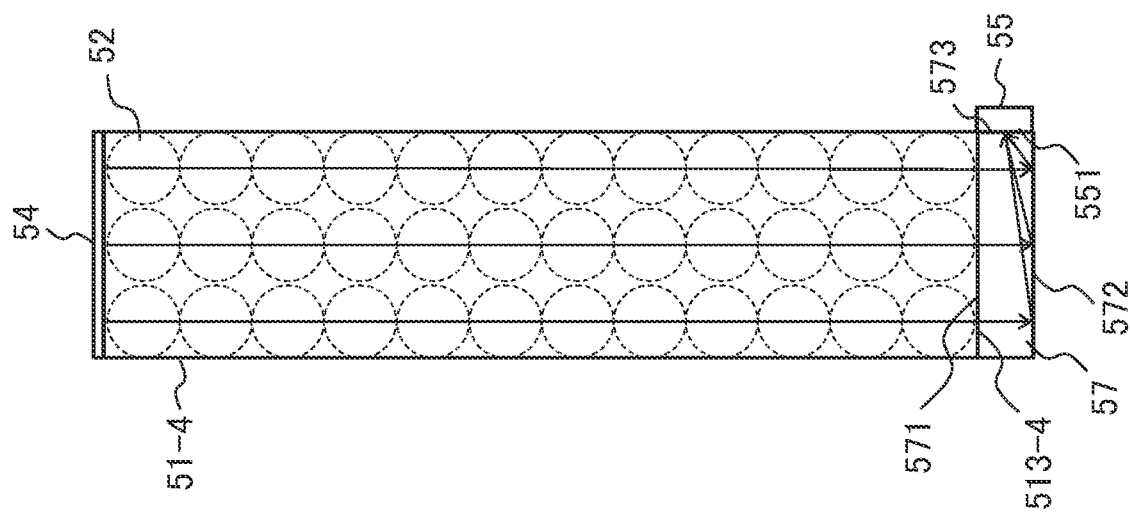
FIG. 26 is a conceptual diagram for describing a light guide portion of one example of the light-receiving device of the modified example 4 according to the fifth example embodiment of the present invention.

FIGS. 25 and 26 each are a conceptual diagram for describing a light-receiving device 5-4 according to the present modified example. FIG. 25 is a perspective view of the light-receiving device 5-4 in which a lens sheet 52 is seen through. FIG. 26 is a drawing for describing light guiding for an optical signal in one light-receiving unit configuring the light-receiving device 5-4.

The light-receiving device 5-4 according to the present modified example includes a relay light-guide plate 57, in addition to a plurality of light guide plates 51-4, a lens sheet 52, a plurality of directional light-guide layers 53-4, a support member 54, a plurality of optical receivers 55, and a base 58. The lens sheet 52, the support member 54, the plurality of optical receivers 55, and the base 58 are similar to corresponding components of the light-receiving device 5, and therefore detailed description therefor is omitted.

The light guide plates 51-4 are associated with a plurality of columns of lenses among a plurality of lenses configuring the lens sheet 52. The light guide plate 51-4 has a wider width than the light guide plate 51 of the light-receiving device 5. On an emission surface 513-4 of the light guide plate 51, the relay light-guide plate 57 is disposed.

The relay light-guide plate 57 is a transparent member including an incident surface 571 and a light guide surface 572 opposed to each other. On one end surface of the relay light-guide plate 57, a relay emission surface 573 is formed. The relay light-guide plate 57 is disposed in such a way that the incident surface 571 faces the emission surface 513-4 of the light guide plate 51-4.

The incident surface 571 is a light-receiving surface that receives an optical signal emitted from the emission surface 513-4 of the light guide plate 51-4. The relay emission surface 573 is an end from which an optical signal that has propagated inside the relay light-guide plate 57 is emitted. The relay light-guide plate 57 is disposed in such a way that the incident surface 571 faces the emission surface 513-4 of the light guide plate 51-4. On the light guide surface 572 of the relay light-guide plate 57, a directional light-guide unit having a function similar to the directional light-guide layer 53 is formed (a drawing is omitted). On the relay emission surface 573 of the relay light-guide plate 57, an optical receiver 55 is disposed.

An optical signal traveling from the incident surface 571 to an inside of the relay light-guide plate 57 is guided by a directional light-guide unit formed on the light guide surface 572, is totally reflected between the incident surface 571 and the light guide surface 572, and is propagated toward the relay emission surface 573. The optical signal that has propagated inside the relay light-guide plate 57 and reached the relay emission surface 573 is emitted from the relay emission surface 573 toward the light-receiving surface 551 of the optical receiver 55.

The directional light-guide unit formed on the light guide surface 572 changes a travel direction of an optical signal in such a way that light entering an inside of the relay light-guide plate 57 from the incident surface 571 is guided toward the relay emission surface 573. The directional light-guide unit includes, for example, a plurality of micromirrors that reflect, toward the optical receiver 55, a travel direction of an optical signal traveling inside the relay light-guide plate 57. The directional light-guide unit may be configured by using a plurality of projection structures having a reflection surface that reflects, toward the optical receiver 55, a travel direction of an optical signal traveling inside the relay light-guide plate 57. The directional light-guide unit may be configured by using a hologram layer similar to the relay light-guide plate 57. A polarization direction of an optical signal emitted from the emission surface 513-4 of the light guide plate 51-4 is not stored and therefore a set of beams of linearly polarized light of various polarization directions may exist. In view of this point, the directional light-guide unit is preferably configured by using a plurality of micromirrors or a plurality of projection structures.

The optical receiver 55 is disposed in such a way that the light-receiving surface 551 faces the relay emission surface 573 of the relay light-guide plate 57. Therefore, the optical receiver 55 is disposed in such a way that the light-receiving surface 551 is directed not to a vertically upper side but to a horizontal direction.

According to the light-receiving device 5-4 of the present modified example, an optical signal is received by using the light guide plate 51-4 associated with a plurality of columns of lenses, and therefore the number of optical receivers 55 can be decreased. Further, according to the light-receiving device 5-4 of the present modified example, a light-receiving area of the light guide plate 51-4 that receives an optical signal guided to one optical receiver 55 is larger than in the light-receiving device 5, and therefore light-receiving efficiency in the optical receiver 55 is improved.

Modified Example 5

Next, a light-receiving device according to a modified example 5 of the present example embodiment is described with reference to a drawing. The light-receiving device according to the present modified example has a configuration in which an optical sensor according to the fourth example embodiment is added to at least any one of light-receiving units configuring the light-receiving device 5 according to the present example embodiment.

Figure 27:
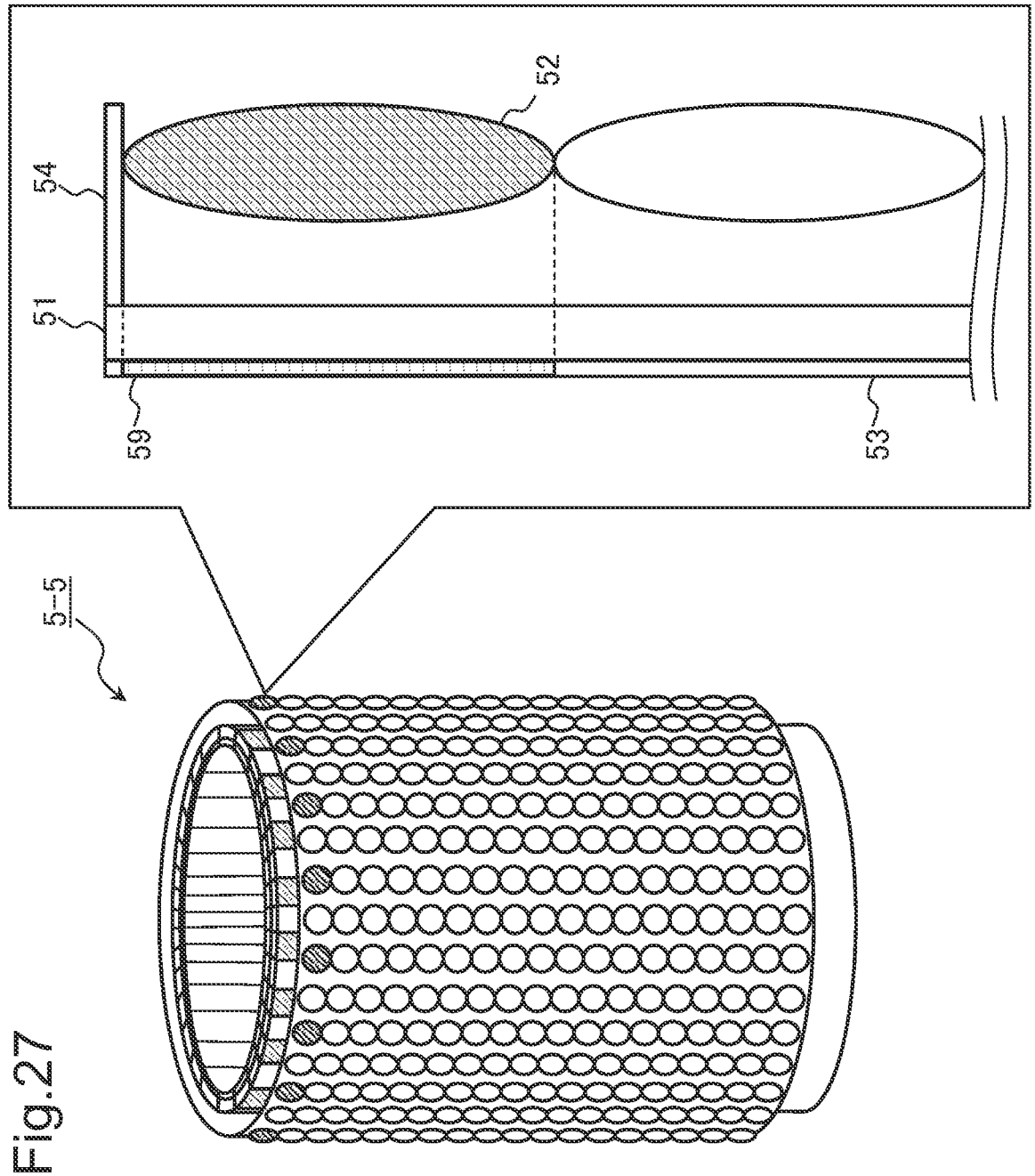
FIG. 27 is a conceptual diagram of one example of a light-receiving device of a modified example 5 according to the fifth example embodiment of the present invention.

FIG. 27 is a conceptual diagram for describing a light-receiving device 5-5 according to the present modified example. The light-receiving device 5-5 includes at least one optical sensor 59, in addition to a plurality of light guide plates 51, a lens sheet 52, a plurality of directional light-guide layers 53, a support member 54, a plurality of optical receivers 55, and a base 58. The plurality of light guide plates 51, the lens sheet 52, the plurality of directional light-guide layers 53, the support member 54, the plurality of optical receivers 55, and the base 58 are similar to corresponding components of the light-receiving device 5, and therefore detailed description therefor is omitted.

The optical sensor 59 is disposed, as one example, in association with a lens indicated by using hatching. The optical sensor 59 has a configuration similar to the optical sensor 49 according to the fourth example embodiment. The optical sensor 59 is configured in such a way as to detect a position in at least a vertical direction. The optical sensor 59 may be a two-dimensional sensor or may be a one-dimensional senor that detects a direction along a vertical direction.

The light-receiving device 5-5 according the present modified example can detect a coming direction in a vertical direction of an optical signal. In other words, the light-receiving device 5-5 according the present modified example can detect a coming direction of an optical signal in a vertical direction, in addition to a horizontal direction.

The light-receiving device 5-4 according the modified example 4 and the light-receiving device 5-5 according the modified example 5 may be configured as a combination with each other. When, for example, the optical sensor 59 of the light-receiving device 5-5 according the modified example 5 is a two-dimensional sensor, a coming direction of an optical signal in a horizontal direction can be detected by the optical sensor 59. Therefore, a configuration can be made wherein a light guide plate is cylindrically formed without being divided and a relay light-guide plate is disposed on an emission surface of the cylindrical light guide plate. In this case, the relay light-guide plate is formed into a ring-shape having an open end and is configured in such a way that an incident surface is positioned on an upper surface of the relay light-guide plate, and an optical receiver is disposed on a relay emission surface of the relay light-guide plate. When such a configuration is made, an optical signal made incident from a first surface of a cylindrical light guide plate can be received by a single optical receiver.

Applied Example

Here, an applied example of the light-receiving device 5 according to the present example embodiment is described with reference to a drawing. The following applied example is one example and does not limit applications of the light-receiving device 5 according to the present example embodiment to the example.

Figure 28:
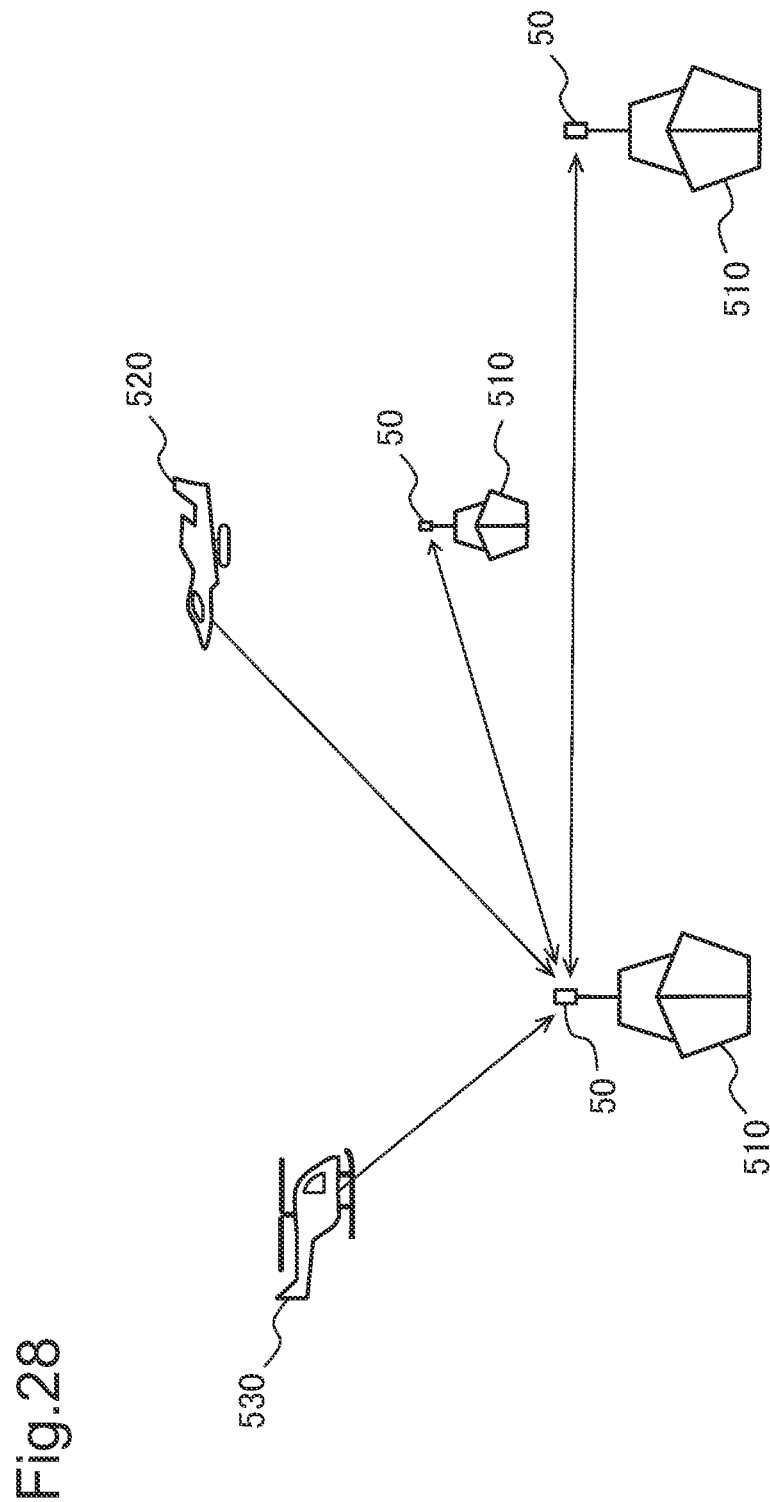
FIG. 28 is a conceptual diagram for describing an applied example of the light-receiving device according to the fifth example embodiment of the present invention.

FIG. 28 is an example in which the light-receiving device 5 according to the present example embodiment is used for communication of a vessel. FIG. 28 illustrates an example in which a light transmission/reception device 50 including a light-receiving device 5 is mounted on tips of masts of a plurality of vessels 510. FIG. 28 illustrates an example in which an optical signal is transmitted/received also to/from a flight vehicle such as an airplane 520 or a helicopter, 530 flying above. It is assumed that the light transmission/reception device 50 has a light transmission function for transmitting an optical signal received by the light-receiving device 5, and description of details of the light transmission function is omitted.

As in the applied example of FIG. 28, when the light transmission/reception device 50 is used, optical space communication between vessels in which a coming direction of an optical signal is close to a horizontal direction can be achieved. Further, when the light transmission/reception device 50 is used, optical space communication between a flight vehicle and the vessel 510 in which coming directions of optical signals are different with respect to a vertical direction can be achieved. In other words, when the light transmission/reception device 50 is used, signal light made incident from a direction of 360 degrees substantially parallel to the ocean surface and signal light coming from above can be received without a mechanical mechanism.

Figure 29:
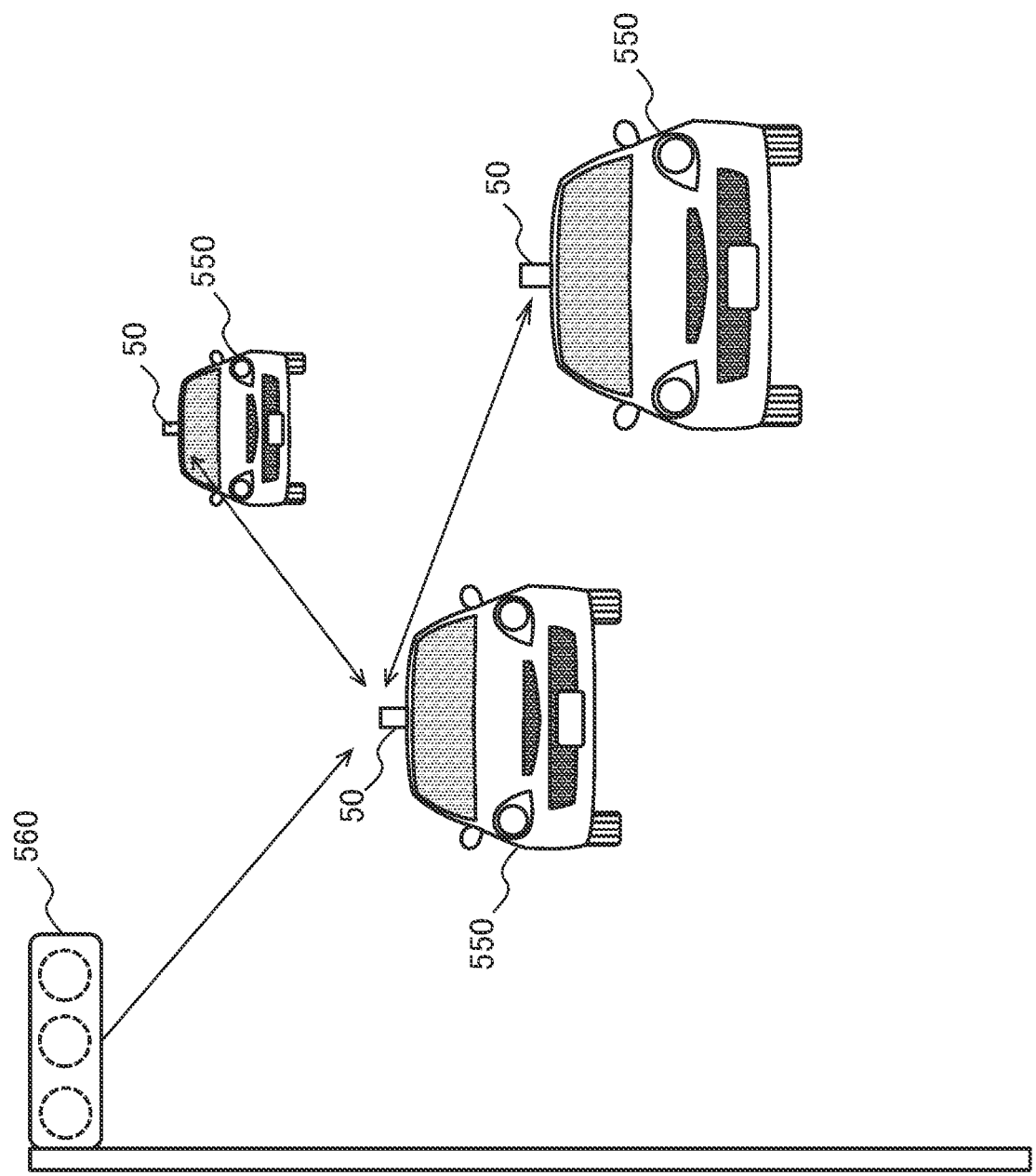
FIG. 29 is a conceptual diagram for describing another applied example of the light-receiving device according to the fifth example embodiment of the present invention.

FIG. 29 is an example in which the light-receiving device 5 according to the present example embodiment is used for vehicle-to-vehicle communication. FIG. 29 illustrates an example in which on a ceiling of one of a plurality of vehicles 550, a light transmission/reception device 50 including the light-receiving device 5 is mounted. FIG. 29 illustrates an example in which an optical signal is transmitted/received also to/from a signal 560 located above the vehicle 550.

As in the applied example of FIG. 29, when the light transmission/reception device 50 is used, optical space communication between vehicles in which a coming direction of an optical signal is close to a horizontal direction can be achieved. Further, when the light transmission/reception device 50 is used, optical space communication between the signal 560 and the vehicle 550 in which coming directions of optical signals are different with respect to a vertical direction can be achieved. In other words, when the light transmission/reception device 50 is used, signal light made incident from every direction substantially parallel to a road surface and signal light coming from every direction from above can be received without a mechanical mechanism.

As described above, in the light-receiving device according to the present example embodiment, a plurality of light guide plates having a shape extended in a uniaxial direction have a structure of being cylindrically arranged in which a first surface is directed outward and an emission surface is directed downward.

According to one aspect of the present example embodiment, a light-receiving device further includes a relay light-guide plate that is a transparent member having an incident surface and a light guide surface as principal surfaces opposed to each other and in which a relay emission surface is formed on at least one end. The relay light-guide plate is disposed in such a way that an incident surface faces an emission surface of a light guide plate, receives an optical signal emitted from the emission surface of the light guide plate on the incident surface, totally reflects the received optical signal between a light guide surface and the incident surface, and guides the reflected optical signal toward a relay emission surface. An optical receiver receives an optical signal emitted from the relay emission surface of the relay light-guide plate and converts the received optical signal into an electric signal.

According to the light-receiving device of the present example embodiment, an optical signal coming from every direction which is substantially horizontal can be received without a mechanical mechanism. Further, according to a light-receiving device of one aspect of the present example embodiment, a coming direction of an optical signal from above can be estimated without a mechanical mechanism. In other words, according to the light-receiving device of the present example embodiment, signal light made incident from every direction substantially parallel to an installation surface and signal light coming from every direction from above can be received without a mechanical mechanism.

Sixth Example Embodiment

Next, a light-receiving device according to a sixth example embodiment of the present invention is described with reference to drawings. The light-receiving device according to the present example embodiment is different from the first example embodiment in that the device has a cylindrical appearance.

Figure 30:
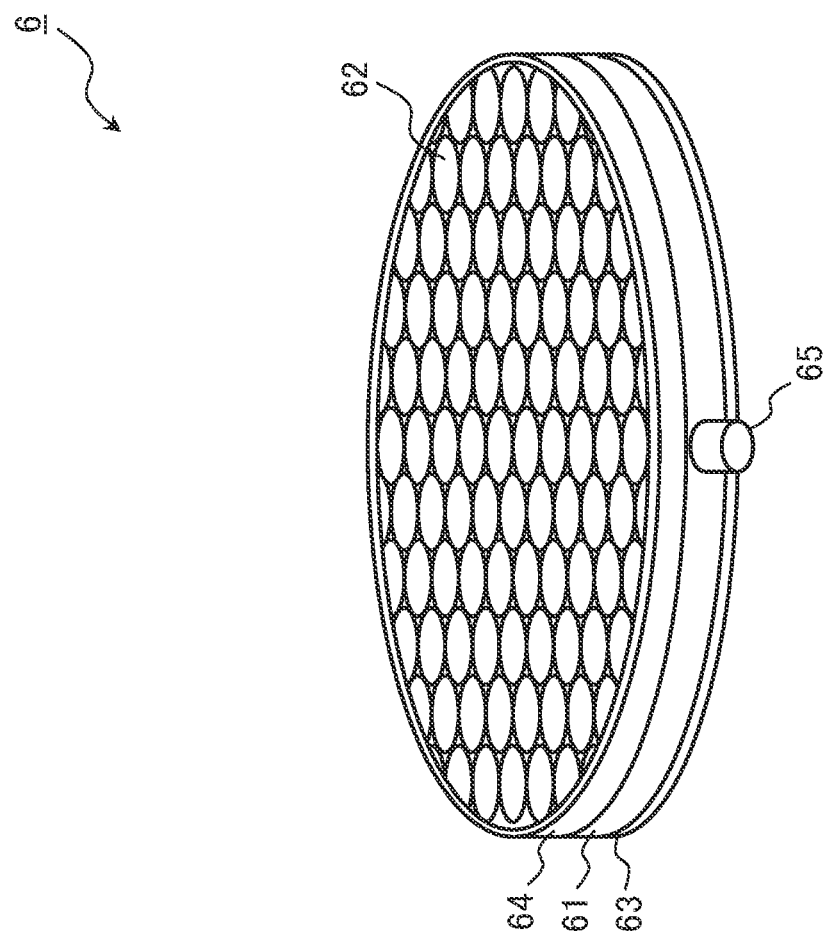
FIG. 30 is a perspective view of one example of a light-receiving device according to a sixth example embodiment of the present invention.
Figure 31:
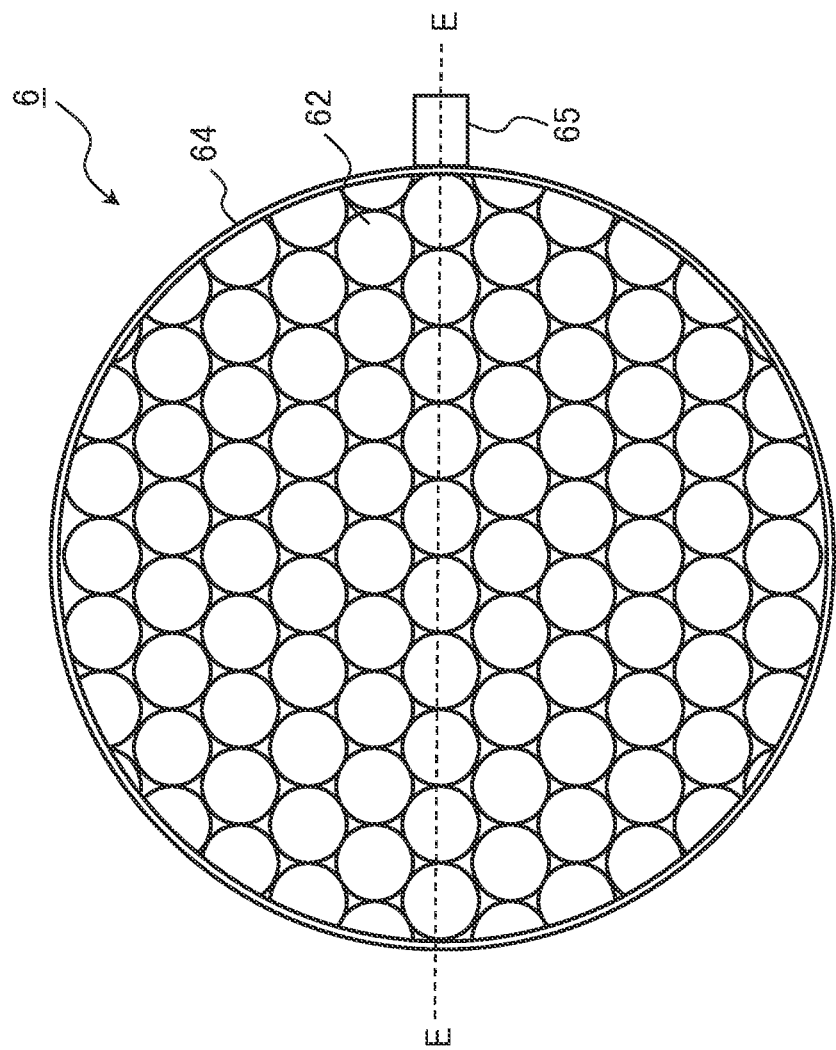
FIG. 31 is a top view of one example of the light-receiving device according to the sixth example embodiment of the present invention.
Figure 32:
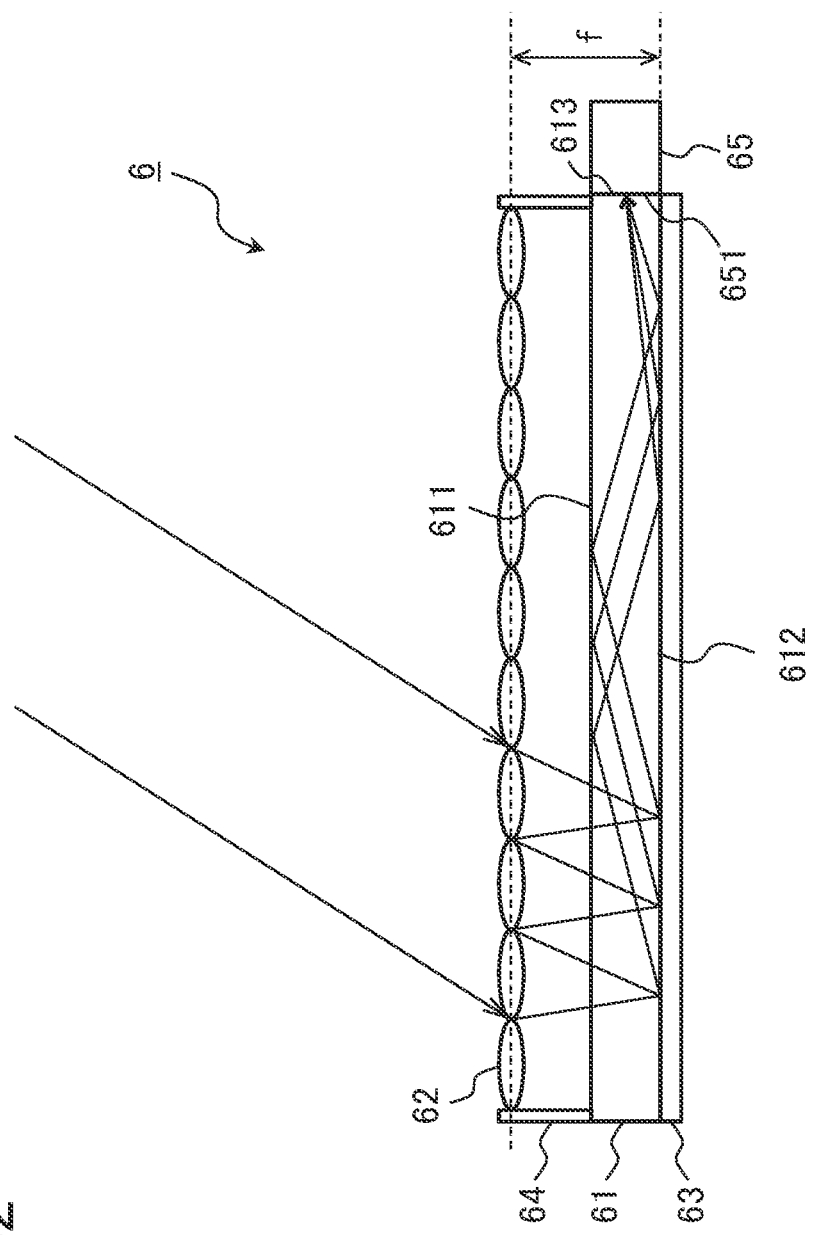
FIG. 32 is a cross-sectional diagram of one example of the light-receiving device according to the sixth example embodiment of the present invention.

FIGS. 30 to 32 each are a conceptual diagram for describing one example of a configuration of a light-receiving device 6 according to the present example embodiment. FIG. 30 is a perspective view of the light-receiving device 6. FIG. 31 is a top view of the light-receiving device 6. FIG. 32 is a cross-sectional diagram of the light-receiving device 6. FIG. 32 illustrates an arrow conceptually indicating light entering the light-receiving device 6 and travel of light inside the light-receiving device 6.

The light-receiving device 6 includes a light guide plate 61, a lens sheet 62, a directional light-guide layer 63, a support member 64, and an optical receiver 65. The configuration of each of the light guide plate 61, the lens sheet 62, the directional light-guide layer 63, the support member 64, and the optical receiver 65 corresponds to each of the light guide plate 11, the lens sheet 12, the directional light-guide layer 13, the support member 14, and the optical receiver 15 of the light-receiving device 1. In the following, description of a feature similar to the light-receiving device 1 is omitted.

The light guide plate 61 is a circular plate-like transparent member having a first surface 611 and a second surface 612 as principal surfaces opposed to each other. A material and characteristics of the light guide plate 61 are similar to the light guide plate 11 of the light-receiving device 1. The light guide plate 61 has a circular plate-like outer shape, and on one end of the plate, an emission surface 613 is formed. The first surface 611 is an incident surface which an optical signal refracted by the lens sheet 62 enters. The emission surface 613 is an end from which an optical signal that has propagated inside the light guide plate 61 is emitted. While FIGS. 30 to 32 each illustrate a light guide plate 61 having a circular plate-like outer shape, an optical signal emitted from the emission surface 613 at a position where the optical receiver 65 is not installed is not received by the optical receiver 65.

On an upper side of the first surface 611 of the light guide plate 61, the lens sheet 62 supported by the support member 64 is disposed. On the second surface 612 of the light guide plate 61, the directional light-guide layer 63 is disposed. On the emission surface 613 of the light guide plate 61, the optical receiver 65 is disposed.

Similarly to the example in FIG. 5, a travel direction of an optical signal that is refracted by the lens sheet 62 and enters an inside of the light guide plate 61 from the first surface 611 is changed toward the emission surface 613 by the directional light-guide layer 63 disposed on the second surface 612. The optical signal the travel direction of which has been changed by the directional light-guide layer 63 propagates inside the light guide plate 61 toward the emission surface 613. FIG. 32 illustrates, by using an arrow, an optical signal entering an inside of the light guide plate 61 from the first surface 611 propagate inside the light guide plate 61 toward the optical receiver 65. When the light guide plate 61 has a circular-plate shape as in FIGS. 30 to 32, an optical signal may not always be guided to the optical receiver 65, depending on an incident position of the optical signal.

The lens sheet 62 is supported by the support member 64 on an upper side of a first surface of the light guide plate 61. A material and characteristics of the lens sheet 62 are similar to the lens sheet 12 of the light-receiving device 1. The lens sheet 62 has a structure in which a plurality of lenses are arranged on one circular-plate-shaped sheet. A plurality of lenses configuring the lens sheet 62 are focused on different focal positions of the directional light-guide layer 63 disposed on the second surface 612 of the light guide plate 61.

The directional light-guide layer 63 is disposed on the second surface 612 of the light guide plate 61. A material and characteristics of the directional light-guide layer 63 are similar to the directional light-guide layer 13 of the light-receiving device 1. The directional light-guide layer 63 guides an optical signal in such a way that light entering an inside of the light guide plate 61 from the first surface 611 of the light guide plate 61 travels toward the emission surface 613.

The support member 64 is a circular frame that supports the lens sheet 62 in such a way as to be positioned on an upper side of the first surface 611 of the light guide plate 61. The support member 64 supports the lens sheet 62 in such a way that a distance between the lens sheet 62 and the second surface 612 of the light guide plate 61 is equal to a focal distance f of the lens sheet 62. A material and a shape of the support member 64 are not specifically limited.

The optical receiver 65 is disposed in such a way that a light-receiving surface 651 faces the emission surface 613 of the light guide plate 61. The optical receiver 65 has a configuration similar to the optical receiver 15 of the light-receiving device 1. The optical receiver 65 receives an optical signal emitted from the emission surface 613 of the light guide plate 61. The optical receiver 65 converts the received optical signal into an electric signal. The optical receiver 65 outputs the electric signal after the conversion to a decoder (not illustrated).

As described above, a configuration of the light-receiving device 6 according to the present example embodiment has been described. The configuration illustrated each in FIGS. 30 to 32 is one example and does not limit the configuration of the light-receiving device 6 according to the present modified example to a form as is.

Modified Example 6

Next, a light-receiving device of a modified example 6 according to the present example embodiment is described with reference to drawings. The light-receiving device according to the present modified example guides an optical signal entering a light guide plate toward a circumferential direction of the light-receiving device and guides the optical signal toward an optical receiver by using a relay light-guide plate disposed in a periphery of the light-receiving device.

Figure 33:
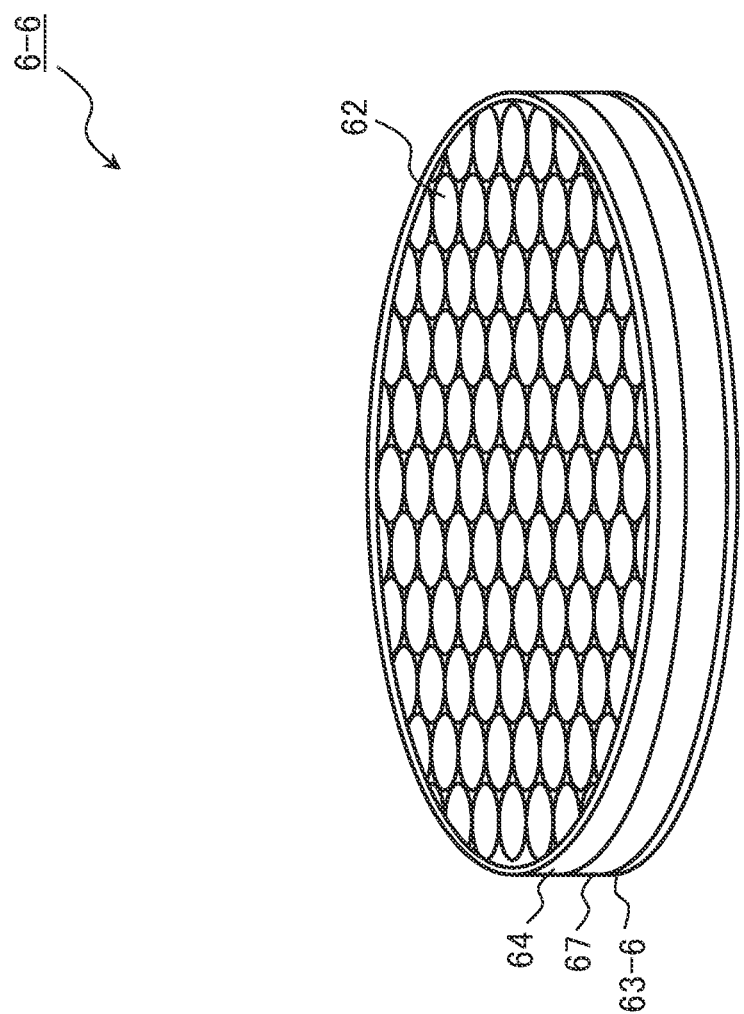
FIG. 33 is a perspective view of one example of a light-receiving device of a modified example 6 according to the sixth example embodiment of the present invention.
Figure 34:
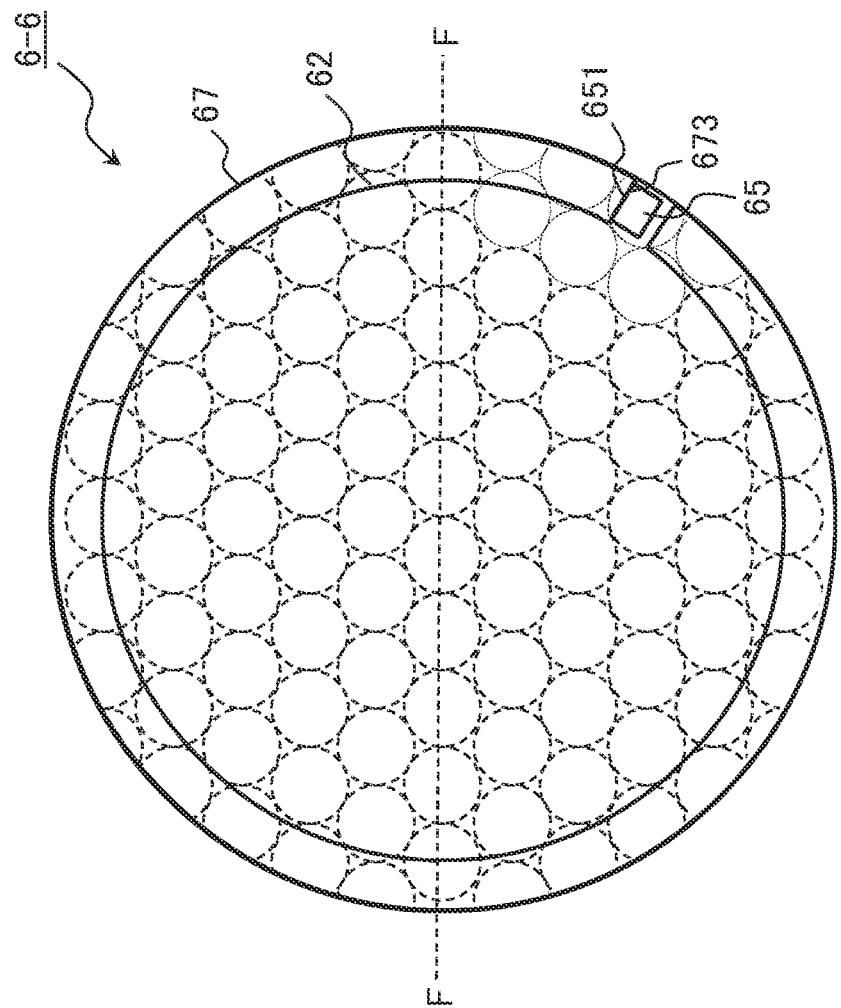
FIG. 34 is a top view of one example of the light-receiving device of the modified example 6 according to the sixth example embodiment of the present invention.
Figure 35:
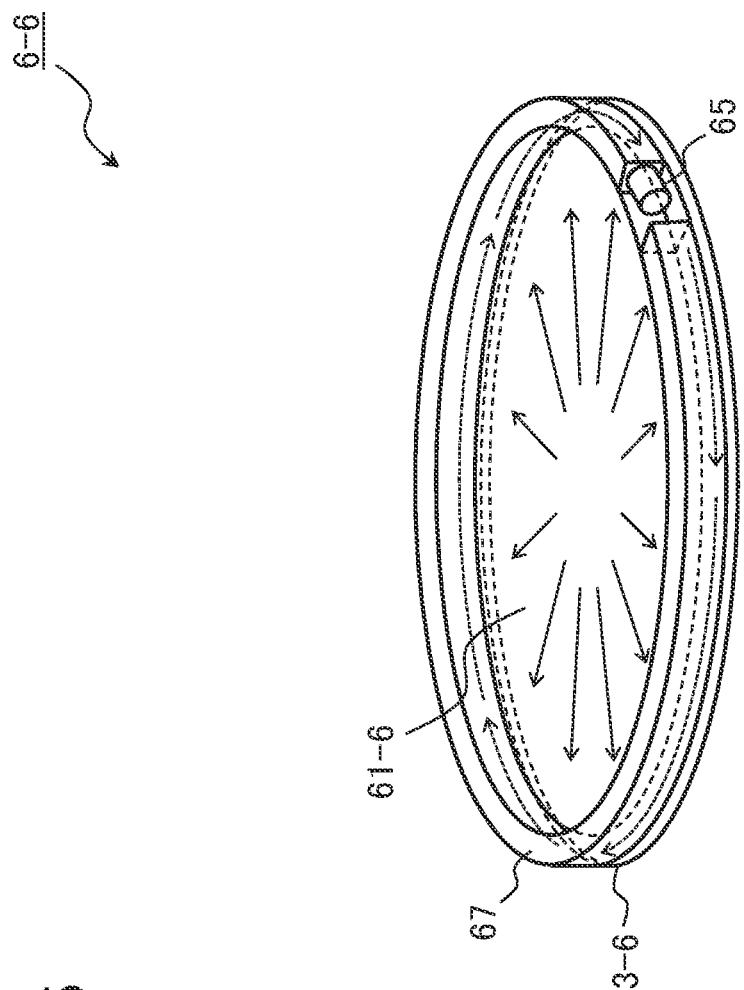
FIG. 35 is a conceptual diagram for describing a light guide portion of one example of the light-receiving device of the modified example 6 according to the sixth example embodiment of the present invention.
Figure 36:
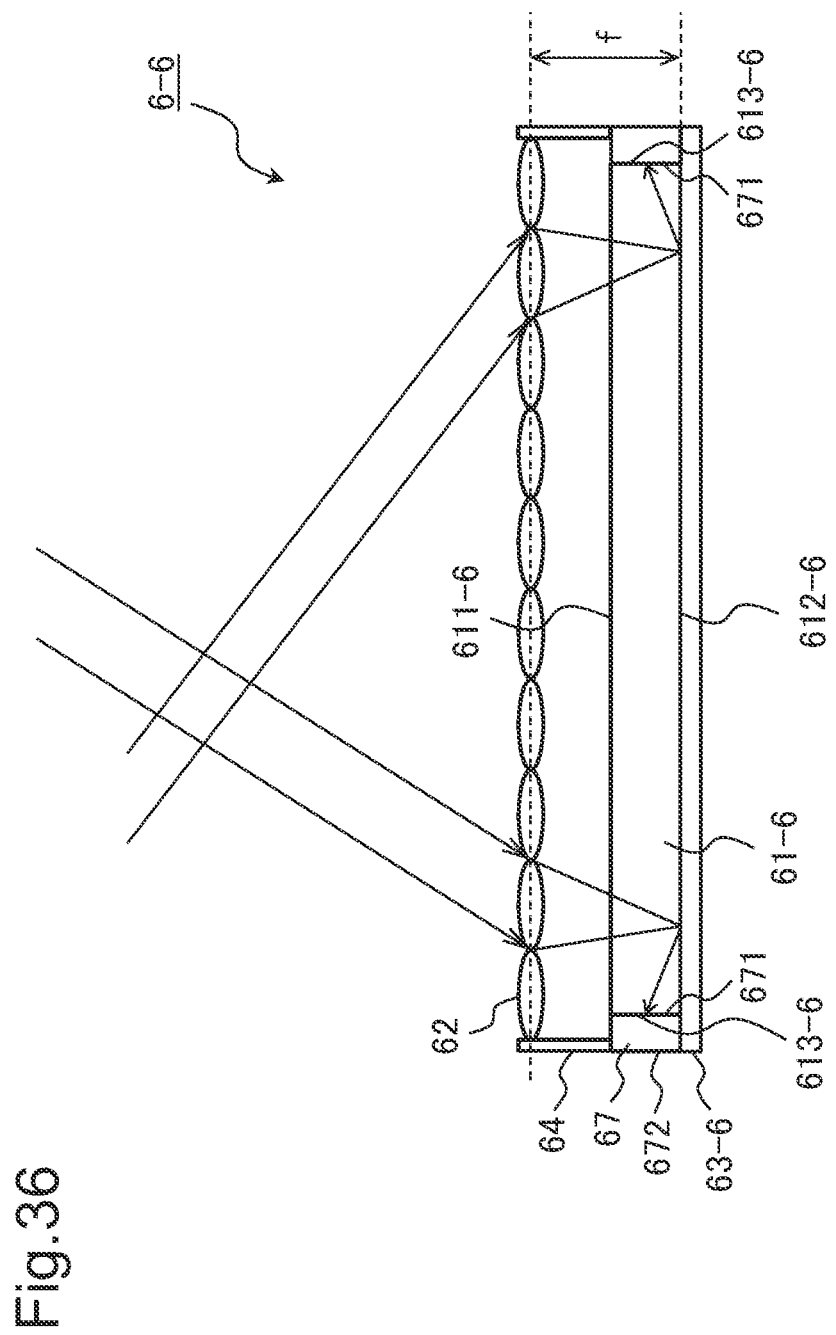
FIG. 36 is a cross-sectional diagram of one example of the light-receiving device of the modified example 6 according to the sixth example embodiment of the present invention.

FIGS. 33 to 36 each are a conceptual diagram for describing a light-receiving device 6-6 according to the present modified example. FIG. 33 is a perspective view of the light-receiving device 6-6. FIG. 34 is a top view in which the light-receiving device 6-6 is seen through. FIG. 35 is a conceptual diagram for describing travel of an optical signal inside the light-receiving device 6-6. FIG. 36 is a cross-sectional diagram in which the light-receiving device 6-6 is cut along an F-F line in FIG. 34. FIGS. 35 and 36 each illustrate an arrow conceptually indicating light entering the light-receiving device 6-6 and travel of light inside the light-receiving device 6-6.

The light-receiving device 6-6 includes a light guide plate 61-6, a lens sheet 62, a directional light-guide layer 63-6, a support member 64, an optical receiver 65, and a relay light-guide plate 67. The configuration of each of the light guide plate 61-6, the lens sheet 62, the directional light-guide layer 63-6, the support member 64, and the optical receiver 65 corresponds to each of the light guide plate 61, the lens sheet 62, the directional light-guide layer 63, the support member 64, and the optical receiver 65 of the light-receiving device 6. In the following, description of a feature similar to the light-receiving device 6 is omitted.

The light guide plate 61-6 is a circular plate-like transparent member having a first surface 611-6 and a second surface 612-6 as principal surfaces opposed to each other. A material and characteristics of the light guide plate 61 are similar to the light guide plate 61 of the light-receiving device 6. The light guide plate 61 has a circular plate-like outer shape, and on the entire surface of a peripheral end of the plate, an emission surface 613-6 is formed. The first surface 611-6 is an incident surface which an optical signal refracted by the lens sheet 62 enters. The emission surface 613-6 is an end surface from which an optical signal that has propagated inside the light guide plate 61-6 is emitted.

On an upper side of the first surface 611-6 of the light guide plate 61-6, the lens sheet 62 supported by the support member 64 is disposed. On the second surface 612-6 of the light guide plate 61-6, the directional light-guide layer 63-6 is disposed. On the emission surface 613-6 in a periphery of the light guide plate 61-6, a ring-shaped relay light-guide plate 67 having an open end is disposed in such a way as to surround a circumference of the light guide plate 61-6.

A travel direction of an optical signal that is refracted by the lens sheet 62 and enters an inside of the light guide plate 61-6 from the first surface 611-6 is changed toward the emission surface 613-6 of a circumference of the light guide plate 61-6 by the directional light-guide layer 63-6 disposed on the second surface 612-6. The optical signal the travel direction of which has been changed by the directional light-guide layer 63-6 propagates inside the light guide plate 61-6 toward the emission surface 613-6. FIG. 36 illustrates, by using an arrow, an optical signal entering an inside of the light guide plate 61-6 from the first surface 611-6 propagate inside the light guide plate 61-6 toward the emission surface 613-6.

The lens sheet 62 is supported by the support member 64 on an upper side of a first surface of the light guide plate 61-6. A material and characteristics of the lens sheet 62 are similar to the lens sheet 62 of the light-receiving device 6. The lens sheet 62 has a structure in which a plurality of lenses are arranged on one circular plate-like sheet. A plurality of lenses configuring the lens sheet 62 are focused on different focal positions of the directional light-guide layer 63-6 disposed on the second surface 612-6 of the light guide plate 61-6.

The directional light-guide layer 63-6 is disposed on the second surface 612-6 of the light guide plate 61-6. A material and characteristics of the directional light-guide layer 63-6 are similar to the directional light-guide layer 63 of the light-receiving device 6. The directional light-guide layer 63-6 guides an optical signal in such a way that light entering an inside of the light guide plate 61-6 from the first surface 611-6 travels toward the emission surface 613-6.

The support member 64 is a circular frame that supports the lens sheet 62 in such a way as to be positioned on an upper side of the first surface 611-6 of the light guide plate 61-6. The support member 64 supports the lens sheet 62 in such a way that a distance between a principal surface of the lens sheet 62 and the second surface 612-6 of the light guide plate 61-6 is equal to a focal distance f of the lens sheet 62. A material and a shape of the support member 64 are not specifically limited.

The relay light-guide plate 67 is a ring-shaped transparent member having an open end. A side surface (incident surface 671) on the inside of the relay light-guide plate 67 and a side surface (light guide surface 672) on the outside of the plate are opposed to each other. On one of two open ends of the relay light-guide plate 67, a relay emission surface 673 is formed. The relay light-guide plate 67 is disposed in such a way that the incident surface 671 faces the emission surface 613-6 of the light guide plate 61-6.

The incident surface 671 is a light-receiving surface that receives an optical signal emitted from the emission surface 613-6 of the light guide plate 61-6. The relay emission surface 673 is one end surface from which an optical signal that has propagated inside the relay light-guide plate 67 is emitted. The relay light-guide plate 67 is disposed in such a way that the incident surface 671 faces the emission surface 613-6 of the light guide plate 61-6. On the light guide surface 672 of the relay light-guide plate 67, a directional light-guide unit including a function similar to the directional light-guide layer 63 is formed (drawing omitted). On the relay emission surface 673 of the relay light-guide plate 67, the optical receiver 65 is disposed.

An optical signal traveling from the incident surface 671 to an inside of the relay light-guide plate 67 is guided by the directional light-guide unit formed on the light guide surface 672, is totally reflected between the incident surface 671 and the light guide surface 672, and is propagated toward the relay emission surface 673. The optical signal that has propagated inside the relay light-guide plate 67 and reached the relay emission surface 673 is emitted from the relay emission surface 673 toward a light-receiving surface 651 of the optical receiver 65.

The directional light-guide unit (not illustrated) formed on the light guide surface 672 changes a travel direction of an optical signal in such a way that light entering an inside of the relay light-guide plate 67 from the incident surface 671 is guided toward the relay emission surface 673. The directional light-guide unit includes, for example, a plurality of micromirrors that reflect, toward the optical receiver 65, a travel direction of an optical signal traveling inside the relay light-guide plate 67. The directional light-guide unit may be configured by using a plurality of projection structures having a reflection surface that reflects, toward the optical receiver 65, a travel direction of an optical signal traveling inside the relay light-guide plate 67. The directional light-guide unit may be configured by using a hologram layer. A polarization direction of an optical signal emitted from the emission surface 613-6 of the light guide plate 61-6 is not stored and therefore a set of beams of linearly polarized light of various polarization directions may exist. In view of this point, the directional light-guide unit is preferably configured by using a plurality of micromirrors or a plurality of projection structures.

The optical receiver 65 is disposed in such a way that the light-receiving surface 651 faces the relay emission surface 673 of the relay light-guide plate 67. The optical receiver 65 has a configuration similar to the optical receiver 15 of the light-receiving device 1. The optical receiver 65 receives an optical signal emitted from the relay emission surface 673 of the relay light-guide plate 67. The optical receiver 65 converts the received optical signal into an electric signal. The optical receiver 65 outputs the electric signal after the conversion to a decoder (not illustrated).

As described above, a configuration of the light-receiving device 6-6 according to the present modified example has been described. The configuration illustrated each in FIGS. 33 to 36 is one example and does not limit the configuration of the light-receiving device 6-6 according to the present modified example to a form as is.

Modified Example 7

Next, a light-receiving device of a modified example 7 according to the present example embodiment is described with reference to drawings. The light-receiving device according to the present modified example guides an optical signal entering a light guide plate toward a central direction of the light-receiving device and collects the optical signal toward an optical receiver disposed in the center of the light-receiving device.

Figure 37:
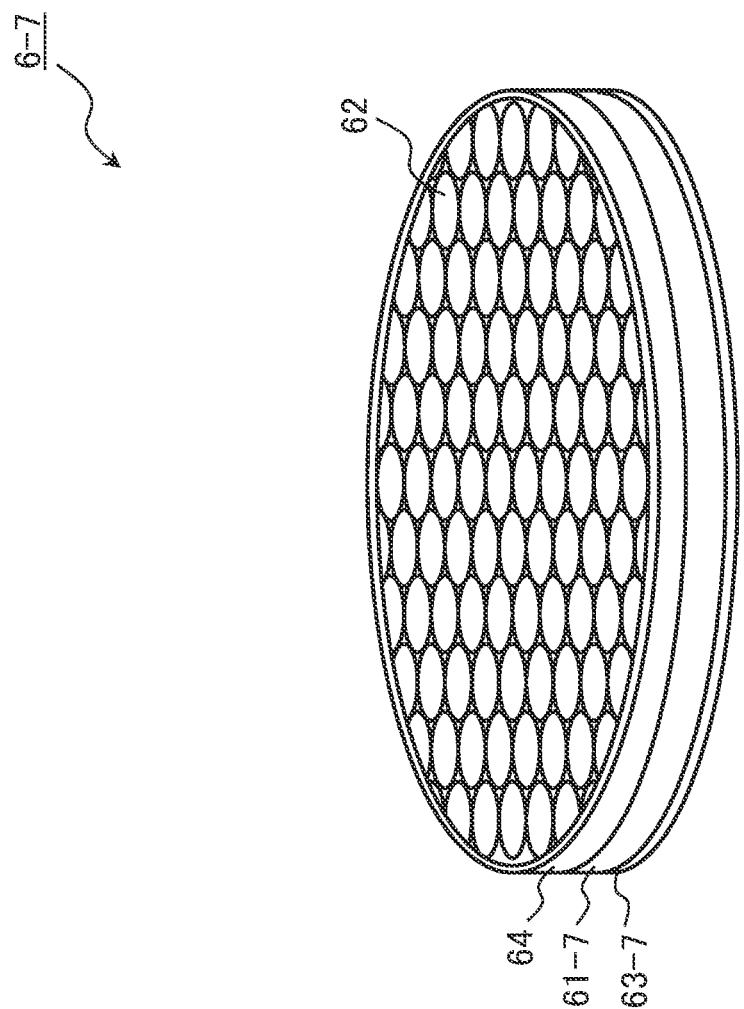
FIG. 37 is a perspective view of one example of a light-receiving device of a modified example 7 according to the sixth example embodiment of the present invention.
Figure 38:
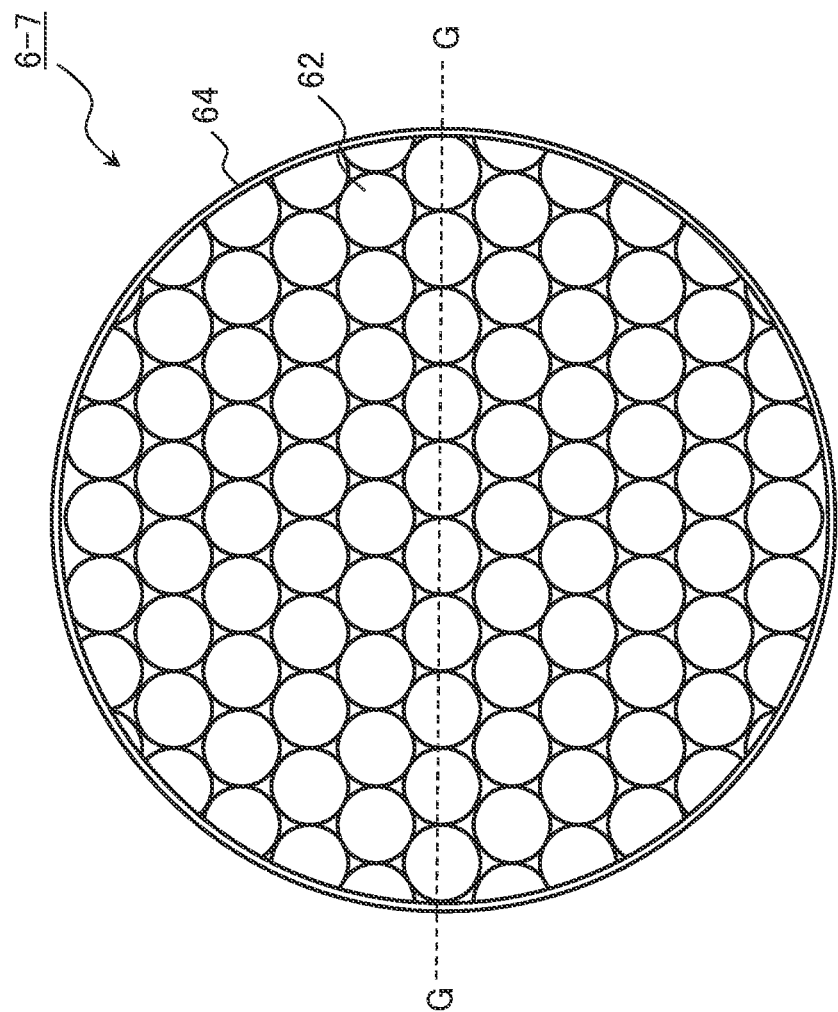
FIG. 38 is a top view of one example of the light-receiving device of the modified example 7 according to the sixth example embodiment of the present invention.
Figure 39:
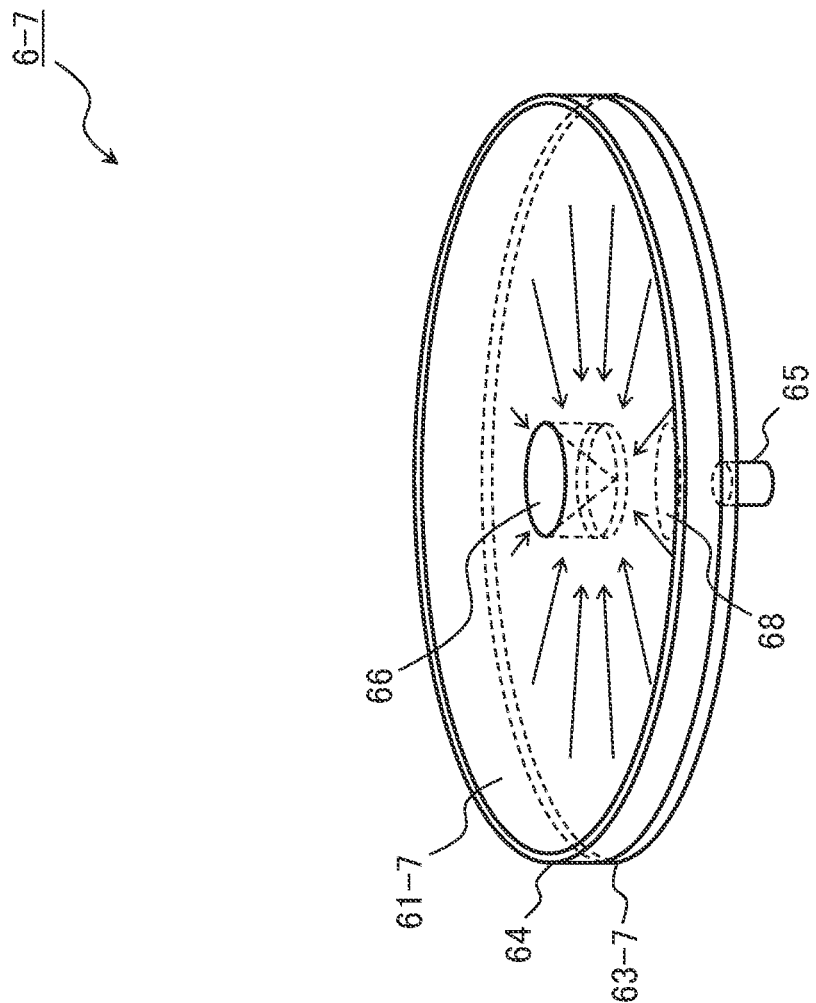
FIG. 39 is a conceptual diagram for describing a light guide portion of one example of the light-receiving device of the modified example 7 according to the sixth example embodiment of the present invention.
Figure 40:
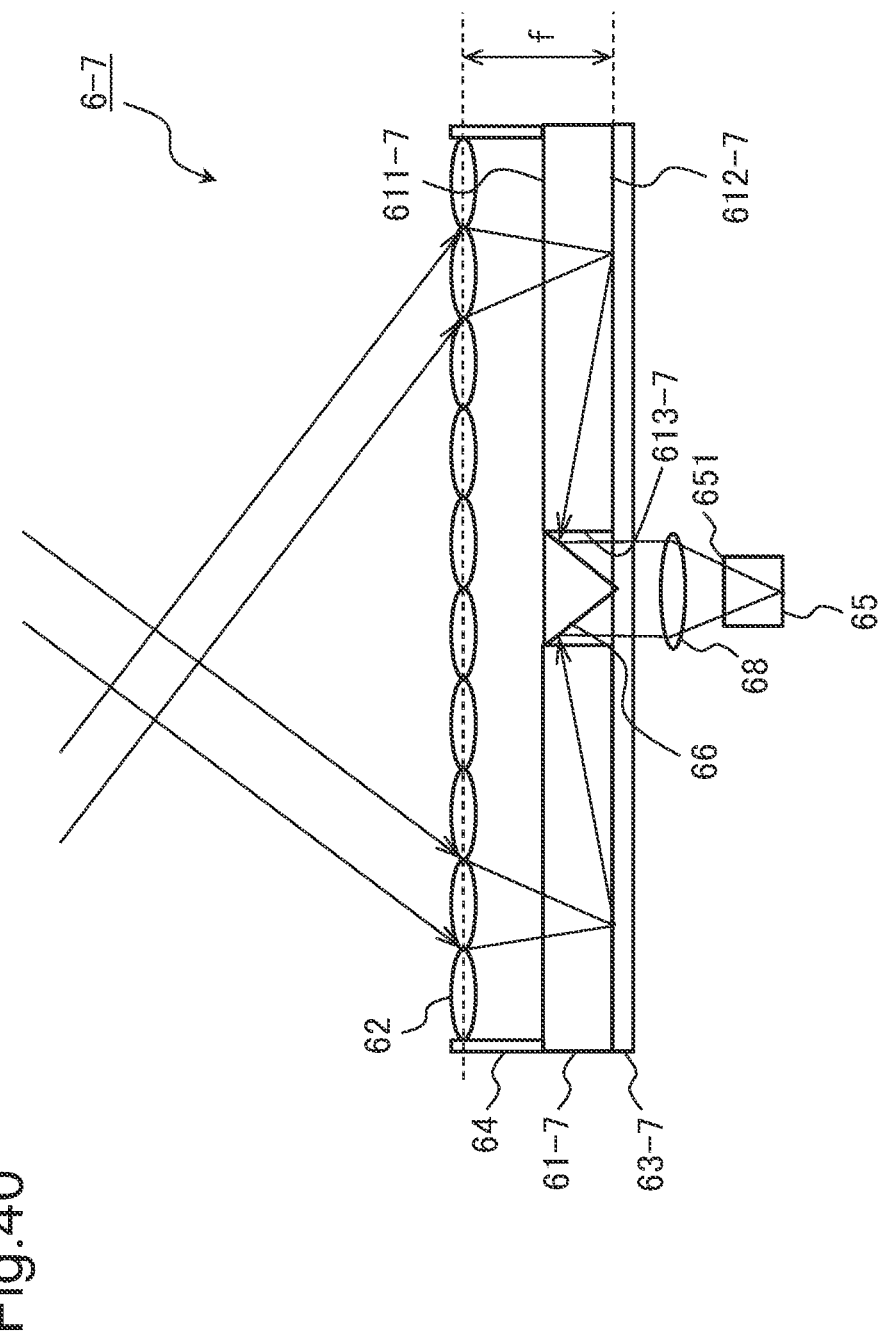
FIG. 40 is a cross-sectional diagram of one example of the light-receiving device of the modified example 7 according to the sixth example embodiment of the present invention.

FIGS. 37 to 40 each are a conceptual diagram for describing a light-receiving device 6-7 according to the present modified example. FIG. 37 is a perspective view of the light-receiving device 6-7. FIG. 38 is a top view of the light-receiving device 6-7. FIG. 39 is a conceptual diagram for describing travel of an optical signal inside the light-receiving device 6-7. FIG. 40 is a cross-sectional diagram in which the light-receiving device 6-7 is cut along a G-G line in FIG. 39. FIGS. 39 and 40 each illustrate an arrow conceptually indicating light entering the light-receiving device 6-7 and travel of light inside the light-receiving device 6-7.

The light-receiving device 6-7 includes a light guide plate 61-7, a lens sheet 62, a directional light-guide layer 63-7, a support member 64, an optical receiver 65, a reflection mirror 66, and a light-receiving lens 68. The configuration of each of the light guide plate 61-7, the lens sheet 62, the directional light-guide layer 63-7, the support member 64, and the optical receiver 65 corresponds to each of the light guide plate 61, the lens sheet 62, the directional light-guide layer 63, the support member 64, and the optical receiver 65 of the light-receiving device 6. In the following, description of a feature similar to the light-receiving device 6 is omitted.

The light guide plate 61-7 is a circular plate-like transparent member having a first surface 611-7 and a second surface 612-7 as principal surfaces opposed to each other. A material and characteristics of the light guide plate 61-7 are similar to the light guide plate 61 of the light-receiving device 6. In a central portion of the light guide plate 61-7, an opening is formed in a circular shape when viewed from a top surface. On a side surface inside the opening formed in the central portion of the light guide plate 61-7, an emission surface 613-7 is formed. The first surface 611-7 is an incident surface which an optical signal refracted by the lens sheet 62 enters. The emission surface 613-7 is an end surface from which an optical signal that has propagated inside the light guide plate 61-7 is emitted.

On an upper side of the first surface 611-7 of the light guide plate 61-7, the lens sheet 62 supported by the support member 64 is disposed. On the second surface 612-7 of the light guide plate 61-7, the directional light-guide layer 63-7 is disposed. Inside the opening in the center of the light guide plate 61-7, a conic reflection mirror 66 is disposed in such a way that the tip of the mirror is directed downward.

A travel direction of an optical signal that is refracted by the lens sheet 62 and enters an inside of the light guide plate 61-7 from the first surface 611-7 is changed toward the emission surface 613-7 of the light guide plate 61-7 by the directional light-guide layer 63-7 disposed on the second surface 612-7. The optical signal the travel direction of which has been changed by the directional light-guide layer 63-7 propagates inside the light guide plate 61-7 toward the emission surface 613-7. FIG. 40 illustrates, by using an arrow, an optical signal entering an inside of the light guide plate 61-7 from the first surface 611-7 propagate inside the light guide plate 61-7 toward the emission surface 613-7.

The lens sheet 62 is supported by the support member 64 on an upper side of the first surface 611-7 of the light guide plate 61-7. A material and characteristics of the lens sheet 62 are similar to the lens sheet 62 of the light-receiving device 6. The lens sheet 62 has a structure in which a plurality of lenses are arranged on one circular plate-like sheet. A plurality of lenses configuring the lens sheet 62 are focused on different focal positions of the directional light-guide layer 63-7 disposed on the second surface 612-7 of the light guide plate 61-7.

The directional light-guide layer 63-7 is disposed on the second surface 612-7 of the light guide plate 61-7. A material and characteristics of the directional light-guide layer 63-7 are similar to the directional light-guide layer 63 of the light-receiving device 6. The directional light-guide layer 63-7 guides an optical signal in such a way that light entering an inside of the light guide plate 61-7 from the first surface 611-7 travels toward the emission surface 613-7.

The support member 64 is a circular frame that supports the lens sheet 62 in such a way as to be positioned on an upper side of the first surface 611-7 of the light guide plate 61-7. The support member 64 supports the lens sheet 62 in such a way that a distance between a principal surface of the lens sheet 62 and the light guide plate 61-7 is equal to a focal distance f of the lens sheet 62. A material and a shape of the support member 64 are not specifically limited.

The reflection mirror 66 is disposed inside the opening in the center of the light guide plate 61-7. The reflection mirror 66 is conic and a reflection surface is formed on a side surface of the mirror. The reflection mirror 66 is disposed inside the opening in the center of the light guide plate 61-7 in such a way that the reflection surface faces the emission surface 613-7 of the light guide plate 61-7 in a state where the tip of the mirror is directed downward. The reflection mirror 66 reflects, toward the light-receiving lens 68, an optical signal emitted from the emission surface 613-7 of the light guide plate 61-7, by using the reflection surface. The optical signal reflected by the reflection surface of the reflection mirror 66 enters the light-receiving lens 68. A material and a structure of the reflection mirror 66 is not limited as long as an optical signal emitted from the emission surface 613-7 of the light guide plate 61-7 is reflected by the reflection surface toward the light-receiving lens 68. A shape of the reflection mirror 66 is not limited to a cone and may be a polygonal pyramid such as a triangular pyramid or a square pyramid, or the tip of the mirror may not necessarily be pointed as long as an optical signal emitted from the emission surface 613-7 of the light guide plate 61-7 is reflected toward the light-receiving lens 68.

The light-receiving lens 68 is disposed on a lower side of the reflection mirror 66. The light-receiving lens 68 collects, toward the light-receiving surface 651 of the optical receiver 65, an optical signal reflected by the reflection surface of the reflection mirror 66. A material and a structure of the light-receiving lens 68 is not limited as long as an optical signal reflected by the reflection surface of the reflection mirror 66 is collected toward the light-receiving surface 651 of the optical receiver 65.

The optical receiver 65 is disposed on a lower side of the light-receiving lens 68. The optical receiver 65 has a configuration similar to the optical receiver 15 of the light-receiving device 1. The optical receiver 65 receives an optical signal collected by the light-receiving lens 68. The optical receiver 65 converts the received optical signal into an electric signal. The optical receiver 65 outputs the electric signal after the conversion to a decoder (not illustrated).

As described above, a configuration of the light-receiving device 6-7 according to the present modified example has been described. The configuration illustrated each in FIGS. 37 to 40 is one example and does not limit the configuration of the light-receiving device 6-7 according to the present modified example to a form as is.

The light-receiving device 6-8 according to the present modified example can detect, when the lens sheet 62 is disposed by being directed upward, signal light coming from every direction from above by using a single optical receiver 65.

Modified Example 8

Next, a light-receiving device of a modified example 8 according to the present example embodiment is described with reference to drawings. The light-receiving device according to the present modified example has a configuration in which the optical sensor according to the fourth example embodiment is added to a light-receiving device according to the modified example.

Figure 41:
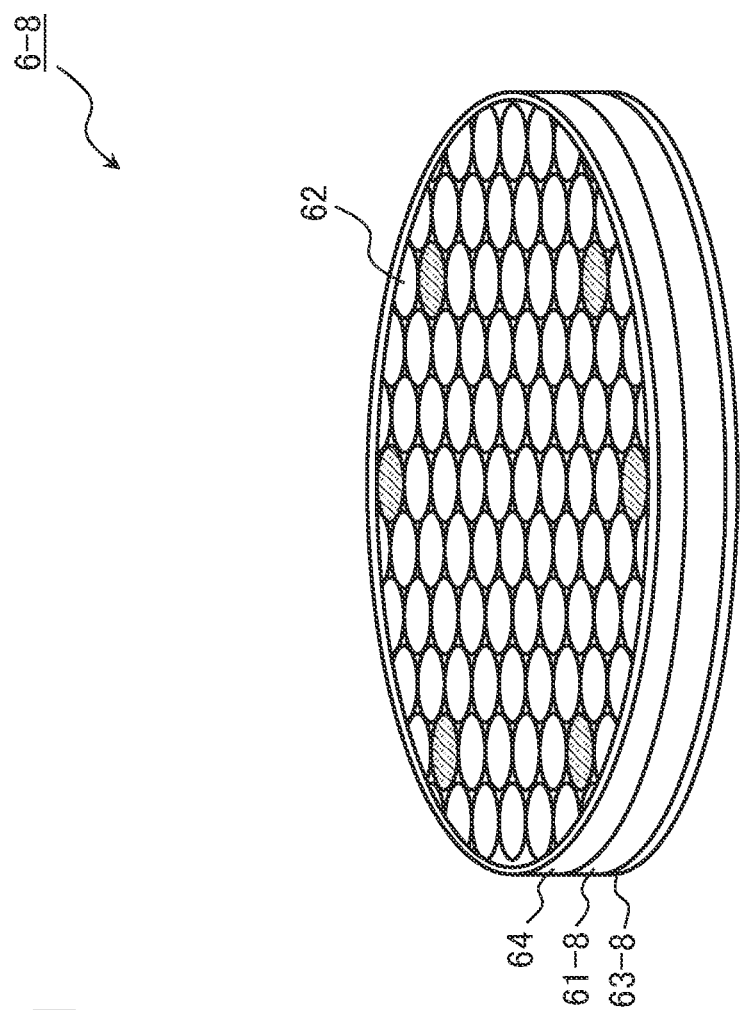
FIG. 41 is a perspective view of one example of a light-receiving device of a modified example 8 according to the sixth example embodiment of the present invention.
Figure 42:
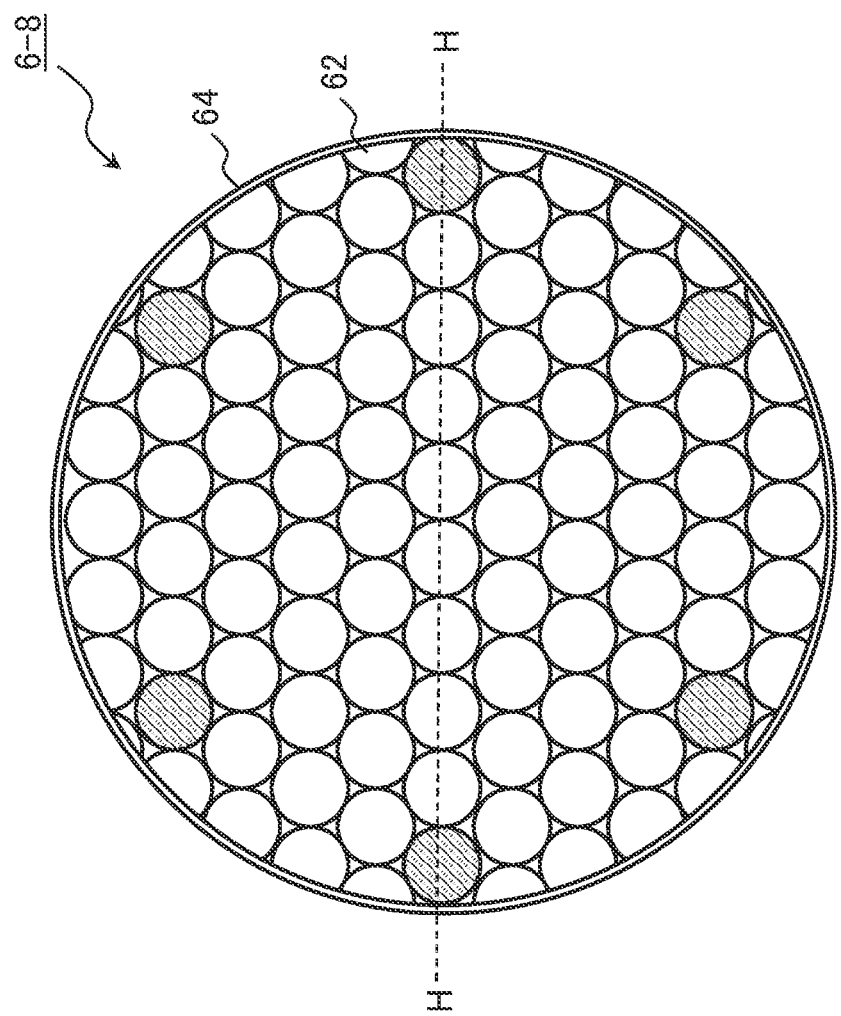
FIG. 42 is a top view of one example of the light-receiving device of the modified example 8 according to the sixth example embodiment of the present invention.
Figure 43:
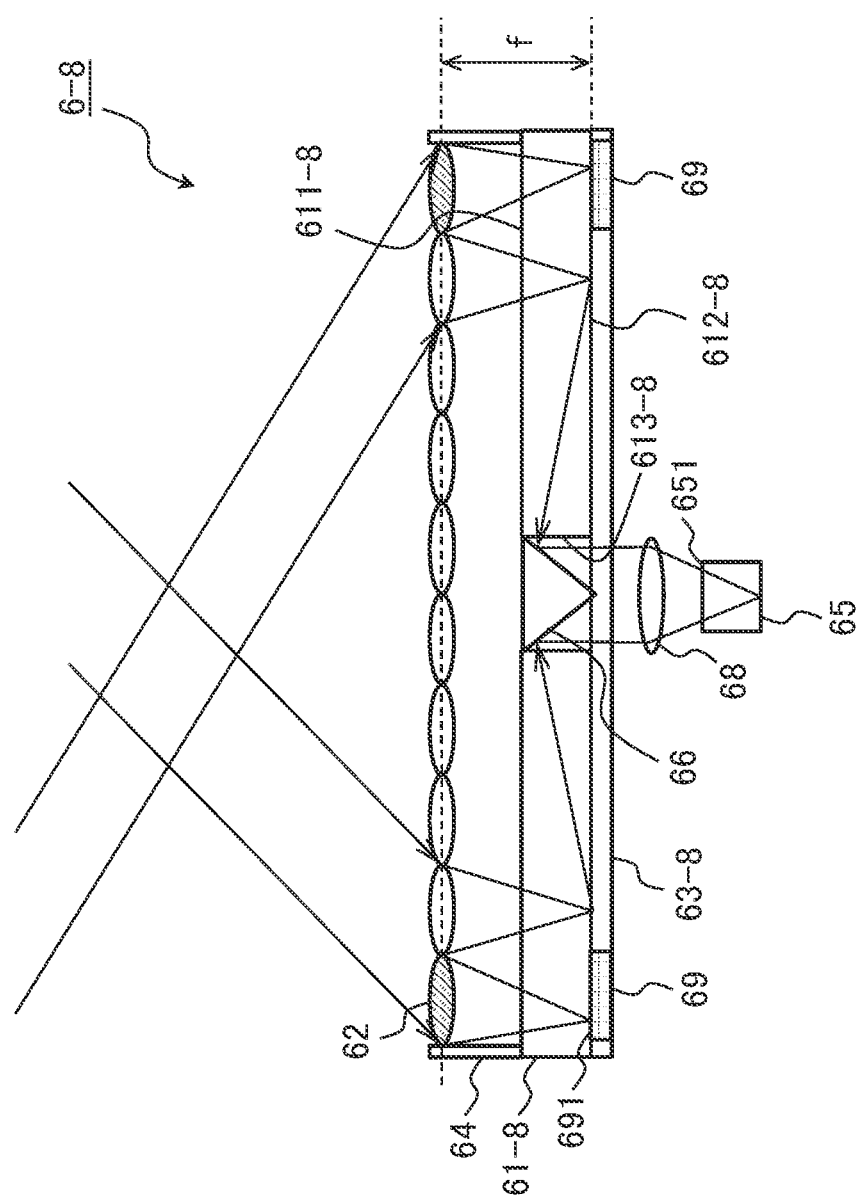
FIG. 43 is a cross-sectional diagram of one example of the light-receiving device of the modified example 8 according to the sixth example embodiment of the present invention.

FIGS. 41 to 43 each are a conceptual diagram for describing a light-receiving device 6-8 according to the present modified example. FIG. 41 is a perspective view of the light-receiving device 6-8. FIG. 42 is a top view of the light-receiving device 6-8. FIG. 43 is a cross-sectional diagram in which the light-receiving device 6-8 is cut along an H-H line in FIG. 41. FIG. 43 illustrates an arrow conceptually indicating light entering the light-receiving device 6-8 and travel of light inside the light-receiving device 6-8.

The light-receiving device 6-8 includes a light guide plate 61-8, a lens sheet 62, a directional light-guide layer 63-8, a support member 64, an optical receiver 65, a reflection mirror 66, and a light-receiving lens 68. The configuration of each of the light guide plate 61-8, the lens sheet 62, the directional light-guide layer 63-8, the support member 64, and the optical receiver 65 corresponds to each of the light guide plate 61, the lens sheet 62, the directional light-guide layer 63, the support member 64, and the optical receiver 65 of the light-receiving device 6. Each of the reflection mirror 66 and the light-receiving lens 68 has a configuration similar to each of the reflection mirror 66 and the light-receiving lens 68 according to the modified example 6-7. In the following, description of a feature similar to the light-receiving device 6 and the light-receiving device 6-7 is omitted.

The light guide plate 61-8 is a circular plate-like transparent member having a first surface 611-8 and a second surface 612-8 as principal surfaces opposed to each other. A material and characteristics of the light guide plate 61-8 are similar to the light guide plate 61-7 of the light-receiving device 6-7 according to the modified example 6-7. In a central portion of the light guide plate 61-8, an opening is formed in a circular shape when viewed from a top surface. On a side surface inside the opening formed in the central portion of the light guide plate 61-8, an emission surface 613-8 is formed. The first surface 611-8 is an incident surface which an optical signal refracted by the lens sheet 62 enters. The emission surface 613-8 is an end surface from which an optical signal that has propagated inside the light guide plate 61-8 is emitted.

On an upper side of the first surface 611-8 of the light guide plate 61-8, the lens sheet 62 supported by the support member 64 is disposed. On the second surface 612-8 of the light guide plate 61-8, the directional light-guide layer 63-7 is disposed. On a part of the second surface 612-8 of the light guide plate 61-8, an optical sensor 69 is disposed. The optical sensor 69 is disposed in such a way that a detection surface 691 faces the second surface 612 opposed to a lens at a position most distant from the emission surface 613-8. Inside the opening in the center of the light guide plate 61-8, a conic reflection mirror 66 is disposed, similarly to the modified example 7, in such a way that the tip of the mirror is directed downward.

A travel direction of an optical signal that is refracted by the lens sheet 62 and enters an inside of the light guide plate 61-8 from the first surface 611-8 is changed toward the emission surface 613-8 of the light guide plate 61-8 by the directional light-guide layer 63-8 disposed on the second surface 612-8. A part of the optical signal that is refracted by the lens sheet 62 and enters an inside of the light guide plate 61-8 from the first surface 611-8 enters the optical sensor 69. The optical signal the travel direction of which has been changed by the directional light-guide layer 63-8 propagates inside the light guide plate 61-8 toward the emission surface 613-8. FIG. 43 illustrates, by using an arrow, an optical signal entering an inside of the light guide plate 61-8 from the first surface 611-8 propagate inside the light guide plate 61-8 toward the emission surface 613-8.

The lens sheet 62 is supported by the support member 64 on an upper side of the first surface 611-8 of the light guide plate 61-8. A material and characteristics of the lens sheet 62 are similar to the lens sheet 62 of the light-receiving device 6. The lens sheet 62 has a structure in which a plurality of lenses are arranged on one circular plate-like sheet. A plurality of lenses configuring the lens sheet 62 are focused on different focal positions of the directional light-guide layer 63-7 or the optical sensor 69 disposed on the second surface 612-7 of the light guide plate 61-7. In FIGS. 41 to 43, a lens positioned on an upper side of the optical sensor 69 is clearly indicated by using hatching, but the lens is the same as other lenses.

The directional light-guide layer 63-8 is disposed on the second surface 612-8 of the light guide plate 61-8. A material and characteristics of the directional light-guide layer 63-8 are similar to the directional light-guide layer 63-7 of the light-receiving device 6-7 according to the modified example 7. The directional light-guide layer 63-8 guides an optical signal in such a way that light entering an inside of the light guide plate 61-8 from the first surface 611-8 travels toward the emission surface 613-8.

The support member 64 is a circular frame that supports the lens sheet 62 in such a way as to be positioned on an upper side of the first surface 611-8 of the light guide plate 61-8. The support member 64 has a configuration similar to the light-receiving device 6-7 according to the modified example 7. The support member 64 supports the lens sheet 62 in such a way that a distance between a principal surface of the lens sheet 62 and the second surface 612-8 of the light guide plate 61-8 is equal to a focal distance f of the lens sheet 62. A material and a shape of the support member 64 is not specifically limited.

The reflection mirror 66 is disposed inside an opening in the center of the light guide plate 61-8. The reflection mirror 66 has a configuration similar to the light-receiving device 6-7 according to the modified example 7. The reflection mirror 66 is conic and a reflection surface is formed on a side surface thereof. The reflection mirror 66 is disposed inside the opening in the center of the light guide plate 61-8 in such a way that the reflection surface faces the emission surface 613-7 of the light guide plate 61-8 in a state where the tip of the mirror is directed downward. The reflection mirror 66 reflects, toward the light-receiving lens 68, an optical signal emitted from the emission surface 613-8 of the light guide plate 61-8, by using the reflection surface. The optical signal reflected by the reflection surface of the reflection mirror 66 enters the light-receiving lens 68. A material and a structure of the reflection mirror 66 is not limited as long as an optical signal emitted from the emission surface 613-8 of the light guide plate 61-8 is reflected by the reflection surface toward the light-receiving lens 68.

The light-receiving lens 68 is disposed on a lower side of the reflection mirror 66. The light-receiving lens 68 has a configuration similar to the light-receiving device 6-7 according to the modified example 7. The light-receiving lens 68 collects, toward the light-receiving surface 651 of the optical receiver 65, an optical signal reflected by the reflection surface of the reflection mirror 66. A material and a structure of the light-receiving lens 68 is not limited as long as an optical signal reflected by the reflection surface of the reflection mirror 66 is collected toward the light-receiving surface 651 of the optical receiver 65.

The optical receiver 65 is disposed on a lower side of the light-receiving lens 68. The optical receiver 65 has a configuration similar to the optical receiver 15 of the light-receiving device 1. The optical receiver 65 receives an optical signal collected by the light-receiving lens 68. The optical receiver 65 converts the received optical signal into an electric signal. The optical receiver 65 outputs the electric signal after the conversion to a decoder (not illustrated).

The optical sensor 69 is an imaging element disposed in such a way that a detection surface 691 of the sensor faces a second surface 612—of the light guide plate 61-8 in association with at least one lens configuring the lens sheet 62. The optical sensor 69 has a configuration similar to the optical sensor 49 according to the fourth example embodiment. The optical sensor 69 is a sensor that detects incident light on the detection surface 691 and outputs an incident position of the detected incident light to a detection device which is not illustrated. The optical sensor 69 may be a two-dimensional sensor that detects a two-dimensional position of incident light or may be a one-dimensional sensor that detects a one-dimensional position of incident light.

In order to guide, to the optical receiver 65, more optical signals made incident to the light guide plate 61-8, the optical sensor 69 is preferably disposed in association with a lens located at a position distant from the optical receiver 65. When an optical signal can be guided toward the optical receiver 65 by being passed through the optical sensor 69, the optical sensor 69 may be disposed in association with at least any one of lenses.

As described above, a configuration of the light-receiving device 6-8 according to the present modified example has been described. The configuration illustrated each in FIGS. 41 to 43 is one example and does not limit the configuration of the light-receiving device 6-8 according to the present example embodiment to a form as is.

The light-receiving device 6-8 according to the present modified example can detect, when an incident surface of the lens sheet 62 is disposed by being directed upward, signal light coming from every direction from above by using a single optical receiver 65 and also can estimate, based on an incident position in the optical sensor 69, a coming direction of the signal light.

Applied Example

Here, an applied example of the light-receiving device 6 according to the present example embodiment is described with reference to a drawing. The following applied example is one example and does not limit applications of the light-receiving device 6 according to the present example embodiment to the example.

Figure 44:
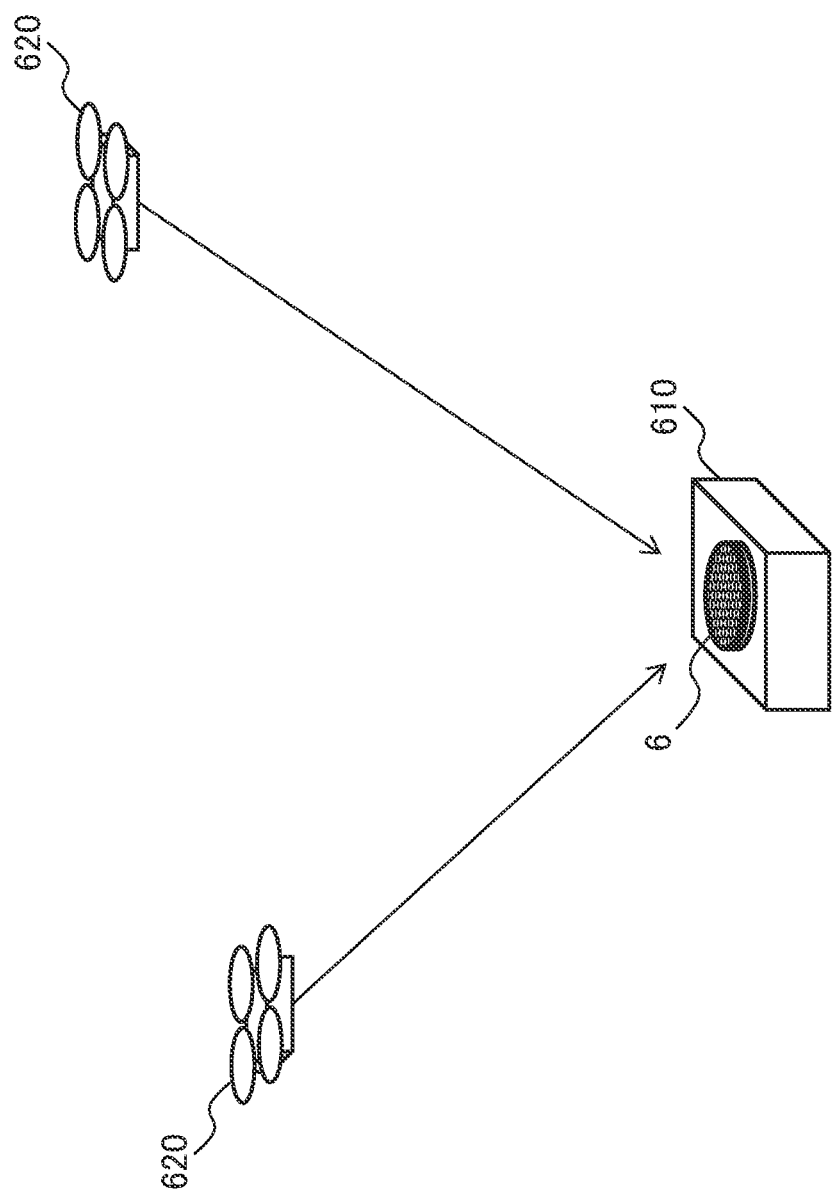
FIG. 44 is a conceptual diagram for describing an applied example of the light-receiving device according to the sixth example embodiment of the present invention.

FIG. 44 is an example in which the light-receiving device 6 according to the present example embodiment is applied to optical space communication using a drone 620. FIG. 44 illustrates an example in which the light-receiving device 6 is mounted on a ceiling of a communication station 610. FIG. 44 illustrates an example in which an optical signal is transmitted from the drone 620 flying above the communication station 610. A communication device (not illustrated) of the communication station 610 decodes an electric signal output by the light-receiving device 6 and acquires decoded data. Use of data acquired in the communication station 610 is not specifically limited.

As in the applied example in FIG. 44, the light-receiving device 6 is disposed in such a way that an incident surface of the lens sheet 62 is directed upward and an optical signal coming from the drone 620 flying above the light-receiving device 6 is received, and thereby optical space communication using the drone 620 can be achieved. Further, when the light-receiving device 6 is disposed in such a way that an incident surface of the lens sheet 62 is substantially vertically erected, an optical signal coming from a horizontal direction can be also received. The light-receiving device 6 according to the present example embodiment is applicable to reception of an optical signal transmitted not only from the drone 620 but also from a flight vehicle such as an airplane or a helicopter, a vehicle, and the like.

As described above, according to the light-receiving device of the present example embodiment, a light guide plate has a circular plate-like shape being a circle in a top view, an emission surface is formed on at least a part of a side surface, and a lens sheet has a structure in which a plurality of lenses are arranged in association with a first surface of the light guide plate.

According to one aspect of the present example embodiment, a light-receiving device further includes a relay light-guide plate that is a ring-shaped transparent member having an open end and in which an incident surface is formed on an inner side surface, a light guide surface is formed on an outer side surface, and a relay emission surface is formed on one open end. The entire surface of the outer side surface of the light guide plate is an emission surface. The relay light-guide plate is disposed in such a way that the incident surface faces the emission surface on the outer side surface of the light guide plate, and the relay light-guide plate receives, on the incident surface, an optical signal emitted from the emission surface of the light guide plate, totally reflects the received optical signal between the light guide surface and the incident surface, and guides the reflected optical signal toward the relay emission surface. An optical receiver receives an optical signal emitted from the relay emission surface of the relay light-guide plate and converts the received optical signal into an electric signal.

According to one aspect of the present example embodiment, a light-receiving device further includes a conic reflection mirror in which a side surface is a reflection surface, and a light-receiving lens which is disposed in such a way that a principal surface faces the reflection mirror and which collects an optical signal reflected by the reflection mirror. A light guide plate has a circular opening, an inner side surface of which forms an emission surface, in a central portion in a top surface view. The reflection mirror is disposed in such a way that the tip of the mirror is directed downward in the opening in the central portion of the light guide plate and an optical signal emitted from the emission surface of the light guide plate enters the reflection surface. A lens is disposed in such a way that a principal surface faces a position where an optical signal reflected by the reflection surface of the reflection mirror travels, and collects an optical signal reflected by the reflection surface toward an optical receiver. The optical receiver receives the optical signal collected by the lens and converts the received optical signal into an electric signal.

According to the light-receiving device of the present example embodiment, an incident surface for an optical signal received by a single optical receiver can be widened, and therefore optical signals coming from various directions can be more efficiently received.

Seventh Example Embodiment

Next, a reception system according to a seventh example embodiment of the present invention is described with reference to a drawing. The reception system according to the present example embodiment incudes any one of the light-receiving devices according to the first to sixth example embodiments. The reception system according to the present example embodiment decodes an optical signal received by the light-receiving device and outputs decoded information.

Figure 45:
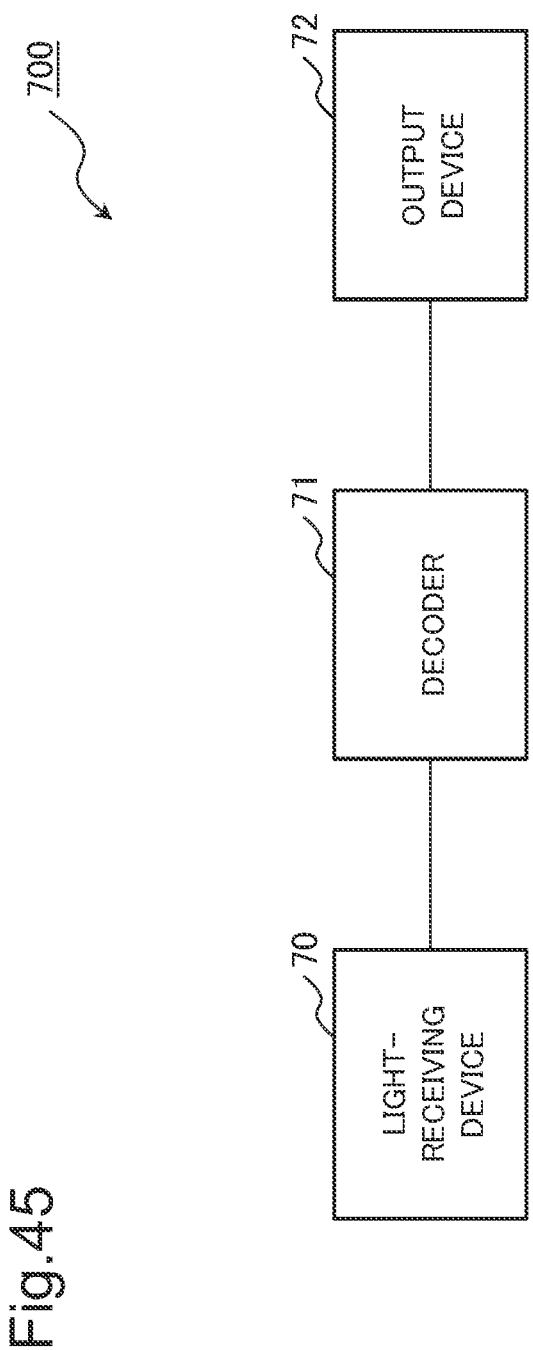
FIG. 45 is a block diagram describing one example of a reception system according to a seventh example embodiment of the present invention.

FIG. 45 is a block diagram illustrating one example of a configuration of a reception system 700 according to the present example embodiment. As in FIG. 45, the reception system 700 includes a light-receiving device 700, a decoder 71, and an output device 72.

The light-receiving device 70 is connected to the decoder 71. The light-receiving device 70 is any one of the light-receiving devices according to the first to sixth example embodiments. The light-receiving device 70 converts a received signal into an electric signal and transmits the electric signal after the conversion to the decoder 71.

The decoder 71 is connected to the light-receiving device 70 and the output device 72. The decoder 71 receives an electric signal from the light-receiving device 70. The decoder 71 decodes data from the received electric signal. The decoder 71 transmits the decoded data to the output device 72.

The output device 72 is connected to the decoder 71. The output device 72 receives data from the decoder 71. The output device 72 outputs the received data. The output device 72 outputs the received data, for example, via conversion into an image or a sound. The output device 72 is achieved, for example, by a display device or a sound device. The output device 72 may be configured in such a way as to include the decoder 71.

As described above, the reception system 700 according to the present example embodiment has been described. The configuration in FIG. 45 is one example and does not limit the configuration of the reception system 700 according to the present example embodiment to a form as is.

As described above, the reception system according to the present example embodiment includes the light-receiving device according to the first to sixth example embodiments, a decoder that decodes data by using an electric signal converted by the light-receiving device, and an output device that outputs data decoded by the decoder. According to the reception system of the present example embodiment, even when an optical transmission axis and an optical reception axis are not matched, it is possible to receive an optical signal transmitted from a long distance and output data of the received optical signal.

While the invention has been particularly shown and described with reference to example embodiments thereof, the invention is not limited to these embodiments. It will be understood by those of ordinary skill in the art that various changes in form and details may be made therein without departing from the spirit and scope of the present invention as defined by the claims.

This application is based upon and claims the benefit of priority from Japanese patent application No. 2019-123023, filed on Jul. 1, 2019, the disclosure of which is incorporated herein in its entirety by reference.

The whole or part of the example embodiments disclosed above can be described as, but not limited to, the following supplementary notes.

(Supplementary Note 1)

A light-receiving device including:
- a light guide plate that is a transparent member having a first surface and a second surface as principal surfaces opposed to each other, and that has an emission surface formed on at least one end;
- a lens sheet that has a structure in which a plurality of lenses are arranged and is disposed opposite to the first surface;
- a support member that supports the lens sheet in such a way that a distance between a principal surface of the lens sheet and the second surface is equal to a focal distance of the plurality of lenses;
- a directional light-guide layer that is disposed on the second surface of the light guide plate and guides, toward the emission surface, a travel direction of an optical signal entering an inside of the light guide plate; and
- an optical receiver that receives the optical signal emitted from the emission surface of the light guide plate and converts the received optical Signal into an Electric Signal.

(Supplementary Note 2)

The light-receiving device according to supplementary note 1, wherein
the light guide plate has
a shape extended in a uniaxial direction, and
the lens sheet has
a structure in which the plurality of lenses are arranged in a row in association with the first surface of the light guide plate.

(Supplementary Note 3)

The light-receiving device according to supplementary note 1 or 2, wherein a plurality of the light guide plates each having a shape extended in a uniaxial direction are cylindrically arranged in such a way that the first surface is directed outward and the emission surface is directed downward.

(Supplementary Note 4)

The light-receiving device according to supplementary note 3, further including
a relay light-guide plate that is a transparent member having an incident surface and a light guide surface as principal surfaces opposed to each other, and that has a relay emission surface formed on at least one end, wherein
the relay light-guide plate
is disposed in such a way that the incident surface faces the emission surface of the light guide plate, receives, on the incident surface, the optical signal emitted from the emission surface of the light guide plate, totally reflects the received optical signal between the light guide surface and the incident surface, and guides the reflected optical signal toward the relay emission surface, and
the optical receiver
receives the optical signal emitted from the relay emission surface of the relay light-guide plate and converts the received optical signal into an electric signal.

(Supplementary Note 5)

The light-receiving device according to supplementary note 1, wherein
the light guide plate has a circular plate-like shape being a circle in a top surface view in which the emission surface is formed on at least a part of a side surface, and the lens sheet has a structure in which the plurality of lenses are arranged in association with the first surface of the light guide plate.

(Supplementary Note 6)

The light-receiving device according to supplementary note 5, further including a relay light-guide plate that is a ring-shaped transparent member having an open end, and in which an incident surface is formed on an inner side surface, a light guide surface is formed on an outer side surface, and a relay emission surface is formed on one of the open end, wherein the light guide plate has an entire surface of an outer side surface being the emission surface, the relay light-guide plate is disposed in such a way that the incident surface faces the emission surface on an outer side surface of the light guide plate, receives, on the incident surface, the optical signal emitted from the emission surface of the light guide plate, totally reflects the received optical signal between the light guide surface and the incident surface, and guides the reflected optical signal toward the relay emission surface, and the optical receiver receives the optical signal emitted from the relay emission surface of the relay light-guide plate and converts the received optical signal into an electric signal.

(Supplementary Note 7)

The light-receiving device according to supplementary note 5, further including:

a conic reflection mirror having a side surface as a reflection surface; and a light-receiving lens which is disposed in such a way that a principal surface faces the reflection mirror and which collects the optical signal reflected by the reflection mirror, wherein the light guide plate has a circular opening, an inner side surface of which forms the emission surface, in a central portion in a top surface view, the reflection mirror is disposed in such a way that a tip is directed downward in an opening of a central portion of the light guide plate and the optical signal emitted from the emission surface of the light guide plate enters the reflection surface, the lens is disposed in such a way that a principal surface faces a position to which an optical signal reflected by the reflection surface of the reflection mirror travels, and collects, toward the optical receiver, the optical signal reflected by the reflection surface, and the optical receiver receives the optical signal collected by the lens and converts the received optical signal into an electric signal.

(Supplementary Note 8)

The light-receiving device according to any one of supplementary notes 1 to 7, wherein a polarization element including a wavelength plate that converts an optical signal of circularly polarized light into linearly polarized light and a polarization plate that uniforms a polarization direction of an optical signal converted by the wavelength plate into linearly polarized light is disposed on an upper side of the lens sheet, and the directional light-guide layer is a hologram layer that guides, toward the optical receiver, the optical signal of linearly polarized light having a polarization direction in a predetermined direction.

(Supplementary Note 9)

The light-receiving device according to any one of supplementary notes 1 to 8, further including a light absorption layer that absorbs light on a lower surface of the directional light-guide layer.

(Supplementary Note 10)

The light-receiving device according to any one of supplementary notes 1 to 9, further including a first color filter that is disposed on an upper side of the lens sheet and selectively transmits light of a wavelength region of the optical signal.

(Supplementary Note 11)

The light-receiving device according to any one of supplementary notes 1 to 10, further including a second color filter that is disposed on a light-receiving surface of the optical receiver and selectively transmits light of a wavelength region of the optical signal emitted from an emission surface of the light guide plate.

(Supplementary Note 12)

The light-receiving device according to any one of supplementary notes 1 to 9, further including:

a first color filter that is disposed on an upper side of the lens sheet and selectively transmits the optical signal of a wavelength region of the optical signal; and a second color filter that is disposed on a light-receiving surface of the optical receiver and selectively transmits light of a wavelength region of the optical signal emitted from an emission surface of the light guide plate, wherein the second color filter selectively transmits the optical signal of a wavelength region narrower than in the first color filter.

(Supplementary Note 13)

The light-receiving device according to any one of supplementary notes 1 to 12, further including a shutter that is disposed on an upper surface of the first surface of the light guide plate and incudes a liquid crystal element capable of controlling at least a part of an opening state.

(Supplementary Note 14)

The light-receiving device according to any one of supplementary notes 1 to 13, further including an optical sensor disposed in such a way that a detection surface faces at least a part of the second surface of the light guide plate.

(Supplementary Note 15)

A reception system including:

the light-receiving device according to any one of supplementary notes 1 to 14;

a decoder that decodes data from the electric signal converted by the light-receiving device; and an output device that outputs the data decoded by the decoder.

REFERENCE SIGNS LIST 1, 2, 3, 4, 5, 6 Light-receiving device
11, 21, 31, 41, 51, 61 Light guide plate
12, 22, 32, 42, 52, 62 Lens sheet
13, 23, 33, 43, 53, 63 Directional light-guide layer 14, 24, 34, 44, 54, 64 Support member
15, 25, 35, 45, 55, 65 Optical receiver
26 Polarization element
28 Light absorption layer
38 Shutter
49, 59, 69 Optical sensor
57, 67 Relay light-guide plate
58 Base
70 Light-receiving device
71 Decoder
72 Output device

What is claimed is:

1. A light-receiving device comprising:
a light guide plate that is a transparent member having a first surface and a second surface as principal surfaces opposed to each other, and that has an emission surface formed on at least one end;
a lens sheet that has a structure in which a plurality of lenses are arranged and is disposed opposite to the first surface;
a support member that supports the lens sheet in such a way that a distance between a principal surface of the lens sheet and the second surface is equal to a focal distance of the plurality of lenses;
a directional light-guide layer that is disposed on the second surface of the light guide plate and guides, toward the emission surface, a travel direction of an optical signal entering an inside of the light guide plate;
an optical receiver that receives the optical signal emitted from the emission surface of the light guide plate and converts the received optical signal into an electric signal; and
a polarization element including a wavelength plate that converts an optical signal of circularly polarized light into linearly polarized light and a polarization plate that uniforms a polarization direction of an optical signal converted by the wavelength plate into linearly polarized light, wherein
the polarization element is disposed on an upper side of the lens sheet, and
the directional light-guide layer is a hologram layer that guides, toward the optical receiver, the optical signal of linearly polarized light having a polarization direction in a predetermined direction.

2. The light-receiving device according to claim 1, wherein
the light guide plate has
a shape extended in a uniaxial direction, and
the lens sheet has
a structure in which the plurality of lenses are arranged in a row in association with the first surface of the light guide plate.

3. The light-receiving device according to claim 1, wherein
the light guide plate
has a circular plate-like shape being a circle in a top surface view in which the emission surface is formed on at least a part of a side surface, and
the lens sheet
has a structure in which the plurality of lenses are arranged in association with the first surface of the light guide plate.

4. The light-receiving device according to claim 3, further comprising
a relay light-guide plate that is a ring-shaped transparent member having an open end, and in which an incident surface is formed on an inner side surface, a light guide surface is formed on an outer side surface, and a relay emission surface is formed on one of the open end, wherein
the light guide plate
has an entire surface of an outer side surface being the emission surface,
the relay light-guide plate
is disposed in such a way that the incident surface faces the emission surface on an outer side surface of the light guide plate, receives, on the incident surface, the optical signal emitted from the emission surface of the light guide plate, totally reflects the received optical signal between the light guide surface and the incident surface, and guides the reflected optical signal toward the relay emission surface, and
the optical receiver
receives the optical signal emitted from the relay emission surface of the relay light-guide plate and converts the received optical signal into an electric signal.

5. The light-receiving device according to claim 3, further comprising:
a conic reflection mirror having a side surface as a reflection surface; and
a light-receiving lens which is disposed in such a way that a principal surface faces the reflection mirror and which collects the optical signal reflected by the reflection mirror, wherein
the light guide plate
has a circular opening, an inner side surface of which forms the emission surface, in a central portion in a top surface view,
the reflection mirror
is disposed in such a way that a tip is directed downward in an opening of a central portion of the light guide plate and the optical signal emitted from the emission surface of the light guide plate enters the reflection surface,
the lens
is disposed in such a way that a principal surface faces a position to which an optical signal reflected by the reflection surface of the reflection mirror travels, and collects, toward the optical receiver, the optical signal reflected by the reflection surface, and
the optical receiver
receives the optical signal collected by the lens and converts the received optical signal into an electric signal.

6. The light-receiving device according to claim 1, further comprising
a light absorption layer that absorbs light on a lower surface of the directional light-guide layer.

7. The light-receiving device according to claim 1, further comprising a first color filter that is disposed on an upper side of the lens sheet and selectively transmits light of a wavelength region of the optical signal.

8. The light-receiving device according to claim 7, further comprising a second color filter that is disposed on a light-receiving surface of the optical receiver and selectively transmits light of a wavelength region of the optical signal emitted from an emission surface of the light guide plate.

9. The light-receiving device according to claim 1, further comprising:
a first color filter that is disposed on an upper side of the lens sheet and selectively transmits the optical signal of a wavelength region of the optical signal; and
a second color filter that is disposed on a light-receiving surface of the optical receiver and selectively transmits light of a wavelength region of the optical signal emitted from an emission surface of the light guide plate, wherein the second color filter selectively transmits the optical signal of a wavelength region narrower than in the first color filter.

10. The light-receiving device according to claim 1, further comprising a shutter that is disposed on an upper surface of the first surface of the light guide plate and incudes a liquid crystal element capable of controlling at least a part of an opening state.

11. The light-receiving device according to claim 1, further comprising an optical sensor disposed in such a way that a detection surface faces at least a part of the second surface of the light guide plate.

12. A reception system comprising:
the light-receiving device according to claim 1;
a decoder that decodes data from the electric signal converted by the light-receiving device; and
an output device that outputs the data decoded by the decoder.

13. A light-receiving device comprising:
a light guide plate that is a transparent member having a first surface and a second surface as principal surfaces opposed to each other, and that has an emission surface formed on at least one end;
a lens sheet that has a structure in which a plurality of lenses are arranged and is disposed opposite to the first surface;
a support member that supports the lens sheet in such a way that a distance between a principal surface of the lens sheet and the second surface is equal to a focal distance of the plurality of lenses;
a directional light-guide layer that is disposed on the second surface of the light guide plate and guides, toward the emission surface, a travel direction of an optical signal entering an inside of the light guide plate; and
an optical receiver that receives the optical signal emitted from the emission surface of the light guide plate and converts the received optical signal into an electric signal, wherein
a plurality of the light guide plates each having a shape extended in a uniaxial direction are cylindrically arranged in such a way that the first surface is directed outward and the emission surface is directed downward.

14. The light-receiving device according to claim 3, further comprising
a relay light-guide plate that is a transparent member having an incident surface and a light guide surface as principal surfaces opposed to each other, and that has a relay emission surface formed on at least one end, wherein
the relay light-guide plate
is disposed in such a way that the incident surface faces the emission surface of the light guide plate, receives, on the incident surface, the optical signal emitted from the emission surface of the light guide plate, totally reflects the received optical signal between the light guide surface and the incident surface, and guides the reflected optical signal toward the relay emission surface, and
the optical receiver
receives the optical signal emitted from the relay emission surface of the relay light-guide plate and converts the received optical signal into an electric signal.

* * * * *